US008525070B2

(12) United States Patent
Tanaka et al.

(10) Patent No.: US 8,525,070 B2
(45) Date of Patent: Sep. 3, 2013

(54) LASER IRRADIATION APPARATUS, LASER IRRADIATION METHOD, AND METHOD FOR MANUFACTURING SEMICONDUCTOR DEVICE

(75) Inventors: Koichiro Tanaka, Kanagawa (JP); Yoshiaki Yamamoto, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 1640 days.

(21) Appl. No.: 11/639,416

(22) Filed: Dec. 15, 2006

(65) Prior Publication Data

US 2007/0151963 A1 Jul. 5, 2007

(30) Foreign Application Priority Data

Dec. 20, 2005 (JP) ................. 2005-366169

(51) Int. Cl.
*B23K 26/08* (2006.01)
*H01L 21/324* (2006.01)
(52) U.S. Cl.
USPC ............. 219/121.65; 219/121.73; 359/223.1; 359/225.1
(58) Field of Classification Search
USPC ............ 219/121.63–121.75, 121.8; 700/166; 901/41, 42; 438/487, 795–800; 359/223.1, 359/225.1, 641, 831
See application file for complete search history.

(56) References Cited

U.S. PATENT DOCUMENTS

| | | | |
|---|---|---|---|
| 3,200,697 A | | 8/1965 | Goubau |
| 3,528,424 A | * | 9/1970 | Ayres .............................. 606/19 |
| 3,645,628 A | * | 2/1972 | Bojic et al. .................... 356/313 |
| 4,380,696 A | * | 4/1983 | Masaki ..................... 219/124.34 |
| 4,616,121 A | * | 10/1986 | Clocksin et al. ......... 219/124.34 |
| 4,650,952 A | * | 3/1987 | Akeel ....................... 219/121.74 |
| 4,659,916 A | * | 4/1987 | Muller et al. ............... 250/203.1 |
| 4,916,286 A | * | 4/1990 | Sarugaku et al. ........ 219/124.34 |
| 4,941,093 A | | 7/1990 | Marshall et al. |
| 5,115,115 A | * | 5/1992 | Alborante ................ 219/121.63 |
| 5,120,926 A | * | 6/1992 | Marriott ................... 219/121.67 |
| 5,549,632 A | * | 8/1996 | Lai .................................... 606/5 |
| 5,670,064 A | | 9/1997 | Nakata |

(Continued)

FOREIGN PATENT DOCUMENTS

| | | |
|---|---|---|
| JP | 48-050688 | 7/1973 |
| JP | 59-107785 | 6/1984 |

(Continued)

OTHER PUBLICATIONS

International Search Report (Application No. PCT/JP2006/325317; PCT9285) Mar. 20, 2007.

(Continued)

*Primary Examiner* — Samuel M Heinrich
(74) *Attorney, Agent, or Firm* — Nixon Peabody LLP; Jeffrey L. Costellia

(57) ABSTRACT

A laser irradiation apparatus is provided with a laser oscillator, an articulated beam propagator in which a plurality of pipes are connected to each other in an articulated portion, and a course change means of a laser beam in the articulated portion. At least one pipe of the plurality of pipes includes a transfer lens for suppressing stagger of a laser beam in a traveling direction, in each pipe. The articulated portion produces degree of freedom in disposition of a laser oscillator, and the transfer lens enables suppression of change in beam profile.

20 Claims, 25 Drawing Sheets

(56) References Cited

U.S. PATENT DOCUMENTS

| | | | |
|---|---|---|---|
| 5,760,366 | A | 6/1998 | Haruta et al. |
| 5,987,591 | A * | 11/1999 | Jyumonji ............... 700/259 |
| 6,084,203 | A * | 7/2000 | Bonigen ............... 219/121.63 |
| 6,172,820 | B1 | 1/2001 | Kuwahara |
| 6,393,042 | B1 | 5/2002 | Tanaka |
| 6,479,786 | B1 * | 11/2002 | Fields et al. ............ 219/121.63 |
| 6,532,035 | B1 | 3/2003 | Saari et al. |
| 6,635,850 | B2 | 10/2003 | Amako et al. |
| 6,643,300 | B1 | 11/2003 | Ori |
| 6,791,060 | B2 | 9/2004 | Dunsky et al. |
| 6,861,614 | B1 * | 3/2005 | Tanabe et al. ............ 219/121.66 |
| 6,977,775 | B2 | 12/2005 | Sasaki et al. |
| 7,115,457 | B2 | 10/2006 | Sasaki et al. |
| 7,129,124 | B2 | 10/2006 | Hongo et al. |
| 7,169,630 | B2 | 1/2007 | Moriwaka |
| 7,410,508 | B2 | 8/2008 | Sasaki et al. |
| 7,528,023 | B2 | 5/2009 | Sasaki et al. |
| 7,541,230 | B2 | 6/2009 | Sasaki et al. |
| 7,660,042 | B2 | 2/2010 | Sasaki et al. |
| 7,700,463 | B2 | 4/2010 | Shimomura |
| 7,927,935 | B2 | 4/2011 | Sasaki et al. |
| 7,978,412 | B2 | 7/2011 | Moriwaka |
| 2002/0134765 | A1 | 9/2002 | Tanaka et al. |
| 2002/0163730 | A1 | 11/2002 | Sugiyama et al. |
| 2002/0166845 | A1 | 11/2002 | Cordingley et al. |
| 2004/0179807 | A1 | 9/2004 | Tanaka |
| 2004/0222197 | A1 | 11/2004 | Hiramatsu |
| 2005/0079645 | A1 | 4/2005 | Moriwaka |
| 2005/0115937 | A1 | 6/2005 | Gu et al. |
| 2005/0227504 | A1 | 10/2005 | Sasaki et al. |
| 2005/0282408 | A1 | 12/2005 | Sasaki et al. |
| 2007/0091978 | A1 | 4/2007 | Tanaka et al. |
| 2007/0138151 | A1 | 6/2007 | Tanaka et al. |
| 2007/0195834 | A1 | 8/2007 | Tanaka et al. |
| 2008/0013170 | A1 | 1/2008 | Tanaka |
| 2008/0158331 | A1 | 7/2008 | Kato |
| 2009/0127477 | A1 | 5/2009 | Tanaka |
| 2009/0173893 | A1 | 7/2009 | Tanaka et al. |
| 2010/0165300 | A1 | 7/2010 | Shimaoka et al. |
| 2011/0256695 | A1 | 10/2011 | Moriwaka |

FOREIGN PATENT DOCUMENTS

| | | | |
|---|---|---|---|
| JP | 59107785 | A * | 6/1984 |
| JP | 62-265613 | | 11/1987 |
| JP | 02-260419 | | 10/1990 |
| JP | 04-138892 | | 5/1992 |
| JP | 05-185264 | | 7/1993 |
| JP | 06053694 | A * | 2/1994 |
| JP | 06-079487 | | 3/1994 |
| JP | 11221691 | A * | 8/1999 |
| JP | 2001-272618 | | 10/2001 |
| JP | 2003-218027 | | 7/2003 |
| JP | 2003-218054 | | 7/2003 |
| JP | 2003-332235 | | 11/2003 |
| JP | 2003-347236 | | 12/2003 |
| JP | 2004-090026 | | 3/2004 |
| JP | 2005-129916 | | 5/2005 |
| JP | 2005-177825 | | 7/2005 |
| RU | 2198082 | C2 * | 2/2003 |

OTHER PUBLICATIONS

Written Opinion (Application No. PCT/JP2006/325317; PCT9285) Mar. 20, 2007.

Goodman, "Magnification Equations for a Two-Lens System," Applied Optics, Jun. 15, 1985, vol. 24, No. 12, p. 1732, OSA (The Optical Society of America).

* cited by examiner

LASER IRRADIATION APPARATUS, LASER IRRADIATION METHOD, AND METHOD FOR MANUFACTURING SEMICONDUCTOR DEVICE

TECHNICAL FIELD

The present invention relates to a laser irradiation apparatus for processing an object to be irradiated by irradiation with a laser beam, which is introduced to the object to be irradiated. Specifically, the present invention relates to a laser irradiation apparatus for uniformly and efficiently performing annealing on a semiconductor material or the like; a laser irradiation method using the laser irradiation apparatus; and a semiconductor device manufactured using the laser irradiation apparatus and the laser irradiation method, and a method for manufacturing the semiconductor device.

BACKGROUND ART

In recent years, a technique of manufacturing a thin film transistor (hereinafter, referred to as a TFT) over a substrate has been drastically progressing, and the application and development thereof to an active matrix display device, a thin film integrated circuit device, and the like has been advanced. In particular, a TFT using a polycrystalline semiconductor film has higher electron field-effect mobility (also referred to as mobility) than that of a TFT using a conventional non-single crystal semiconductor film; therefore, high speed operation can be performed. Hence, in a case where the TFT is used for a display device, the control of a pixel which is conventionally performed in a driver circuit provided outside a substrate has been tried to be performed in a driver circuit formed over the same substrate as a pixel.

Meanwhile, as for a substrate used for a semiconductor device, a glass substrate is considered to be more promising substrate than a single crystal semiconductor substrate in terms of cost. The glass substrate is inferior in heat resistance and easily deformed by heat; therefore, in the case of crystallizing a semiconductor film to form a TFT using a polycrystalline semiconductor film over a glass substrate, laser annealing is employed to avoid heat deformation of the glass substrate.

Specifically, a glass substrate over which a semiconductor film is formed is put on an XYθ stage, and laser beam irradiation is performed. Here, the laser beam with which the semiconductor film is irradiated is shaped by an optical system so that a beam spot shape formed on an irradiation surface becomes a linear shape. Such a laser beam is also referred to as a linear laser. When the substrate is relatively scanned with respect to laser light by moving the XYθ stage along with laser beam irradiation, innumerable crystal nuclei are generated in the semiconductor film which is completely melted by the laser beam, and crystal growth occurs from each crystal nucleus to a scanning direction of the laser beam as a solid-liquid interface is moved. In this manner, a crystal with a large grain size is formed.

However, "linear" of the linear laser does not strictly mean only "a line", but also includes a quadrangular shape and an elliptical shape with a high aspect ratio (as a guide, an aspect ratio of 10 or more, preferably 100 or more). A beam spot formed on an object to be irradiated, is formed in a linear shape, or a quadrangular shape or an elliptical shape with a high aspect ratio in order to ensure energy density for performing sufficient annealing on the object to be irradiated. Therefore, there is no problem even when a beam spot has a plane having a quadrangular shape or an elliptical shape as long as sufficient annealing can be performed on the object to be irradiated.

The length of a linear beam in the minor axis direction is necessary to be approximately several μm so as not to generate turbulence in a melted semiconductor film. If turbulence is generated, crystal growth direction becomes random when the semiconductor film melted by the laser beam is crystallized, whereby a large grain size region is not formed in some cases. On the other hand, the length of a linear beam in the major axis direction is determined by types or output of a laser beam emitted from a laser oscillator, or types or a thickness of a semiconductor film. The output of the laser beam is approximately 20 W at the maximum in order to prevent a laser crystal of the laser oscillator from being damaged by heat. When the length of the laser in the minor axis direction is several μm, the length thereof in the major axis direction is approximately 500 μm.

As the substrate is enlarged, the number of scanning of the laser beam is increased. To perform this treatment efficiently, it is better to perform the treatment using a plurality of laser oscillators at one time, resulting in favorable productivity. However, as the number of laser oscillators is increased, it is necessary to have a place to locate the laser oscillator and a place to locate an optical system for condensing a laser beam. Further, it is necessary to suppress variation in intensity of a laser beam among the plurality of laser oscillators. A difference in crystal state after laser irradiation treatment using a plurality of laser oscillators has an influence on yield in one substrate. Further, it is necessary to adjust the position of each laser irradiation and to control beam profile precisely. As a means to solve these points, the following methods can be given.

A first method is a method for making a laser beam enter one end of an optical fiber, and propagating the laser beam by the optical fiber, thereby irradiating an object to be irradiated with the laser beam emitted from the other end of the optical fiber (for example, refer to Patent Document 1: Japanese Published Patent Application No. H6-79487).

A second method is a method for making a laser beam enter one end of a pipe using a propagate unit including a mirror in an articulated portion which connects pipes, thereby propagating the laser beam in the pipe while the laser beam is reflected by a mirror in the articulated portion (for example, refer to Patent Document 2: Japanese Published Patent Application No. H4-138892).

A third method is a method by which a laser head and an optical system for forming a linear beam are located on a Y-axis, a glass substrate is located on an Xθ stage, and a position of laser irradiation is adjusted to be used by adjusting a distance between the laser heads.

DISCLOSURE OF INVENTION

However, it is necessary to precisely control beam profile, energy distribution, intensity distribution, and the like of a laser beam in a step of laser annealing with respect to a semiconductor film. Therefore, it is difficult to use the above-described technique directly. The reason will be described hereinafter.

The following is a problem in a case of using the first method. Laser light used for laser annealing has a wavelength in a visible light region and high power density; therefore, it is necessary to propagate the laser light using an optical fiber with a large clad diameter. Further, the optical fiber with a clad diameter which is so large that the optical fiber can withstand the above power density, is limited to a multimode optical fiber. However, there is a problem in a condensing property because intensity distribution of the laser light which has passed through the multimode optical fiber becomes multimode. If the clad diameter becomes small, a divergence angle of an emitted light becomes large, and it is difficult to make the diameter extremely small using a condensing lens. Further, inferior condensing property of the laser beam makes the linear beam width in the minor axis direction widen. Therefore, it is necessary to shorten the length of the linear beam in the major axis direction to keep energy density which is necessary to melt the semiconductor film. Accordingly, the first method is not suitable for crystallizing a semiconductor film.

It is necessary to solve the following two problems in a case of using the second method. Although a laser beam generally has a feature in favorable linearity, divergence of a beam diameter becomes remarkable when a laser beam travels a long distance, which is given as a first problem.

A numeric value representing the degree of the divergence of this beam diameter is referred to as a beam divergence angle. This value is determined by a beam diameter and an oscillation wavelength in outputting a beam from a laser oscillator. The beam divergence angle becomes smaller as the wavelength is shorter, and becomes smaller as the beam diameter is larger. Provided that the beam divergence angle is $\theta$ (mrad) and a distance from an output point of a laser beam is L (m), a value obtained by multiplying $\tan \theta$ by a beam output distance L together represents divergence degree (mm). Since $\theta$ may be regarded as $\theta=\tan \theta$ when $\theta$ is less than or equal to 50 mrad, divergence degree can be obtained by the product of $\theta$ and L. For example, a beam diameter diverges by 1 mm at the point where an outputted laser beam having a divergence angle of 1 mrad reaches 1 m ahead, and the beam diameter diverges by 10 mm at the point where the outputted laser beam reaches 10 m ahead.

The divergence of a beam diameter makes it difficult to condense a beam into a beam with uniform energy. This is because there is a problem on aberration of an optical system, or the like. Further, as the number of optical elements is increased for condensing, condensing precision becomes unstable, whereby it is difficult to control a laser beam precisely. Furthermore, a beam is easily hit on an inner wall of a pipe by a larger beam diameter; therefore, it is difficult to favorably irradiate a semiconductor film with a laser.

A second problem in a case of using the second method is that fluctuation of an optical axis is generated in emitting a laser beam from a laser oscillator. There are two types of fluctuation of an optical axis: short-term fluctuation generated at each instance and long-term fluctuation generated with time. In particular, short-term fluctuation becomes a problem. If a laser beam fluctuates at high speed, the laser beam becomes blurred as compared with an original beam diameter, resulting in influence on a condensing property or the like.

In a case of using the third method, the number of laser heads which can be disposed over a Y-axis stage is limited by the size of the laser head. Further, since the laser head is put over the Y-axis stage, the Y-axis stage is necessary to be formed using a gantry head with high rigidity in order to prevent distortion. Accordingly, a laser irradiation apparatus is enlarged, whereby it becomes difficult to do maintenance such as repair and change setting.

To solve the above-described problem, it is an object of the present invention to enable precise control of each laser beam emitted from a plurality of laser oscillators to make it possible to concurrently use the laser beams for annealing of a semiconductor film.

A laser irradiation apparatus of the present invention includes a laser oscillator, and an articulated beam propagator in which a plurality of pipes is connected to each other in an articulated portion. A means which changes a course of a laser beam is located in the articulated portion. One feature is that a transfer lens is included at least inside one pipe of the plurality of pipes, and the transfer lens is disposed so that a plurality of course change means interposing the transfer lens is conjugated to each other.

A laser irradiation apparatus of the present invention includes a plurality of laser oscillators, and a plurality of articulated beam propagators in each of which a plurality of pipes is connected to each other in an articulated portion. A means which changes a course of a laser beam is located in the articulated portion. One feature is that a transfer lens is included at least inside one pipe of a plurality of pipes, and the transfer lens is disposed so that a plurality of course change means interposing the transfer lens is conjugated to each other.

A laser irradiation apparatus of the present invention includes a laser oscillator, an articulated beam propagator in which a plurality of pipes is connected to each other in an articulated portion, an optical system which shapes a beam shape of a laser beam emitted from an end of the articulated beam propagator, a Y-axis stage for moving the position of the optical system, and an X-axis stage and a $\theta$ stage for relatively scanning the laser beam with which an object to be irradiated is irradiated after the laser beam passes through the optical system. A means which changes a course of a laser beam is located in the articulated portion. One feature is that a transfer lens is included at least inside one pipe of a plurality of pipes, and the transfer lens is disposed so that a plurality of course change means interposing the transfer lens is conjugated to each other.

A laser irradiation apparatus of the present invention includes a plurality of laser oscillators, a plurality of articulated beam propagators in each of which a plurality of pipes is connected to each other in an articulated portion, a plurality of optical systems which shape a beam shape of a laser beam emitted from each end of the articulated beam propagators, a Y-axis stage for moving the position of the plurality of optical systems, and an X-axis stage and a $\theta$ stage for relatively scanning the laser beam with which an object to be irradiated is irradiated after the laser beam passes through the optical system. A means which changes a course of a laser beam is located in the articulated portion. One feature is that a transfer lens is included at least inside one pipe of the plurality of pipes, and the transfer lens is disposed so that a plurality of course change means interposing the transfer lens is conjugated to each other.

A laser irradiation apparatus of the present invention includes a laser oscillator, an articulated beam propagator in which a plurality of pipes is connected to each other in an articulated portion, a plurality of optical systems which shape a beam shape of a laser beam emitted from each end of the articulated beam propagators, a Y-axis stage for moving the position of the plurality of optical systems, an X-axis stage and a $\theta$ stage for relatively scanning the laser beam with which an object to be irradiated is irradiated after the laser beam passes through the optical system, a camera for obtaining positional information of a marker formed over the object to be irradiated, and a means which determines an irradiation position of the laser beam based on the marker position. One feature is that a transfer lens is included at least inside one pipe of the plurality of pipes, and the transfer lens is disposed so that a plurality of course change means interposing the transfer lens is conjugated to each other.

A laser irradiation apparatus of the present invention includes a plurality of laser oscillators, a plurality of articulated beam propagators in each of which a plurality of pipes is connected to each other in an articulated portion, a plurality of optical systems which shape a beam shape of a laser beam emitted from each end of the articulated beam propagators, a Y-axis stage for moving the position of the plurality of optical systems, an X-axis stage and a θ stage for relatively scanning the laser beam with which an object to be irradiated is irradiated after the laser beam passes through the optical system, a camera for obtaining positional information of a marker formed over the object to be irradiated, and a means which determines an irradiation position of the laser beam based on the marker position. One feature is that a transfer lens is included at least inside one pipe of the plurality of pipes, and the transfer lens is disposed so that a plurality of course change means interposing the transfer lens is conjugated to each other.

In the above laser irradiation apparatus, one feature is that a joint is located in the articulated portion, which is rotatable with respect to a plane by which the articulated portion and the pipe are connected to each other.

In the above laser irradiation apparatus, one feature is that a mirror or a prism is included as the course change means of the laser beam included in the articulated portion.

In the above laser irradiation apparatus, one feature is that the length of each pipe can be arbitrarily set.

In the above laser irradiation apparatus, one feature is that each transfer lens is disposed so that an emission opening of the laser oscillator and an irradiation surface, which interpose the articulated beam propagator, are conjugated to each other with respect to the articulated beam propagator.

In the above laser irradiation apparatus, a slit can be provided in an end of a side to which the laser beam of the articulated beam propagator is emitted. At that time, one feature is that each transfer lens is disposed so that an emission opening of the laser oscillator and the slit, which interpose the articulated beam propagator, are conjugated to each other with respect to the articulated beam propagator.

In the above laser irradiation apparatus, each imaging lens is disposed so that a course change means by which the laser beam is finally reflected, and the irradiation surface, are conjugated to each other.

A laser annealing method herein used refers to a technique of crystallizing a damaged region and an amorphous region formed in a semiconductor substrate or a semiconductor film by ion implantation or the like; a technique of crystallizing a semiconductor film, which is non-single crystalline (the semiconductor film which is non-single crystalline is collectively referred to as a non-single crystal semiconductor film) and formed over a substrate, by laser irradiation; a technique by which crystallization is performed by laser irradiation after introducing an element which promotes crystallization, such as nickel, into a non-single crystal semiconductor film; or the like. Further, a technique to be applied to flattening and a surface modification of a semiconductor substrate or a semiconductor film is also included.

By using the laser irradiation apparatus of the present invention, various effects can be obtained. Firstly, a laser beam can be propagated in a beam propagator while divergence of a beam diameter of the laser beam and short-term fluctuation of an optical axis are corrected by a transfer lens. Therefore, a laser beam emitted from the laser irradiation apparatus can be controlled without being hit on an inner wall of a pipe, whereby a semiconductor film can be irradiated while the energy is kept.

Secondly, by using the laser irradiation apparatus of the present invention, as long as a place to dispose a beam propagator is secured, even if a space is small, an object to be irradiated can be scanned with a laser beam. Therefore, irradiation with a laser beam, which is greater in quantity than a conventional one, can be performed at one time, whereby efficiency in laser irradiation treatment is significantly improved.

Thirdly, in the laser irradiation apparatus of the present invention, since it is not necessary to mount a laser head on a stage, the laser irradiation apparatus becomes lighter by its weight. Accordingly, the structure of the laser irradiation apparatus itself can be simple.

Fourthly, in the laser irradiation apparatus of the present invention, since a laser beam is propagated in a pipe while being reflected by a mirror, setting such as optical axis alignment becomes the minimum necessary. Therefore, time for setting is drastically reduced. Further, setting can be performed safely without contact with a laser beam directly.

Fifthly, in the laser irradiation apparatus of the present invention, since a propagate distance of the laser beam is not changed even when the position of the pipe is changed, setting is not necessary to be changed. Therefore, uniform laser irradiation treatment is possible, thereby generating no variation in processing state of an object to be irradiated.

BEST MODE FOR CARRYING OUT THE INVENTION

Embodiment modes according to the present invention are described below with reference to the drawings. However, it is easily understood by those skilled in the art that embodiments and details herein disclosed can be modified in various ways without departing from the purpose and the scope of the present invention. Therefore, it should be noted that the description of embodiment modes to be given below should not be interpreted as limiting the description of the embodiment mode.

An articulated beam propagator included in a laser irradiation apparatus of this embodiment mode includes pipes connected by a rotatable joint. A transfer lens having an effect of suppressing change in beam profile is provided in each pipe, and a mirror is located in an articulated portion by which the pipes are connected to each other. Each pipe is not necessary to have the same length, and the length can be freely set in accordance with surrounding circumstances such as the size of a space in which the laser irradiation apparatus is located. Further, it is not necessary that the transfer lens is provided in all pipes, and the transfer lens may be provided at least in one pipe of a plurality of pipes included in the articulated beam propagator.

Figure 1A:
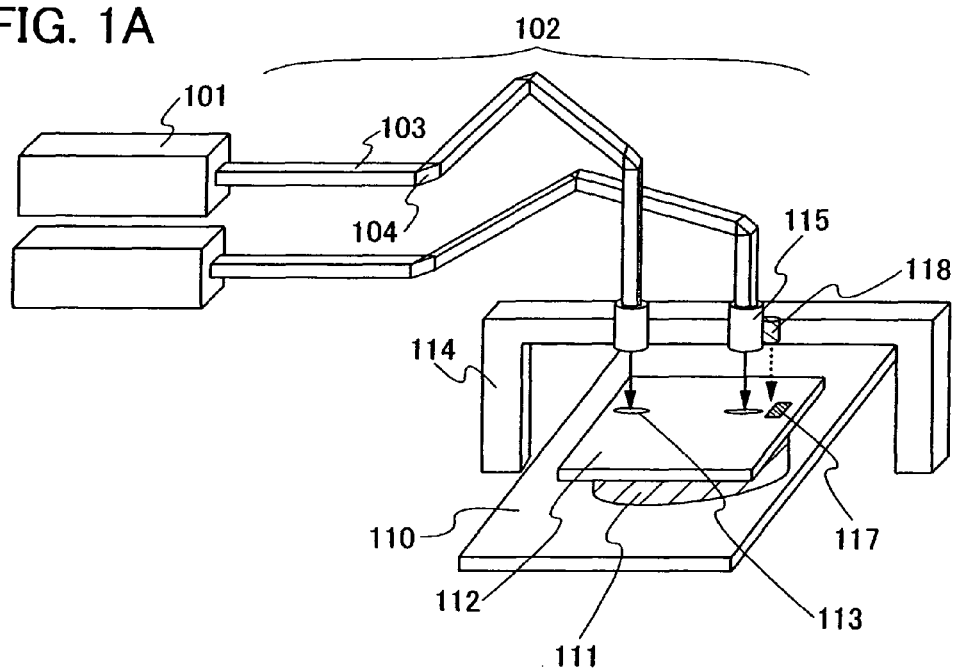
FIGS. 1A to 1C are views each showing a laser irradiation apparatus of the present invention.

As shown in FIG. 1A, a laser beam emitted from a laser oscillator 101 enters one end of an articulated beam propagator 102. The laser beam immediately after being emitted from the laser oscillator 101 has a small diameter. Therefore, a collimating lens may be acted immediately after the laser beam is emitted. By using a collimating lens, a parallel beam can be converted into a parallel beam having a different diameter. A collimating lens may not be provided if there is no need for changing the diameter of a laser beam.

The laser beam which has entered the articulated beam propagator 102 is propagated in a pipe 103 and deflected by a mirror of an articulated portion 104. At that time, as shown in an enlarged view in FIG. 2A, the laser beam passes through a transfer lens 106 provided between mirrors 105a and 105b, whereby an image of the laser beam reflected by the mirror 105a of one articulated portion 104a is transferred to the mirror 105b of an articulated portion 104b, where the laser beam reaches next.

Figure 2A:
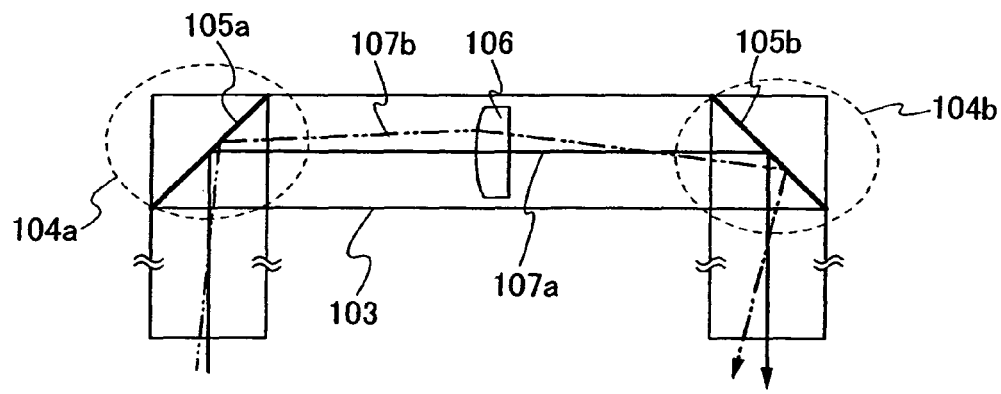
FIGS. 2A to 2C are views each showing detail of a laser irradiation apparatus of the present invention.

Here, as shown in FIG. 2A, the transfer lens 106 is disposed in a position which allows the mirror 105a and the mirror 105b where the laser beam reaches next, to be conjugated to each other. When the transfer lens 106 is disposed in the position described above, even in a case where a light path deviates by short-term fluctuation of an optical axis or a case where an original light path 107a deviates to a light path 107b as the laser beam reflected by the mirror 105a is propagated, the laser beam can be corrected by the transfer lens 106, and an image of the mirror 105a can be made to reach the mirror 105b. With repetition of this, the laser beam can be propagated without being hit on an inner wall of the pipe 103. Note that the similar effect is obtained in the case where a transfer lens is disposed in a position which allows an emission opening of the laser oscillator and the mirror 105a to be conjugated to each other.

Figure 2B:
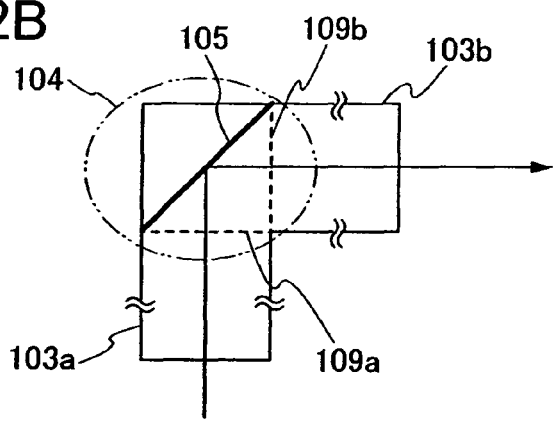

The articulated portion 104 by which pipes 103 are connected to each other is formed using a joint which is freely rotatable, and the joint is provided with a mirror. For example, a structure of the joint like FIG. 2B can be employed. FIG. 2B is an enlarged view of the articulated portion 104 in FIG. 2A. The joint is provided, which is rotatable in a plane 109a by which a pipe 103a and the articulated portion 104 are connected to each other and a plane 109b by which the articulated portion 104 and a pipe 103b are connected to each other.

For example, in FIG. 2B, a traveling direction of a laser beam is assumed to be parallel to a paper. Here, the joint provided for the plane 109b is fixed, and the joint provided for the plane 109a rotates by 90°. Accordingly, a direction of the laser beam which enters from one end of the pipe 103a is changed into a direction perpendicular to the paper (a direction from the rear surface toward the front surface of the paper, or a direction from the front surface toward the rear surface of the paper). In this manner, a traveling direction of the laser beam can be freely changed.

With the structure described above, even when the joint rotates in the plane 109a and the plane 109b, the laser beam can be propagated through the pipe 103 after being reflected by a mirror 105. Further, when the joints provided for the plane 109a and the plane 109b rotate, a spatial position of the pipe 103 is changed; however, a propagate distance of the laser beam is not changed since the laser beam is propagated in the pipe 103. Therefore, a position of a lens relating to transmission or condensing, such as the transfer lens 106 and an imaging lens 108, is not necessary to be changed. Furthermore, with the structure described above, uniform laser irradiation is possible, thereby generating no variation in processing state of an object to be irradiated.

By repeating reflection by the mirror 105, the laser beam is propagated in the pipe 103. When the laser beam is propagated using this method, a beam having the width of several μm can be easily formed without deterioration of beam quality, which is different from a case of using an optical fiber. In the articulated beam propagator included in the laser irradiation apparatus of the present invention, the transfer lens 106 in the pipe 103 is disposed so that an emission opening of the laser oscillator 101 and a semiconductor film 112 which is an irradiation surface, which interpose a plurality of pipes 103, are conjugated to each other. With such a structure, an image of the laser beam in the emission opening of the laser oscillator 101 is transferred to the semiconductor film 112, whereby the laser beam can be favorably condensed over the semiconductor film 112 to perform irradiation.

Figure 1B:
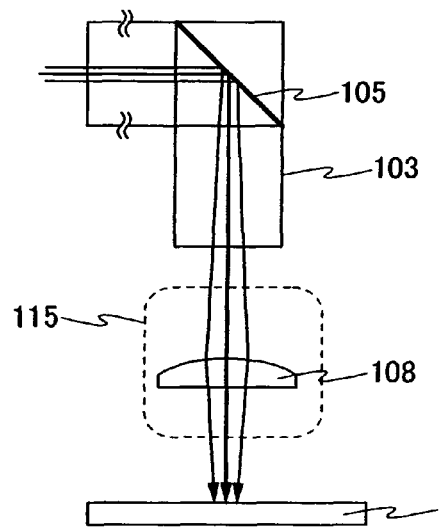
Figure 1C:
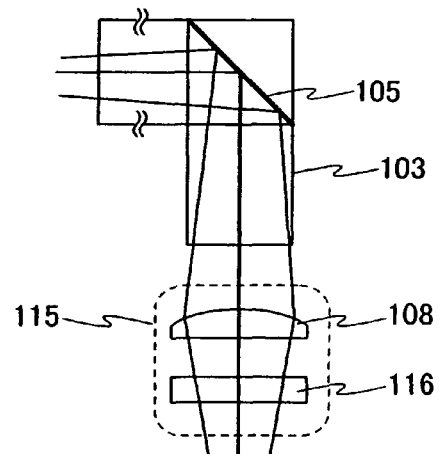
Figure 2C:
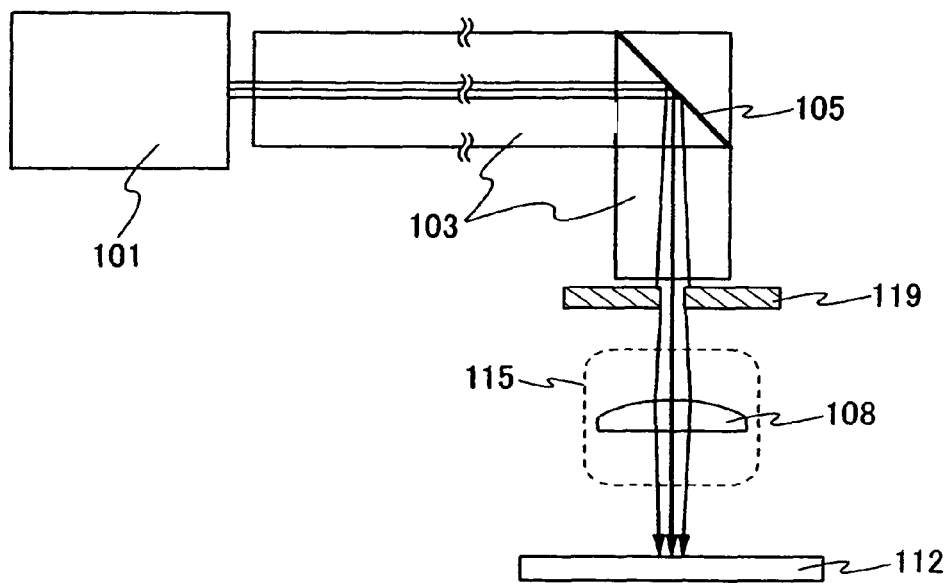

The laser beam emitted from the other end of the articulated beam propagator 102 is linearly shaped by an optical system 115 having the imaging lens 108 (FIGS. 1B and 1C and FIG. 2C). At that time, a disposition of the imaging lens 108 is different depending on whether or not the diameter of the laser beam is sufficiently smaller than the internal diameter of the pipe 103.

In a case where the diameter of the laser beam is sufficiently smaller than the internal diameter of the pipe 103, it is hardly necessary to consider that the laser beam is diffracted at an exit of the pipe 103. Therefore, the imaging lens 108 is disposed so that the mirror 105 by which the laser beam is finally reflected in the articulated beam propagator 102 and the semiconductor film 112 are conjugated to each other.

On the other hand, in a case other than the above, the laser beam is diffracted at the exit of the pipe 103. If the semiconductor film 112 is irradiated with the laser beam as it is, interference fringes are produced on the semiconductor film 112. Therefore, it is necessary to dispose the imaging lens 108 so as to suppress influence of the diffraction. In this case, the imaging lens 108 is disposed so that the exit of the pipe 103 and the semiconductor film 112 are conjugated to each other.

Further alternatively, as shown in FIG. 2C, a slit 119 may be provided near an exit of a pipe 103. By providing the slit 119, the edge portion of a laser beam with low energy can be removed. At that time, a transfer lens 106 in each pipe 103 is disposed so that an emission opening of a laser oscillator 101 and the slit 119, which interpose a plurality of pipes 103, are conjugated to each other. Accordingly, an image of the laser beam in the emission opening of the laser oscillator 101 can be transferred to the slit, whereby the laser beam can be efficiently condensed using an imaging lens 108. Further, as described above, the transfer lens 106 is disposed so that the emission opening of the laser oscillator 101 and a semiconductor film 112 which is an irradiation surface are conjugated to each other. Therefore, when the transfer lens 106 is disposed so that the emission opening of the laser oscillator 101 and the slit 119 are conjugated to each other, the slit 119 and the semiconductor film 112 which is an irradiation surface are also conjugated to each other by the transfer lens 106. A material for the slit 119 is not particularly limited, and any material may be used as long as the edge portion of the laser beam with low energy can be removed. Opening and closing of the slit can be performed by a method using a motor, a manual method, or the like. A pinhole may be provided instead of the slit 119.

Further, an optical system 115 is made as shown in FIG. 1B in a case where the laser beam has already a linear shape in cross section and may be shaped with the same magnification. In this case, a spherical lens can be used as an imaging lens 108. As described above, a position of the imaging lens 108 may be set in accordance with relation between the length of the internal diameter of a pipe 103 and a diameter of the laser beam. FIG. 1B shows a state where the imaging lens 108 is disposed so that a mirror 105 and a semiconductor film 112 are conjugated to each other.

An optical system 115 is made as shown in FIG. 1C in a case where the laser beam is shaped into two directions of the major axis direction and the minor axis direction. An imaging lens 108 in the optical system 115 acts on the laser beam emitted from an end of an articulated beam propagator 102 in the major axis direction of the laser beam. A cylindrical lens can be used as the imaging lens 108. A position of the imaging lens 108 is different depending on relation between the internal diameter of a pipe and a diameter of the laser beam. In a case where the diameter of the laser beam is sufficiently smaller than the internal diameter of a pipe 103, the imaging lens 108 is disposed so that a mirror 105 and a semiconductor film 112 are conjugated to each other. Alternatively, in a case where it cannot be said that the diameter of the laser beam is sufficiently smaller than the internal diameter of the pipe 103, the imaging lens 108 is disposed so that an exit of the pipe 103 and the semiconductor film 112 are conjugated to each other. Thereafter, a condensing lens 116 is made to act with respect to the minor axis direction of the laser beam, and the linearly-shaped laser beam is imaged onto the semiconductor film 112. A cylindrical lens can be used as the condensing lens 116. FIG. 1C shows a state where the imaging lens 108 is disposed so that the mirror 105 and the semiconductor film 112 are conjugated to each other.

As shown in FIG. 1A, the semiconductor film 112 formed over a substrate located over an X-axis stage 110 and a θ stage 111 is irradiated with the laser beam which has passed through an optical system 115. Annealing is performed by irradiation with a linearly-shaped beam spot 113 while the linearly-shaped beam spot 113 is relatively scanned with respect to the semiconductor film 112 over the substrate, thereby crystallizing the semiconductor film 112. Here, a direction in which the beam spot 113 is scanned is made to be a direction which is at right angle to the major axis direction of the beam spot 113, and accordingly, high productivity is obtained.

At this time, the optical system can be moved by a Y-axis stage 114 having a gate shape. Specifically, by movement of the optical system 115 along the Y-axis stage 114, a connection state of the pipes 103 can be changed by the rotatable joint provided in the articulated portion 104 of the articulated beam propagator 102. By combining angle changes of the joints, the articulated beam propagator 102 can be made to follow the movement of the optical system 115. With this mechanism, the light path length from the laser oscillator 101 to the semiconductor film becomes always fixed. Therefore, setting is not necessary to be changed. Accordingly, uniform laser irradiation treatment is possible, thereby generating no variation in processing state of an object to be irradiated.

In order to control an irradiation position of the laser beam, the following method can be employed. A marker 117 is formed over the semiconductor film 112. Positional information of the marker 117 is obtained by a camera 118 located to be adjacent to the optical system 115, thereby determining an irradiation position of the laser beam based on the positional information. Here, the following operation may be combined with the above method: the correction amount of the X-axis and the θ-axis may be calculated based on the positional information of the marker 117, and a movement distance in accordance with the correction amount may be sent to the X-axis stage 110, the θ stage 111, and the Y-axis stage 114. By performing alignment with the use of the X-axis stage 110, the θ stage 111, and the Y-axis stage 114, an irradiation position of the laser beam can be precisely controlled. Although FIG. 1A shows the laser irradiation apparatus having two laser oscillators and two articulated beam propagators, the embodiment mode of the present invention is not limited thereto. That is, the laser irradiation apparatus may have one laser oscillator and one articulated beam propagator, or may have two or more laser oscillators and two or more articulated beam propagators.

Embodiment 1

In this embodiment, an example of laser beam irradiation using a laser irradiation apparatus of the present invention will be explained. Although the embodiment mode shows an example in which a traveling direction of a laser beam is changed using a mirror in an articulated portion, this embodiment shows an example in which a traveling direction of a laser beam is changed using a prism.

As shown in FIG. 1A, an articulated beam propagator 102 included in the laser irradiation apparatus of the present invention is formed using pipes 103 connected by a rotatable articulated portion 104. A transfer lens 106 having an effect of suppressing change in beam profile is provided inside each pipe 103, and a prism is located in the articulated portion 104 by which the pipes 103 are connected to each other. The length of each pipe 103 can be freely set.

In this embodiment, a structure of an articulated portion which reflects a laser beam, which is different from the embodiment mode, will be explained. Also in this embodiment, an articulated portion includes a joint in the same manner as the embodiment mode, and a spatial position of the pipe 103 can be changed by rotating the joint.

Figure 3A:
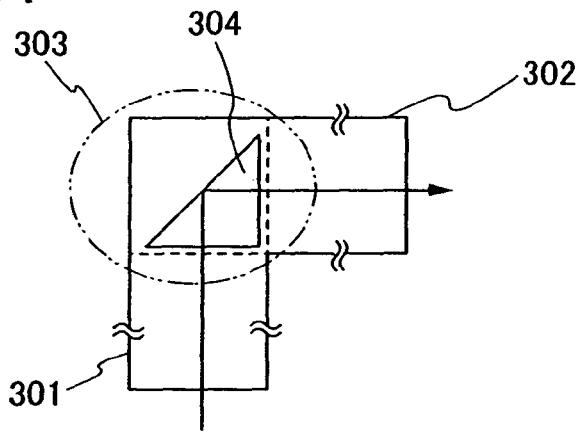
FIGS. 3A to 3D are views each showing another mode of a laser irradiation apparatus of the present invention.

FIG. 3A shows a case where a prism 304, not a mirror, is located in an articulated portion 303 by which pipes 301 and 302 are connected to each other. The prism 304 is used as a reflecting mirror often using a function of internal reflection. Provided that a refractive index outside the prism 304 is $n_1$, a refractive index of the prism 304 is $n_2$, and an incident angle is θ, when $n_1$ is larger than $n_2$, light is reflected by a boundary surface when $\sin θ > n_2/n_1$ is satisfied. By utilizing this principle, a laser beam can be propagated.

When the prism 304 is used, light is transmitted perpendicularly to an entrance surface or an exit surface in many cases. By forming an anti-reflective film over the entrance surface or the exit surface of the prism, it is possible to not only enhance light efficiency but also prevent unnecessary light from being reflected by a transmission surface, thereby having an effect of increasing a S/N ratio of the laser beam.

Figure 3B:
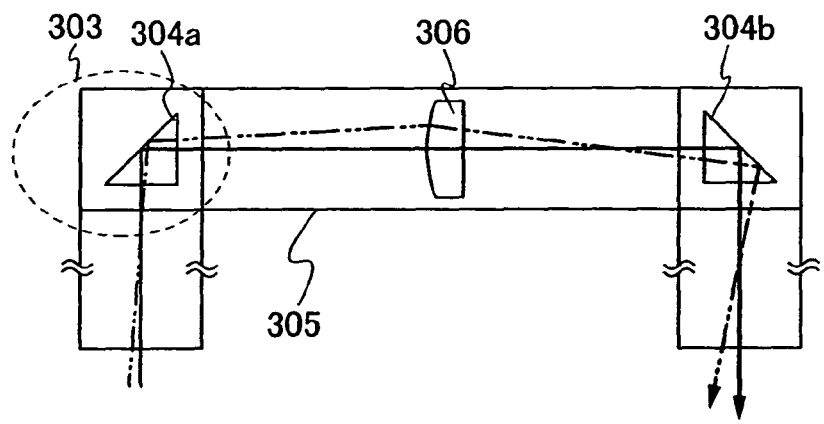

In the same manner as the case of using a mirror, also in a case where light is reflected using a prism, a beam diameter of a laser beam diverges as light travels. Accordingly, as shown in FIG. 3B, a transfer lens 306 is provided so that a reflection surface of the prism 304a and a reflection surface of the prism 304b are conjugated to each other with respect to the transfer lens 306. By providing the transfer lens 306, the diverging laser beam is prevented from being directly hit on an inner wall of a pipe 305. In other words, by providing the transfer lens 306, a laser beam can be propagated without intensity attenuation due to hit on the inner wall of the pipe 305 when a laser beam travels in the pipe 305.

Figure 3C:
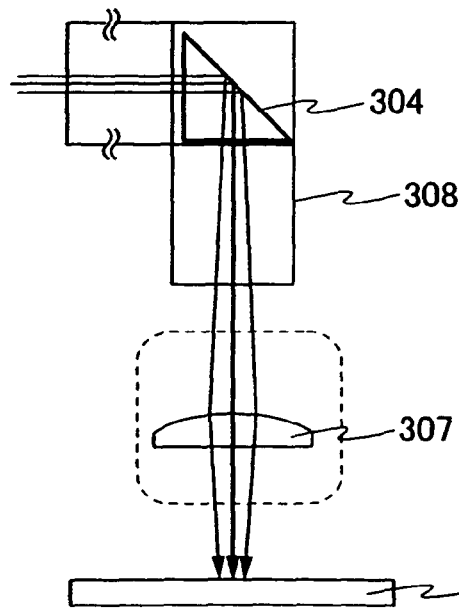
Figure 3D:
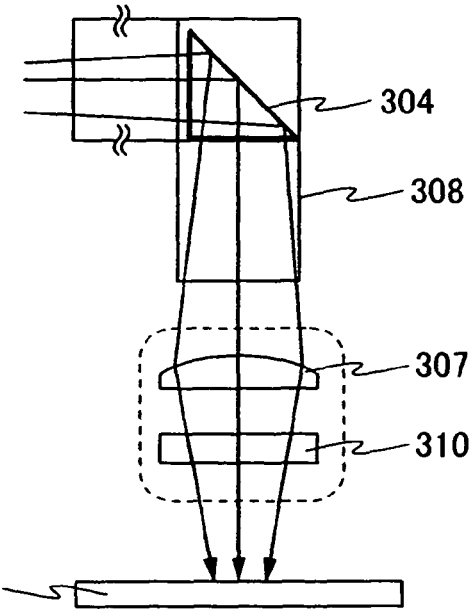

In accordance with a laser irradiation method in this embodiment, in the same manner as the embodiment mode, a laser beam is emitted from an end of the articulated beam propagator 102 and enters the optical system 115 for shaping a laser beam shape (FIGS. 1A to 1C). FIGS. 3C and 3D each show an enlarged view of the portion. As shown in FIGS. 3C and 3D, the optical system 115 includes an imaging lens 307, by which a laser beam is linearly shaped. As the imaging lens 307 for linearly condensing the laser beam which has passed through the optical system 115, a cylindrical lens or the like can be used. In a case of condensing only in one axis direction of the minor axis direction, one cylindrical lens which acts in the minor axis direction may be used. Alternatively, in a case of condensing in two axes directions of the major axis direction and the minor axis direction, two cylindrical lenses may be used. Further alternatively, in a case of condensing with the same magnification with respect to all directions, a spherical lens may be used as the imaging lens 307.

In this embodiment, in condensing a laser beam linearly using the optical system 115, in a case where the diameter of the laser beam is sufficiently smaller than the internal diameter of the pipe 308, the imaging lens 307 is disposed so that a reflection surface of a prism 304 and a semiconductor film 309 are conjugated to each other. On the contrary, in a case where the diameter of the laser beam is not sufficiently smaller than the internal diameter of the pipe 308, diffraction occurs at an exit of the pipe 308; therefore, the imaging lens 307 is disposed so that the exit of the pipe 308 and the semiconductor film 309 are conjugated to each other.

For example, FIG. 3C shows an optical system 115 in a case where the laser beam already has a linear shape in cross section and may be shaped with the same magnification. In this case, a spherical lens can be used as the imaging lens 307. The position of the imaging lens 307 may be set in accordance with relation between the length of the internal diameter of the pipe 308 and the diameter of the laser beam, as described above. FIG. 3C shows an example in which the imaging lens 307 is located so that the reflection surface of the prism 304 and the semiconductor film 309 are conjugated to each other, because the diameter of the laser beam is sufficiently smaller than the internal diameter of the pipe 308.

FIG. 3D shows an optical system in a case where a laser beam is shaped into two directions, the major axis direction and the minor axis direction. An imaging lens 307 acts on the laser beam emitted from an end of a pipe 308 in the major axis direction of the laser beam. As the imaging lens 307, a cylindrical lens can be used. The position of the imaging lens 307 is different depending on relation between the internal diameter of the pipe 308 and the diameter of the laser beam. In a case where the diameter of the laser beam is sufficiently smaller than the internal diameter of the pipe 308, the imaging lens 307 is disposed so that a reflection surface of a prism 304 and a semiconductor film 309 are conjugated to each other. On the contrary, in a case where it cannot be said that the diameter of the laser beam is sufficiently smaller than the internal diameter of the pipe 308, the imaging lens 307 is disposed so that an exit of the pipe 308 and the semiconductor film 309 are conjugated to each other. Further, a condensing lens 310 acts on the minor axis direction of the laser beam so that the laser beam is imaged onto the semiconductor film 309. As the condensing lens 310, a cylindrical lens can be used. FIG. 3D shows an example in which the imaging lens 307 is disposed so that the reflection surface of the prism 304 and the semiconductor film 309 are conjugated to each other.

As described above, the semiconductor film 112, which is formed over the substrate located over the X-axis stage 110 and the θ stage 111, is irradiated with the laser beam which has passed through the optical system included in the laser irradiation apparatus of the present invention as shown in FIGS. 1A to 1C. An entering angle of the laser beam into the semiconductor film 112 is substantially constant. At that time, in the same manner as the embodiment mode, the transfer lens 106 in each pipe 103 is disposed so that an emission opening of the laser oscillator 101 and the semiconductor film 112 are conjugated to each other. With such a structure, it is possible to transfer to the semiconductor film 112 an image of the laser beam in an emission opening of the laser oscillator 101, and to irradiate the semiconductor film 112 with the laser beam which is condensed favorably.

Further, a slit or a pinhole may be provided in the periphery of the exit of the pipe 308. By providing a slit or a pinhole, an edge portion of a laser beam with low energy can be removed. At that time, the transfer lens 306 in each pipe 308 is disposed so that an emission opening of a laser oscillator 101 and the slit, which interpose a plurality of pipes 308, are conjugated to each other. Accordingly, an image of the laser beam in the emission opening of the laser oscillator 101 can be transferred to the slit, whereby the laser beam can be efficiently condensed using the imaging lens 307. Further, as described above, the transfer lens 306 is disposed so that the emission opening of the laser oscillator 101 and the semiconductor film 112 which is an irradiation surface are conjugated to each other. Therefore, when the transfer lens 306 is disposed so that the emission opening of the laser oscillator 101, and the slit or the pinhole are conjugated to each other, the slit or the pinhole, and the semiconductor film 112 which is an irradiation surface are also conjugated to each other by the transfer lens 306. A material of the slit or the pinhole is not particularly limited, and any material may be used as long as an edge portion of the laser beam with low energy can be removed. Opening and closing of the slit or the pinhole can be performed by a method using a motor, a manual method, or the like.

In FIGS. 1A to 1C, by movement of the optical system 115 along the Y-axis stage 114, a connection state of the pipes 103 can be changed by a rotatable joint provided in the articulated portion 104 of the articulated beam propagator 102. By combining angle changes of the joints, the articulated beam propagator 102 can be made to follow the movement of the optical system 115.

Although the optical system 115 is directly moved in the Y-axis direction in FIGS. 1A to 1C, the optical system 115 is not necessary to be moved in a case where a stage capable of moving the substrate in the X-axis direction and the Y-axis direction is prepared.

In order to control an irradiation position of the laser beam, the following method can be employed. A marker 117 is formed over the semiconductor film 112, and positional information of the marker 117 is obtained by a camera located to be adjacent to the optical system 115, thereby determining an irradiation position of the laser beam based on the positional information. Here, the following operation may be combined with the above method: the correction amount of the X-axis and the O-axis may be calculated based on the positional information of the marker 117, and a movement distance in accordance with the correction amount may be sent to the X-axis stage 110, the θ stage 111, and the Y-axis stage 114. By performing alignment at the X-axis stage 110, the θ stage 111, and the Y-axis stage 114, an irradiation position of the laser beam can be precisely controlled.

A type of a laser oscillator which can be used for the laser irradiation apparatus of the present invention is not particularly limited. Any of a continuous wave laser oscillator, a pulsed laser oscillator which performs pulsed oscillation with a repetition rate of greater than or equal to 10 MHz, and a laser oscillator which oscillates with a pulse width greater than or equal to 1 femtosecond and less than or equal to 100 picoseconds can be used.

Specifically, the following laser oscillators can be used. In this specification, ceramic refers to a material which is artificially made by heating or the like and is an inorganic matter, non-metal, and a solid-state at room temperature.

(1) A continuous wave laser emitted from a solid state laser such as a laser using, as a medium, single crystalline YAG, YVO$_4$, forsterite (Mg$_2$SiO$_4$), YAlO$_3$, or GdVO$_4$, or polycrystalline (ceramic) YAG, Y$_2$O$_3$, YVO$_4$, YAlO$_3$, or GdVO$_4$ doped with one or more of Nd, Yb, Cr, Ti, Ho, Er, Tm, and Ta as a dopant, an alexandrite laser, or a Ti:sapphire laser; a gas laser such as an Ar laser or a Kr laser; or a semiconductor laser such as a GaN laser, a GaAs laser, or a InAs laser can be used.

(2) A pulsed laser having a repetition rate of greater than or equal to 10 MHz, such as a laser using, as a laser crystal, single crystalline YAG, YVO$_4$, forsterite (Mg$_2$SiO$_4$), YAlO$_3$, or GdVO$_4$, or polycrystalline (ceramic) YAG, Y$_2$O$_3$, YVO$_4$, YAlO$_3$, or GdVO$_4$ doped with one or more of Nd, Yb, Cr, Ti, Ho, Er, Tm, and Ta as a dopant; an Ar ion laser; or a Ti:sapphire laser can be used.

(3) A laser which oscillates with a pulse width greater than or equal to 1 femtosecond and less than or equal to 100 picoseconds such as a Ti:sapphire laser, a laser using a chromium-forsterite crystal, a YVO$_4$ laser, or a Yb:YAG laser can be used. A laser which oscillates with a pulse width of femtoseconds (1 femtosecond=10-15 second) is also referred to as a femtosecond laser. The pulse width becomes femtoseconds by locking the mode.

A laser using, as a medium, single crystalline YAG, YVO$_4$, forsterite (Mg$_2$SiO$_4$), YAlO$_3$, or GdVO$_4$, or polycrystalline (ceramic) YAG, Y$_2$O$_3$, YVO$_4$, YAlO$_3$, or GdVO$_4$ doped with one or more of Nd, Yb, Cr, Ti, Ho, Er, Tm, and Ta as a dopant; an Ar ion laser; or a Ti:sapphire laser can be continuously oscillated. Further, pulse oscillation thereof can be performed with a repetition rate of greater than or equal to 10 MHz by performing a Q switch operation, mode locking, or the like. When a laser beam is oscillated with a repetition rate of greater than or equal to 10 MHz, a semiconductor film is irradiated with a next pulse while the semiconductor film is melted by the laser and solidified. Therefore, unlike a case of using a pulsed laser with a low repetition rate, a solid-liquid interface can be continuously moved in the semiconductor film so that crystal grains, which continuously grow toward a scanning direction, can be obtained.

When ceramic (polycrystal) is used as a medium, a laser crystal can be formed to have a free shape in a short time at low cost. When a single crystal is used, a columnar laser crystal with several mm in diameter and several tens of mm in length is usually used. In the case of using the ceramic, a laser crystal which is much larger can be formed.

Concentration of a dopant such as Nd or Yb in a laser crystal, which directly contributes to light emission, cannot be changed largely in both cases of the single crystal and the polycrystal; therefore, there is a limitation to some extent in improvement in output of a laser by increasing the concentration. However, in the case of the ceramic, the concentration of a dopant in a laser crystal can be increased as compared with the single crystal; therefore, drastic improvement in output of a laser can be realized.

Further, in the case of the ceramic, a laser crystal with an arbitrary shape can be easily formed. A laser crystal using the ceramic can be largely formed as compared with a single crystalline laser crystal; therefore, a longer oscillation light path can be obtained than in the case of using a single crystalline laser crystal. When the oscillation light path is long, amplitude is increased and a laser beam can be oscillated at high output.

When a laser crystal with a parallel hexahedron shape or a rectangular parallelepiped shape is used, oscillated light can be made to travel in a straight line inside the laser crystal or in a zigzag inside the laser crystal so as to be reflected inside the laser crystal. A longer oscillation light path can be obtained in the latter than the former, whereby a laser beam can be oscillated at higher output. Further, a laser beam emitted from a laser crystal having such a shape has a quadrangular shape in cross section in the emission; therefore, as compared with a laser beam with a circular shape in cross section, the laser beam with a quadrangular shape in cross section has an advantage to be shaped into a linear beam.

By shaping a laser beam emitted in the above described manner using an optical system, a linear beam having 1 mm or less in length of a short side and several mm to several m in length of a long side can be easily obtained over the semiconductor film. In addition, when a laser crystal is uniformly irradiated with excited light, a linear beam is emitted with uniform energy distribution in a long side direction.

By using the laser irradiation apparatus of the present invention having the structure described above, various effects can be obtained. For example, a laser beam can be propagated through a beam propagator while divergence of a beam diameter of the laser beam and short-term fluctuation of an optical axis are corrected by a transfer lens. Therefore, a laser beam can be propagated without being hit on an inner wall of a pipe when the laser beam passes through the beam propagator.

Further, even if a space is small, irradiation with a laser beam is possible as long as a place to dispose a beam propagator is secured. Therefore, irradiation with a laser beam, which is greater in quantity than a conventional one, can be performed at one time, whereby efficiency in laser irradiation treatment is significantly improved.

Since setting such as optical axis alignment becomes the minimum necessary, time for setting is drastically reduced. Setting is performed only by rotating a joint of a pipe, whereby setting can be performed safely and easily without contact with a laser beam. Further, a propagating distance of a laser beam is not changed even when a position of a pipe is changed; therefore, setting of an optical system such as a condensing lens is not necessary to be changed. Accordingly, uniform laser irradiation treatment is possible, thereby generating no variation in processing state of an object to be irradiated.

Embodiment 2

In this embodiment, an example of a laser crystallization method, which is different from the above example, will be shown. In this embodiment, a laser in which ceramic YAG is doped with Yb is used for a laser oscillator. This laser has a wavelength in a near-infrared region and is capable of outputting power of 10 kW. This embodiment is not limited thereto, and a diode laser, an LD-pumped solid-state laser, or the like may be used. Although a CW laser is used in this embodiment, a pulsed laser having a repetition rate of greater than or equal to 10 MHz may also be used.

In a case of a laser crystal using the ceramic, a crystal larger than a single crystalline laser crystal can be easily formed; therefore, a longer oscillation light path can be obtained as compared with the case of using a single crystalline laser crystal. When the oscillation light path is long, amplitude is increased and a laser beam can be oscillated at high output. When a laser crystal with a parallel hexahedron shape or a rectangular parallelepiped shape is used, an oscillated light can be made to travel in a straight line inside the laser crystal or in a zigzag inside the laser crystal so as to be reflected inside the laser crystal. In particular, when the oscillated light is made to reflect and travel in a zigzag inside the laser crystal to obtain a long oscillation light path, a laser beam can be oscillated at higher output.

The reason why a laser oscillator having a wavelength in a near-infrared region is used is as follows. A fundamental wave oscillated from a laser crystal enters a non-linear optical element; thus, a harmonic is obtained. However, there is a problem that when an output of the laser oscillator gets higher, the non-linear optical element is damaged due to a non-linear optical effect such as multiphoton absorption, which leads to breakdown. Accordingly, a CW laser in a visible range and a pulsed laser having a repetition rate of greater than or equal to 10 MHz which are produced at present have an output of approximately 15 W at a maximum due to the problem of the non-linear optical element. Therefore, if a laser beam of a fundamental wave having a higher output can be used for crystallization, a beam spot on an irradiation surface can be made longer; thus, laser irradiation treatment can be performed efficiently.

In this embodiment, a laser beam having a wavelength which is not absorbed into a semiconductor film is used; therefore, light is absorbed only into a light absorption layer shaped into a predetermined size. A laser beam is absorbed into the light absorption layer, heat generated by this absorption is diffused into the semiconductor film through an insulating film, whereby temperature distribution in the depth direction of the substrate is obtained. By this, the semiconductor film is melted. Further, in accordance with the temperature distribution described above, crystallization proceeds such that crystal growth occurs from a low temperature portion (a region having no light absorption layer right above the semiconductor film) toward a high temperature portion (a region having the light absorption layer right above the semiconductor film). In other words, crystal growth occurs from a region having no light absorption layer toward a region having the light absorption layer, and finally, heads of the crystal growth collide near the region having the light absorption layer. In this manner, a polycrystalline semiconductor film is formed.

A minute beam spot cannot be formed with a laser oscillator capable of outputting high power of several kW, because quality of an outputted beam is comparatively inferior due to the structure of the oscillator. However, by using the present invention, a laser oscillator outputting high power can be used. A fiber laser, a diode laser, a lump pumped or LD pumped solid state laser, and the like can be given as a laser oscillator of a fundamental wave which is capable of outputting power of several kW.

Figure 4A:
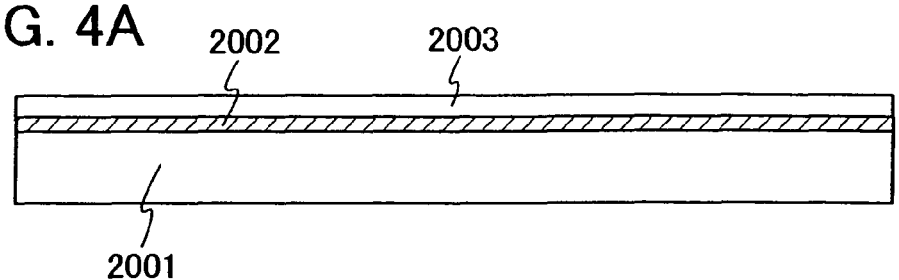
FIGS. 4A to 4E are explanatory views of a semiconductor device using a laser irradiation apparatus of the present invention and a manufacturing method thereof.

A specific example of a manufacturing method of a crystalline semiconductor film will be explained. As shown in FIG. 4A, as a substrate 2001, an insulating substrate such as a glass substrate, which transmits visible light ray having a wavelength of a laser beam used for laser crystallization, is used. In this embodiment, a glass substrate having a thickness of 0.7 mm is used as the substrate 2001. Note that a material for the substrate 2001 is not limited to glass such as barium borosilicate glass or alumino borosilicate glass, and a plastic substrate having heat resistance, which can withstand a processing temperature of this process, or the like can be used.

An insulating film such as a silicon oxide film, a silicon nitride film, or a silicon oxide film containing nitrogen is formed over one surface of the substrate 2001 as a base film 2002. As a typical example of the base film 2002, a two-layer structure is employed as the base film 2002, in which a silicon nitride film containing oxygen, having a thickness of 50 to 100 nm, and formed using $SiH_4$, $NH_3$, and $N_2O$ as a reaction gas, and a silicon oxide film containing nitrogen, having a thickness of 100 to 150 nm, and formed using $SiH_4$ and $N_2O$ as a reaction gas, are stacked. Further, as one layer included in the two-layer structure of the base film 2002, a silicon nitride film or a silicon nitride film containing oxygen having a thickness of 10 nm or less is preferably used. As another example, a three-layer structure may be employed, in which a silicon nitride film containing oxygen, a silicon oxide film containing nitrogen, and a silicon nitride film are sequentially stacked. The base film 2002 serves as a blocking layer for preventing ion of sodium or the like from entering a TFT from the substrate. Further, the base film 2002 serves as a buffer layer.

Next, an amorphous semiconductor film 2003 is formed. The amorphous semiconductor film 2003 is formed to have a thickness of greater than or equal to 25 nm and less than or equal to 200 nm (preferably, a thickness of greater than or equal to 30 nm and less than or equal to 80 nm) by a known method (a sputtering method, an LPCVD method, a plasma CVD method, or the like). In this embodiment, the amorphous semiconductor film 2003 is formed to have a thickness of 70 nm. Here, as a material for the amorphous semiconductor film 2003, silicon, silicon germanium, SiC, or the like can be used. In this embodiment, silicon is used as a material for the amorphous semiconductor film 2003. In a case of using silicon germanium, the concentration of germanium is preferably approximately 0.01 to 4.5 atomic %. In addition, an example of using an amorphous silicon film for a semiconductor film is shown in this embodiment and other embodiments; however, a polycrystalline silicon film may also be used. For example, after forming an amorphous silicon film, a polycrystalline silicon film can be formed by adding a minute amount of an element such as nickel, palladium, germanium, iron, tin, lead, cobalt, silver, platinum, copper, or gold to the amorphous silicon film, and then performing heat treatment at 550° C. for 4 hours. Further, a compound of silicon and carbon may also be used as the semiconductor film.

Instead of the amorphous semiconductor film 2003, a semiconductor film having a crystalline structure that is formed without being subjected to crystallization separately (a polycrystalline silicon film, a microcrystalline semiconductor film (also referred to as a semi-amorphous semiconductor film or the like), or the like) may be used.

Furthermore, thermal annealing is performed on the amorphous semiconductor film 2003 at 500° C. for an hour in order to increase resistance of the amorphous semiconductor film 2003 against a laser beam.

Figure 4B:
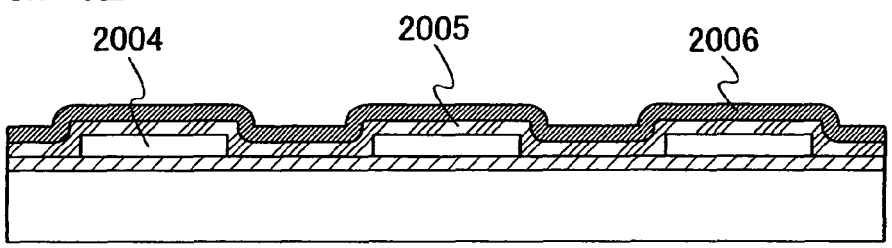

Next, as shown in FIG. 4B, treatment of shaping (patterning) the amorphous semiconductor film 2003 into a desired shape by a photolithography technique is performed; thus, an island-like amorphous semiconductor film 2004 is formed. In this treatment, before forming a resist mask, an oxide film can be formed by a method for coating the surface of the island-like amorphous semiconductor film 2004 with a solution containing ozone or a method for generating ozone by UV irradiation in an oxygen atmosphere in order to protect the island-like amorphous semiconductor film 2004. The oxide film formed here also has an effect of improving wettability of the resist.

If necessary, doping of a minute amount of an impurity element (boron or phosphorus) is performed through the oxide film to control a threshold voltage of a TFT before shaping a pattern. Here, by performing doping, activation treatment of the impurity element added by a step of crystallization by a laser beam to be performed later can be performed at the same time; thus, an effect of reducing a step is also obtained. When the doping is performed through the oxide film, the oxide film may be removed.

Then, after washing for removing an unnecessary matter such as a remaining resist or a resist peeling solution generated by the pattern shaping treatment is performed, an insulating film 4005 is formed so as to cover the surface of the island-like amorphous semiconductor film 2004.

The insulating film 2005 is formed in such a way that an insulating film such as a silicon oxide film or a silicon oxide film containing nitrogen is formed to have a thickness of approximately 50 to 300 nm. Alternatively, the insulating film 2005 may be formed by stacking two or more layers of a silicon oxide film, a silicon nitride film, and a silicon oxide film containing nitrogen. The insulating film 2005 has a role to prevent diffusion of an element used for a light absorption layer 2006, as an impurity, and formation of a deep level in a semiconductor.

The light absorption layer 2006 including a metal element or a semiconductor element is formed. The reason why the light absorption layer 2006 is formed is as follows. As described above, a laser beam of a fundamental wave having a wavelength in a near-infrared region is used in this embodiment. However, in a wavelength in the near-infrared region, a light absorption coefficient with respect to a semiconductor film such as a silicon film is low. Therefore, when the laser beam of the fundamental wave having the wavelength in the near-infrared region is used, a semiconductor film cannot be melted directly. Accordingly, the light absorption layer having a high absorption coefficient in the near-infrared region is provided, and the semiconductor film is indirectly crystallized by heat generated when a laser beam is absorbed in the light absorption layer.

Specifically, as a material for the light absorption layer 2006, any one of metals having a high melting point such as tungsten (W), molybdenum (Mo), titanium (Ti), tantalum (Ta), chromium (Cr), or cobalt (Co), or alloy of these metals is used. Alternatively, the light absorption layer 2006 may be formed by stacking two or more layers, using nitride of these metals (for example, WN, MoN, TiN, TaN, or the like), or silicide of metal ($WSi_2$, $MoSi_2$, $TiSi_2$, $TaSi_2$, $CrSi_2$, $CoSi_2$, $PtSi_2$, or the like).

Figure 4C:
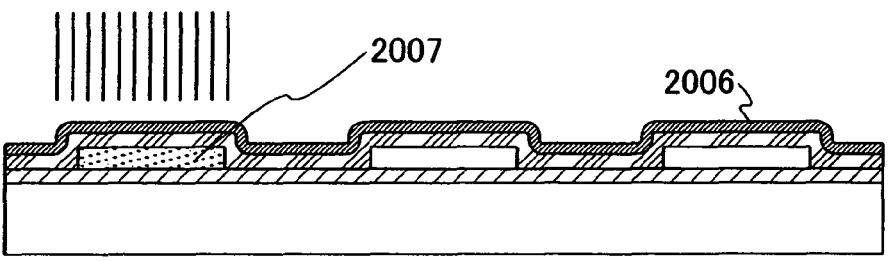

Next, as shown in FIG. 4C, the island-like amorphous semiconductor film 2004 is crystallized by irradiation with a laser beam using the laser irradiation apparatus of the present invention to form a crystalline semiconductor film 2007. The island-like amorphous semiconductor film 2004 is heated by heat generated when light of the laser beam is absorbed in the light absorption layer 2006. As a result, the island-like amorphous semiconductor film 2004 is crystallized by crystal growth of the island-like amorphous semiconductor film 2004 in a region which is irradiated with the laser beam and is completely melted.

Figure 4D:
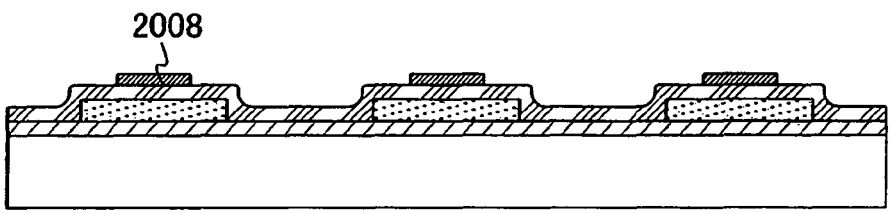

After the laser beam irradiation, the light absorption layer 2006 may be removed by etching, or alternatively, the light absorption layer 2006 may be shaped into a desired shape without etching to be used as a gate insulating film 2008. In FIG. 4D, the light absorption layer 2006 is removed by etching, leaving part thereof.

Figure 4E:
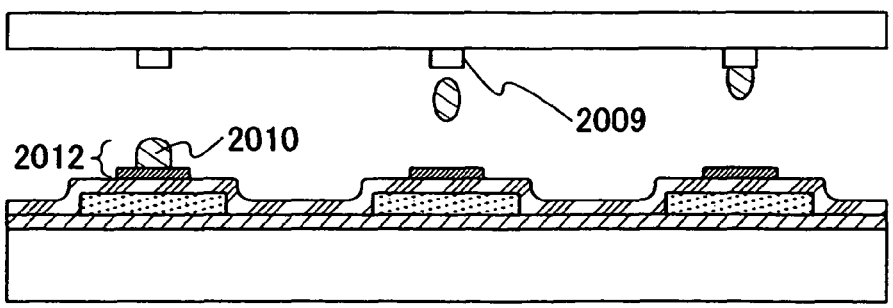

A gate electrode is not limited to one layer, and may be a plurality of layers. In FIG. 4E, an example is shown, in which after the light absorption layer 2006 is shaped by etching, a conductive film 2010 is directly formed by discharging a paste including a conductive material from an injection nozzle 2009 to form a gate electrode 2012. A method for forming the gate electrode 2012 is not limited thereto. Alternatively, the light absorption layer 2006 is shaped by etching, a conductive film is formed over the light absorption layer 2006, and further the conductive film is shaped by etching; thus, the gate electrode 2012 having two or more layers can also be formed. In addition, before etching the light absorption layer 2006, a conductive film including a conductive material is formed, and is etched at the same time as the light absorption layer 2006 to be shaped into a predetermined shape; thus, the gate electrode 2012 can also be formed.

The material used in the embodiment mode or other embodiments can be used for a material for the conductive film 2010. A CVD method or a sputtering method may also be used for forming the conductive film 2010. Alternatively, a method may be used, by which a substance in which fine particles of a conductive material are dissolved or dispersed by a solvent is directly formed into the shape of the gate electrode.

By using a known method for the following steps, various semiconductor devices can be manufactured.

By using the laser irradiation apparatus of the present invention, various effects can be obtained. For example, a laser beam can be propagated through a beam propagator while divergence of a beam diameter of the laser beam and short-term fluctuation of an optical axis are corrected by a transfer lens. Therefore, a laser beam can be propagated without being hit on an inner wall of a pipe, and accordingly, a semiconductor film can be irradiated with the energy of the laser beam kept, which is emitted from the laser irradiation apparatus. Further, even if a space is small, irradiation with a laser beam is possible as long as a place to dispose a beam propagator is secured. Therefore, irradiation with a laser beam, which is greater in quantity than a conventional one, can be performed at one time, whereby efficiency in laser irradiation treatment is significantly improved. In a case of using a large-sized substrate having a side more than one meter, there is a great effect in that a semiconductor film can be irradiated with several to several tens of laser beams at one time at the same time.

Since setting such as optical axis alignment becomes the minimum necessary, time for setting is drastically reduced. Setting is performed only by rotating a joint of a pipe, whereby setting can be performed safely and easily without contact with a laser beam or without deviation of an optical axis on contact with another optical system. Further, a propagating distance of a laser beam is not changed even when a position of a pipe is changed; therefore, setting of an optical system such as a condensing lens is not necessary to be changed. Accordingly, uniform laser irradiation treatment is possible, thereby generating no variation in processing state of an object to be irradiated.

In this embodiment, an example is shown, in which the light absorption layer 2006 is formed over the insulating film 2005, the light absorption layer 2006 is directly irradiated with the laser beam, and heat generated in the light absorption layer 2006 is used for melting of the island-like amorphous semiconductor film 2004. However, the light absorption layer 2006 is not necessarily in the top layer. For example, in a case of manufacturing an IC tag using a semiconductor element such as a TFT, a layer to be peeled is formed in the lower layer than the semiconductor film because the IC tag is peeled from a substrate after processes are finished. A structure may be employed, in which the layer to be peeled also serves as a light absorption layer.

Embodiment 3

In this embodiment, an example of manufacturing a CMOS transistor using an n-channel TFT and a p-channel TFT manufactured using a laser irradiation apparatus of the present invention will be shown.

Figure 5A:
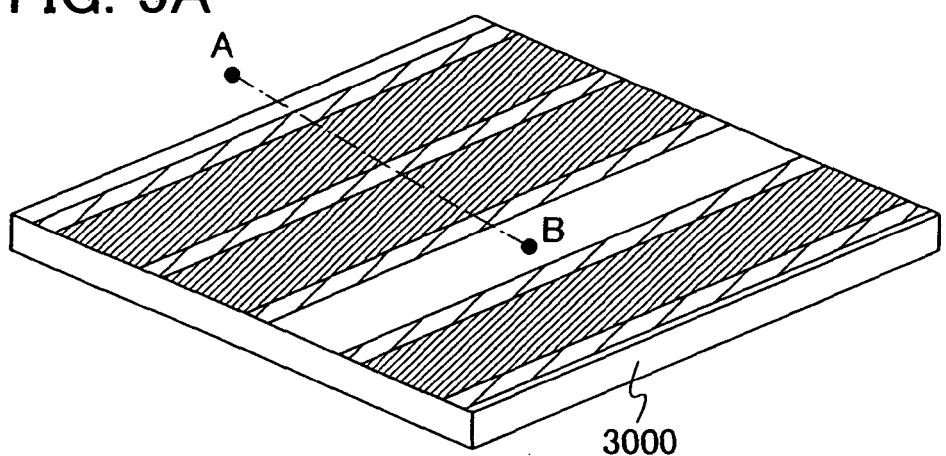
FIGS. 5A to 5C are explanatory views of a manufacturing method of a semiconductor device (a CMOS transistor) using a laser irradiation apparatus of the present invention.

FIG. 5A shows a state which is immediately after performing laser irradiation using a plurality of laser irradiation apparatuses at the same time with respect to an amorphous semiconductor film 3002 formed over a substrate 3000 using the present invention. Hereinafter, a manufacturing process will be explained, which is viewed from a cross section taken along a dotted line A-B in FIG. 5A.

Figure 5B:
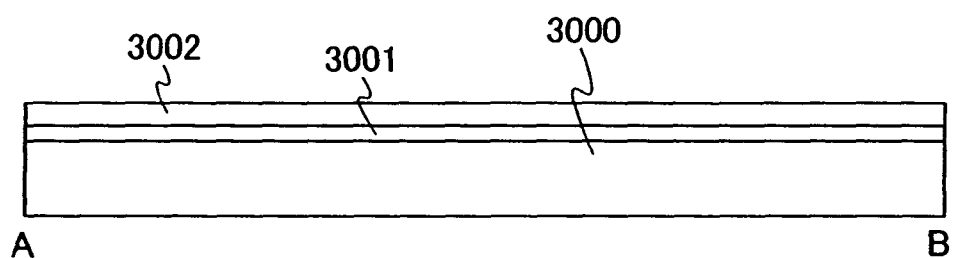

As shown in FIG. 5B, a base film 3001 is formed over the substrate 3000 having an insulating surface. In this embodiment, a glass substrate is used as the substrate 3000. As the substrate used here, a glass substrate made of barium borosilicate glass, alumino borosilicate glass, or the like; a quartz substrate; a ceramic substrate; a stainless steel substrate; or the like can be used. Although a substrate made of a synthetic resin typified by acrylic or plastic which is represented by PET (Polyethylene Terephthalate), PES (polyethersulPhone Resin), or PEN (Polyethylene Naphthalate), tends to have lower heat resistance than another substrate in general, the substrate can be used as long as the substrate can withstand the treatment of this process.

The base film 3001 is provided in order to prevent alkaline earth metal or alkali metal such as sodium included in the substrate 3000 from diffusing into the semiconductor. Alkaline earth metal and alkali metal cause adverse effects on the characteristics of a semiconductor element when such metal is in the semiconductor film. For this reason, the base film 3001 is formed using an insulating film which can prevent the diffusion of alkaline earth metal and alkali metal into the semiconductor, such as a silicon oxide film, a silicon nitride film, or a silicon nitride film containing oxygen. The base film 3001 is formed either in a single-layer or stacked-layer structure. In this embodiment, a silicon nitride film containing oxygen is formed to have a thickness of 10 to 400 nm by a plasma CVD (Chemical Vapor Deposition) method.

Note that it is effective to provide the base film in order to prevent the diffusion of the impurity when the substrate 3000 includes even a little amount of alkaline earth metal or alkali metal, such as a glass substrate or a plastic substrate. However, when a substrate in which the diffusion of the impurity does not lead to a significant problem, for example a quartz substrate, is used, the base insulating film 3001 is not necessarily provided.

Next, the amorphous semiconductor film 3002 is formed over the base film 3001. The amorphous semiconductor film 3002 is formed to have a thickness of 25 to 100 nm (preferably, a thickness of 30 to 60 nm) by a known method (a sputtering method, an LPCVD method, a plasma CVD method, or the like). Silicon, silicon germanium, or the like can be used as a material for the amorphous semiconductor film 3002 which is used here. In this embodiment, silicon is used. In a case of using silicon germanium, the concentration of germanium is preferably approximately 0.01 to 4.5 atomic %.

Figure 5C:
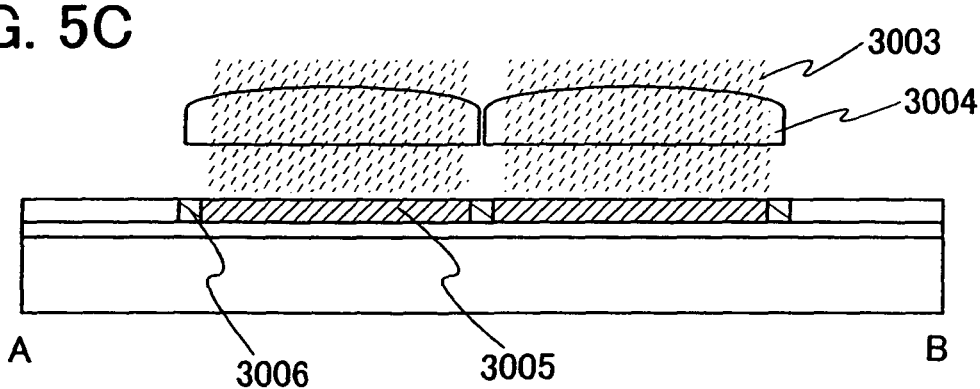

Subsequently, as shown in FIG. 5C, the amorphous semiconductor film 3002 is crystallized by irradiation with a laser beam 3003 using a laser irradiation apparatus of the present invention. In this embodiment, continuous wave ceramic YAG laser is used for the laser beam 3003. Oscillation is performed by adding plural types of dopants such as Nd and Yb into a laser crystal of a ceramic YAG. The central wavelength of the fundamental wave of this laser oscillator is from 1030 to 1064 nm and the full width at half maximum of the oscillation wavelength is approximately 30 nm. This fundamental wave is converted into a second harmonic by a non-linear optical crystal inside the laser oscillator. This second harmonic has a central wavelength from 515 to 532 nm and a full width at half maximum of the oscillation wavelength of approximately 15 nm. Irradiation is performed after the laser beam is condensed by a cylindrical lens 3004.

In addition to the above-described laser, a laser including a crystal of sapphire, YAG, ceramic YAG, ceramic $Y_2O_3$, KGW, KYW, $Mg_2SiO_4$, YLF, $YVO_4$, or $GdVO_4$ doped with one or more selected from Nd, Yb, Cr, Ti, Ho, or Er; a Ti:Sapphire laser; or the like can be used. The laser beam 3003 is converted into a harmonic by a known non-linear optical element. Although the laser beam 3003 is converted into the second harmonic by the non-linear optical element in this embodiment, a harmonic other than the second harmonic is also applicable.

Figure 6A:
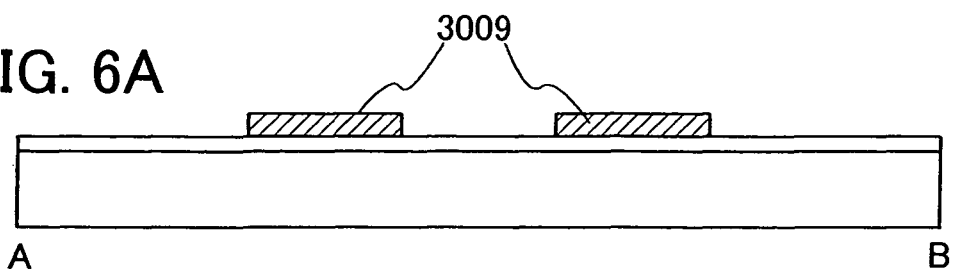
FIGS. 6A to 6C are explanatory views of a semiconductor device (a CMOS transistor) using a laser irradiation apparatus of the present invention, and a manufacturing method thereof.
Figure 6B:
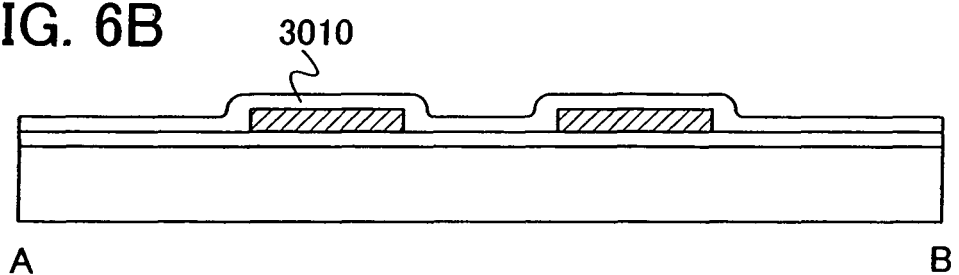

By using the above method, a large grain size region 3005 with a crystal grain grown continuously in the scanning direction and a poorly crystalline region 3006 are formed. Further, an island-like semiconductor film 3009 is formed by etching (FIG. 6A). A gate insulating film 3010 is formed to cover the island-like semiconductor film 3009 (FIG. 6B).

By using the laser irradiation apparatus of the present invention, a laser beam can be propagated without being hit on an inner wall of a pipe when the laser beam passes through the beam propagator, and accordingly, a semiconductor film can be irradiated with the energy of the laser beam kept, which is emitted from the laser irradiation apparatus. Further, even if a space is small, irradiation with a laser beam is possible as long as a place to dispose a beam propagator is secured. Therefore, irradiation with a laser beam, which is greater in quantity than a conventional one, can be performed at one time, whereby efficiency in laser irradiation treatment is significantly improved. In a case of using a large-sized substrate having a side more than one meter, there is a great effect in that a semiconductor film can be irradiated with several to several tens of laser beams at one time at the same time.

Since setting such as optical axis alignment becomes the minimum necessary, time for setting is drastically reduced. Setting is performed only by rotating a joint of a pipe, whereby setting can be performed safely and easily without contact with a laser beam or without deviation of an optical axis on contact with another optical system. Further, a propagating distance of a laser beam is not changed even when a position of a pipe is changed; therefore, setting of an optical system such as a condensing lens is not necessary to be changed. Accordingly, uniform laser irradiation treatment is possible, thereby generating no variation in processing state of an object to be irradiated.

The gate insulating film 3010 can be formed using a thermal oxidation method, a plasma CVD method, or a sputtering method. For example, a stacked film of a silicon oxide film having a thickness of 5 nm obtained by a thermal oxidation method and a silicon oxide film containing nitrogen having a thickness of 10 to 15 nm obtained by a CVD method may be formed. A film can be continuously formed by switching gas.

A material of the gate insulating film 3010 is not limited to the above-described material, and the material for the gate insulating film 3010 can be (1) a silicon oxide film, a silicon nitride film containing oxygen, a silicon oxide film containing nitrogen, a silicon nitride film, or a stacked film of these, or (2) a high dielectric constant substance (also referred to as a high-k material) such as a tantalum oxide, a hafnium oxide ($HfO_2$), nitrogen added hafnium silicon oxide (HfSiON), a zirconium oxide ($ZrO_2$), or an aluminum oxide ($Al_2O_3$); or a rare-earth oxide such as a lanthanum oxide ($La_2O_2$).

Figure 6C:
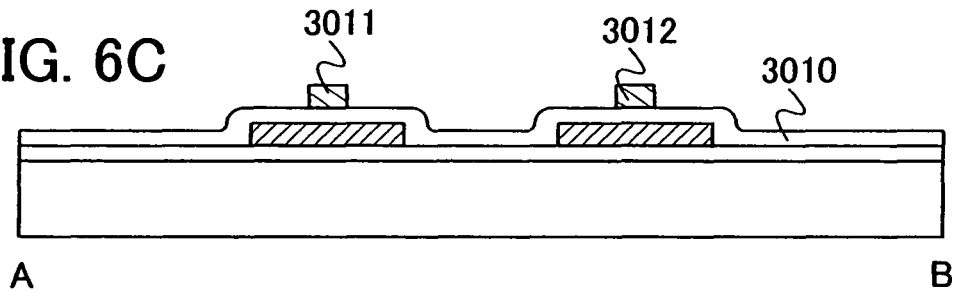

Next, as shown in FIG. 6C, a conductive film is formed over the gate insulating film 3010 and formed to have a desired shape to form gate electrodes 3011 and 3012 as outlined below. First, a conductive film formed over the gate insulating film 3010 may be formed using a material having conductivity. As the material, an element selected from gold (Au), silver (Ag), copper (Cu), platinum (Pt), aluminum (Al), molybdenum (Mo), tungsten (W), or titanium (Ti), or an alloy material or a compound material containing these elements as its main component can be used. Furthermore, a stacked material of these materials can be used. Although a stacked film of W (tungsten) and TaN (tantalum nitride) is used in this embodiment, a conductive film formed by stacking Mo (molybdenum), Al (aluminum), and Mo in this order using Al and Mo or a conductive film formed by stacking Ti (titanium), Al, and Ti in this order using Ti and Al may also be used. In particular, in the case where the gate insulating film 3010 is formed using the high dielectric constant material (high-k material) which is described above, depletion of the gate electrode can be reduced and a large amount of current can be flowed, so that lower power consumption of a semiconductor element can be achieved.

Then, a resist mask for shaping this conductive film into a desired shape is formed. First, the surface of the conductive film is coated with photoresist by a spin coating method or the like and light-exposure is performed. Next, heat treatment (prebake) is performed on the photoresist. The temperature for the prebake is set to 50 to 120° C., which is lower than the temperature for postbake to be performed later. In this embodiment, the heat temperature is set to 90° C. and the heat time is set to 90 seconds.

Next, the resist which has been exposed to light is developed by dropping a developing solution onto the photoresist or spraying the developing solution from a spray nozzle thereon.

Thereafter, a so-called postbake by which heat treatment is performed on the developed photoresist at 125° C. for 180 seconds is performed so that moisture or the like remaining in the resist mask is removed and the stability against the heat is increased at the same time. Through these steps, a resist mask is formed. With this resist mask, the conductive film is etched to have a desired pattern to form the gate electrodes 3011 and 3012.

As another method, a droplet discharging method typified by a printing method or an ink jet method capable of discharging a material at a predetermined position can be used to form the gate electrodes 3011 and 3012 directly on the gate insulating film 3010.

A conductive material is dissolved or dispersed into a solvent, thereby forming a liquid substance having conductivity to be discharged. As the conductive material which can be used here, at least one element selected from gold (Au), silver (Ag), copper (Cu), platinum (Pt), aluminum (Al), chromium (Cr), palladium (Pd), indium (In), molybdenum (Mo), nickel (Ni), lead (Pb), iridium (Ir), rhodium (Rh), tungsten (W), cadmium (Cd), zinc (Zn), iron (Fe), titanium (Ti), zirconium (Zr), or barium (Ba), or alloy of these metals can be used. The solvent may be an organic solvent, for example, esters such as butyl acetate or ethyl acetate; alcohols such as isopropyl alcohol or ethyl alcohol; methyl ethyl ketone; or acetone.

The viscosity of a composition is 300 cp or less in order to prevent drying and to facilitate the discharging of the composition from a discharge outlet. The viscosity and the surface tension of the composition may be appropriately adjusted in accordance with the solvent and the intended purpose.

Figure 7A:
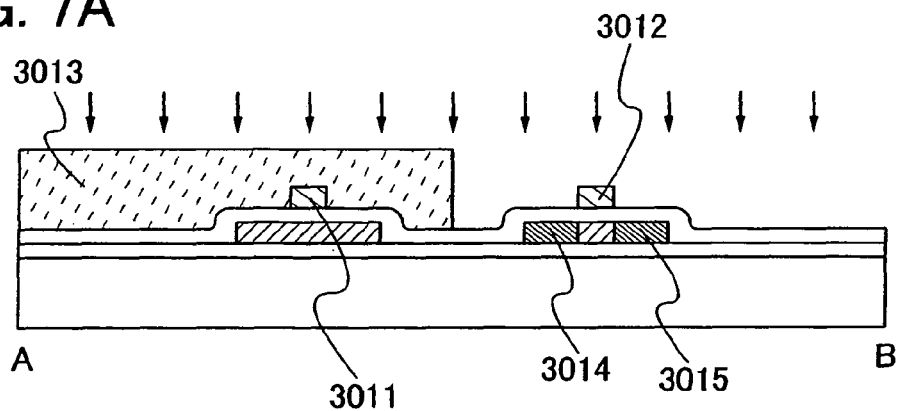
FIGS. 7A to 7D are explanatory views of a semiconductor device (a CMOS transistor) using a laser irradiation apparatus of the present invention, and a manufacturing method thereof.
Figure 7B:
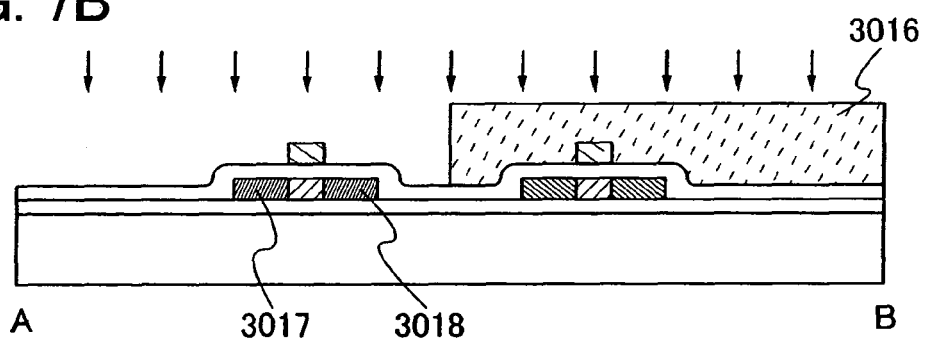

After that, as shown in FIG. 7A, arsenic (As) or phosphorus (P) which is an impurity imparting n-type conductivity is introduced by using the resist which is used when the gate electrode 3011 or the gate electrode 3012 is formed as a mask, and covering a portion where a p-channel TFT is to be formed, with a resist 3013. By this operation, a source region 3014 and a drain region 3015 are formed. Similarly, a source region 3017 and a drain region 3018 are formed by covering a portion where an n-channel TFT is to be formed, with a resist 3016, and introducing boron (B) which is an impurity imparting p-type conductivity (FIG. 7B).

Figure 7C:
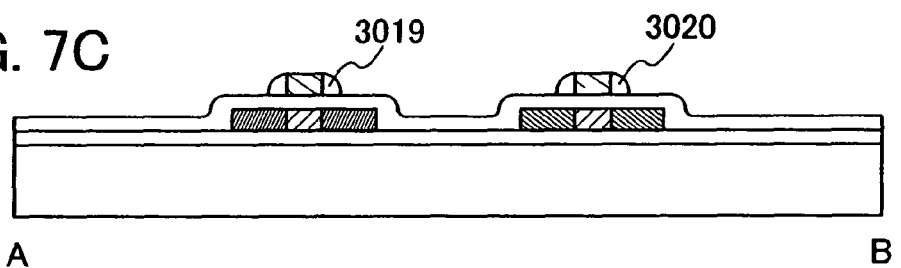

Then, sidewalls 3019 and 3020 are formed on the side walls of the gate electrodes 3011 and 3012. For example, an insulating film formed using silicon oxide is formed over the entire surface of the substrate by a CVD method. The sidewalls 3019 and 3020 may be formed by performing anisotropic etching with respect to the insulating film (FIG. 7C).

Figure 7D:
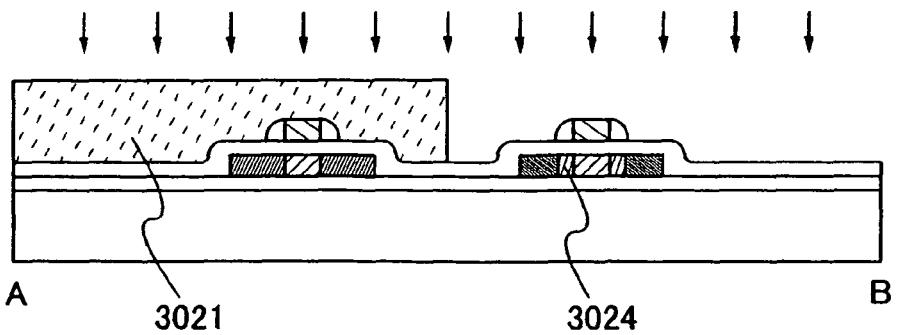
Figure 8A:
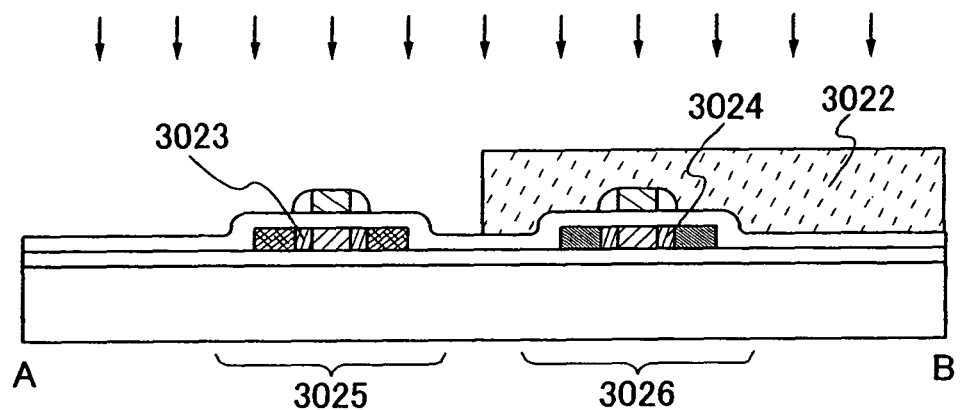
FIGS. 8A to 8C are explanatory views of a semiconductor device (a CMOS transistor) using a laser irradiation apparatus of the present invention, and a manufacturing method thereof.

Then, as shown in FIG. 7D, a portion to be the p-channel TFT is covered with a resist 3021 and ion showing n-type conductivity is introduced to form an LDD region 3024. It is to be noted that ion showing n-type conductivity is introduced at higher dose amount than the above step. Similarly, as shown in FIG. 8A, a portion to be the n-channel TFT is covered with a resist 3022 and ion showing p-type conductivity is introduced to form an LDD region 3023. Also in this step, ion showing p-type conductivity is introduced at higher dose amount than the above step.

After completing impurity introduction in the above-described manner, treatment is performed by laser annealing, lamp annealing, or furnace annealing to activate an introduced impurity and to recover damage of crystal lattice due to impurity introduction. In a case of using laser annealing, a laser irradiation apparatus of the present invention can be used.

According to the above steps, a p-channel TFT 3025 and an n-channel TFT 3026 can be formed over the same substrate.

Figure 8B:
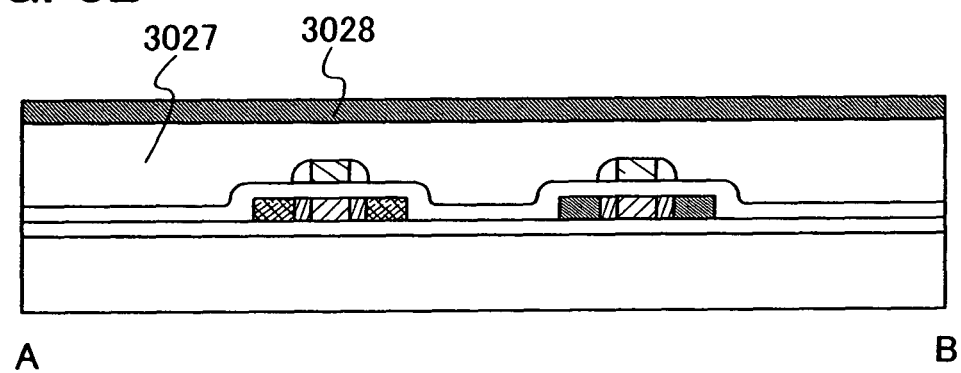

Subsequently, as shown in FIG. 8B, an insulating film 3027 is formed as a protective film of those TFTs. This insulating film 3027 is formed in a single-layer or a stacked-layer structure of a silicon nitride film or a silicon nitride film containing oxygen to have a thickness of 100 to 200 nm by a plasma CVD method or a sputtering method. In a case of combining a silicon nitride film containing oxygen and a silicon oxide film containing nitrogen, these films can be formed continuously by switching gas. In this embodiment, a silicon oxide film containing nitrogen is formed to have a thickness of 100 nm by a plasma CVD method. By providing the insulating film 3027, a blocking effect to block the intrusion of various ionic impurities and oxygen and moisture in the air can be obtained.

Next, an insulating film 3028 is further formed. Here, the insulating film 3028 can be formed by coating the surface of the insulating film 3027 with any of an organic resin film such as polyimide, polyamide, BCB (benzocyclobutene), acrylic, or siloxane (a substance in which a skeleton structure is formed by the bond of silicon and oxygen (siloxane bond) and which has a structure in which silicon is bonded with at least one of fluorine, aliphatic hydrocarbon, and aromatic hydrocarbon); an inorganic interlayer insulating film (an insulating film containing silicon such as silicon nitride or silicon oxide); and a low-k (low dielectric constant) material. Since the insulating film 3028 is formed mainly for the purpose of relaxing and flattening unevenness due to the TFTs formed over the glass substrate, a film being superior in flatness is preferable for the insulating film 3028.

Moreover, the gate insulating film 3010 and the insulating films 3027 and 3028 are patterned to have a desired shape by a photolithography method to form contact holes reaching the source regions 3014 and 3017 and the drain region 3015 and 3018.

Figure 8C:
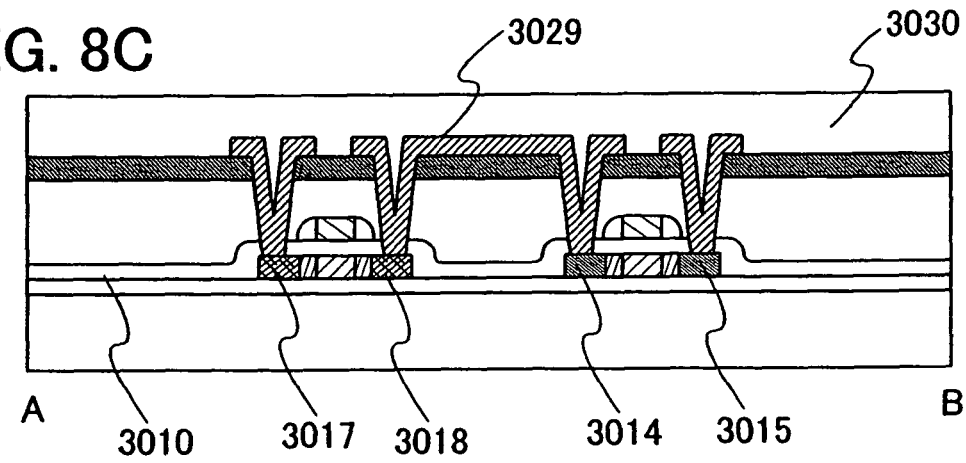

Next, a conductive film is formed using a conductive material, and a wiring 3029 is formed by patterning the conductive film to have a desired shape. After that, an insulating film 3030 is formed as a protective film, thereby completing a CMOS transistor shown in FIG. 8C.

The method for manufacturing the semiconductor device of the present invention is not limited to the above-described manufacturing process. This embodiment shows a process of manufacturing a CMOS transistor. However, the present invention can be used in the case of forming an n-channel TFT or a p-channel TFT, or the case of concurrently forming both of them over the substrate. Although a staggered TFT is manufactured in this embodiment, the present invention is not limited to this and can be used in the case of manufacturing an inversely staggered TFT.

Before the crystallization by laser beam, a crystallization step using a catalytic element may be provided. As the catalytic element, an element such as nickel (Ni), germanium (Ge), iron (Fe), palladium (Pd), tin (Sn), lead (Pb), cobalt (Co), platinum (Pt), copper (Cu), or gold (Au) can be used. It is to be noted that the crystallization may be performed in such a way that the heat treatment is performed after the catalytic element is added in order to promote the crystallization. Alternatively, a step of the heat treatment may be omitted. Further, after the heat treatment, the laser treatment may be performed while keeping the temperature. A laser irradiation apparatus of the present invention can be used through these steps.

The method for manufacturing the semiconductor device using the present invention can be used for a method for manufacturing an integrated circuit or a semiconductor display device.

This embodiment can be freely combined with the embodiment mode or other embodiments.

Embodiment 4

In this embodiment, a light emitting device using a light emitting element and a method for manufacturing the light emitting device will be explained as an example, in which a semiconductor device is manufactured using as a material a semiconductor film crystallized by the method shown in the embodiment mode or other embodiments using a laser irradiation apparatus of the present invention. A light emitting device to be explained in this embodiment has a structure in which light is extracted from the side of an opposite substrate (referred to as an opposing substrate, a sealing substrate, or the like) to a substrate having an insulating surface. However, the present invention is not limited to the structure, and can be similarly used for a light emitting device having a structure in which light is extracted from the side of a substrate having an insulating surface or a light emitting device having a structure in which light is extracted from both sides of a substrate having an insulating surface and an opposing substrate.

Figure 9:
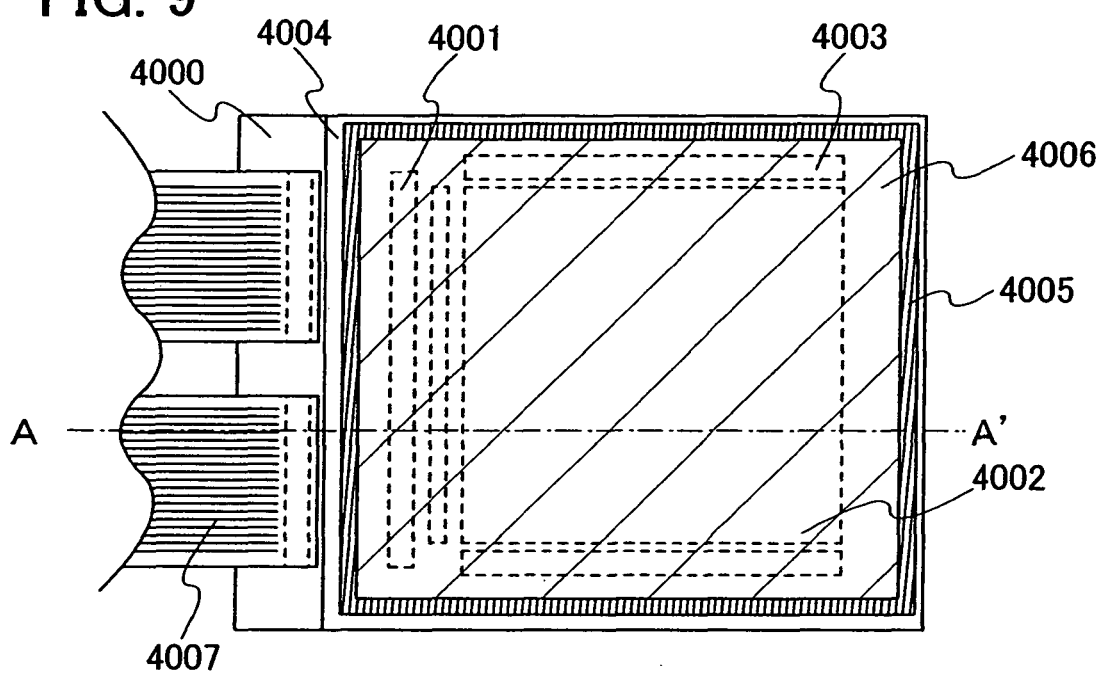
FIG. 9 is an explanatory view of a semiconductor device (a light emitting device) using a laser irradiation apparatus of the present invention.
Figure 10:
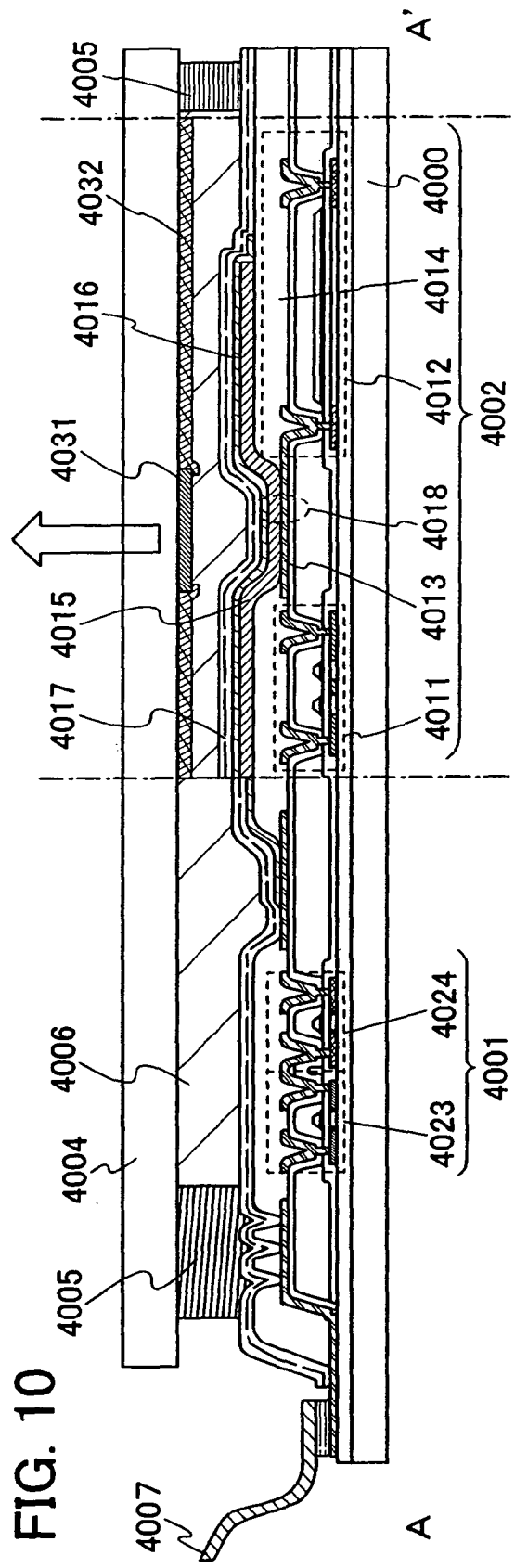
FIG. 10 is an explanatory view of a semiconductor device (a light emitting device) using a laser irradiation apparatus of the present invention.

FIG. 9 is a top view of a light emitting device and FIG. 10 is a cross-sectional view taken along line A-A' of FIG. 9. Reference numeral 4000 denotes a substrate. Reference numeral 4001 denotes a source signal line driver circuit; 4002, a pixel portion; and 4003, a gate signal line driver circuit, all of which are illustrated with a dotted line. Moreover, reference numeral 4004 denotes a transparent sealing substrate; and 4005, a first sealing material. The inside surrounded by the first sealing material 4005 is filled with a second sealing material 4006 which is transparent. The first sealing material 4005 contains a gap material for keeping an interval between the substrates.

A video signal or a clock signal is sent through an FPC (flexible printed circuit) 4007 to be an external input terminal. The signal passes through a wiring over the substrate 4000 to be inputted to the source signal line driver circuit 4001 and the gate signal line driver circuit 4003. Although only the FPC 4007 is illustrated here, this FPC 4007 may have a printed wiring board (PWB) attached thereto.

Next, the cross-sectional structure will be explained with reference to FIG. 10. Although a driver circuit and a pixel portion are formed over the substrate 4000, the source signal line driver circuit 4001 and the pixel portion 4002 are shown here as the driver circuit.

In the source signal line driver circuit 4001, a CMOS circuit is formed by combining an n-channel TFT 4023 and a p-channel TFT 4024 with each other. Moreover, TFTs for forming the driver circuit may be formed using a known CMOS circuit, PMOS circuit, or NMOS circuit. Although this embodiment shows a driver-integrated type in which the driver circuit is formed over the substrate, the present invention is not limited to this. For example, the driver circuit may be formed outside the substrate, not over the substrate. Moreover, the structure of the TFT using a poly-silicon film as an active layer is not limited in particular, and both of a top-gate TFT and a bottom-gate TFT are applicable.

Moreover, the pixel portion 4002 is formed using a plurality of pixels each including a switching TFT 4011, a current control TFT 4012, and a first electrode (anode) 4013 which is electrically connected to a drain of the current control TFT 4012. The current control TFT 4012 may be either an n-channel TFT or a p-channel TFT. However, the current control TFT 4012 is preferably a p-channel TFT in the case of being connected to the anode. Moreover, a storage capacitor (not shown) is preferably provided as appropriate. Here, only the cross-sectional structure of one pixel among an infinite number of pixels disposed is shown and two TFTs are used in the one pixel; however, three or more TFTs may be appropriately used.

Since the first electrode (anode) 4013 is in direct contact with a drain of the TFT here, it is desirable that a lower layer of the first electrode (anode) 4013 be a material layer making an ohmic contact with the drain formed using silicon, and an uppermost layer to be in contact with a layer containing an organic compound be a material layer having a high work function. The first electrode (anode) desirably has a work function of greater than or equal to 4.0 eV. For example, when the first electrode is formed in a three-layer structure of a titanium nitride film, a film containing aluminum as its main component, and a titanium nitride film, the resistance as a wiring can be made to be low, favorable ohmic contact can be made, and the first electrode can function as an anode. Moreover, the first electrode (anode) 4013 may be formed in a single-layer structure of indium tin oxide (hereinafter, referred to as ITO), indium tin oxide including silicon oxide (hereinafter, referred to as ITSO), gold (Au), platinum (Pt), nickel (Ni), tungsten (W), chromium (Cr), molybdenum (Mo), iron (Fe), cobalt (Co), copper (Cu), palladium (Pd), or zinc (Zn), or nitride of a metal material (titanium nitride or the like). Alternatively, the first electrode may be formed by stacking three or more layers.

Moreover, an insulator (also referred to as a bank, a partition wall, a barrier wall, an embankment, or the like) 4014 is formed at opposite ends of the first electrode (anode) 4013. The insulator 4014 may be formed using an organic resin film or an insulating film containing silicon. Here, an insulator having a shape shown in FIG. 10 is formed as the insulator 4014 by using a positive photosensitive acrylic resin film.

In order to perform subsequent film formation favorably, the insulator 4014 is made to have a curved surface having a curvature at its upper edge portion or lower edge portion. For example, in the case of using a positive photosensitive acrylic as a material for the insulator 4014, it is preferable that only the upper edge portion of the insulator 4014 have a curved surface having a radius of curvature (0.2 to 3 µm). Moreover, as the insulator 4014, either a negative type which becomes insoluble in etchant by photosensitive light or a positive type which becomes soluble in etchant by light can be used.

The insulator 4014 may be covered with an aluminum nitride film, an aluminum nitride oxide film, a thin film containing carbon as its main component, or a protective film formed using a silicon nitride film.

Next, an electroluminescent layer 4015 is formed. As a material for forming the electroluminescent layer 4015, a low molecular material, a high molecular material, and an intermediate molecular material having an intermediate property between the high molecular material and the low molecular material are given. In this embodiment, since the electroluminescent layer 4015 is formed by an evaporation method, the low molecular material is used. Both of the low molecular material and the high molecular material can be applied together with a solvent by a spin coating method or an ink-jet method when the material is dissolved in the solvent. Further, not only an organic material but also a composite material including an organic material and an inorganic material can be used.

Moreover, the electroluminescent layer 4015 is selectively formed over the first electrode (anode) 4013. For example, the evaporation is performed in a deposition chamber which is evacuated to the degree of vacuum of 0.7 Pa or less, preferably $1.3 \times 10^{-2}$ to $1.3 \times 10^{-4}$ Pa. At the evaporation, the organic compound is vaporized in advance by being heated, and the vaporized organic compound is evaporated to form the electroluminescent layer 4015 (including a hole injecting layer, a hole transporting layer, a light emitting layer, an electron transporting layer, and an electron injecting layer from the first electrode side). Instead of such a stacked-layer structure, the electroluminescent layer 4015 may have a single-layer structure or a mixed-layer structure. Moreover, a second electrode (cathode) 4016 is formed over the electroluminescent layer 4015.

As the second electrode 4016 (cathode), it is preferable to use metal, alloy, an electrically conductive compound, a mixture of these, or the like each having a low work function (an appropriate indication is a work function of 3.8 eV or less). Specifically, the second electrode 4016 (cathode) can be formed using an element belonging to Group 1 or Group 2 in the periodic table, namely alkali metal such as Li, Rb, or Cs or an alkaline earth metal such as Mg, Ca or Sr; alloy including these (Mg:Ag or Al:Li); a compound (LiF, CsF, or $CaF_2$); or transition metal including a rare-earth metal (such as Yb). However, in order to give the second electrode (cathode) a light-transmitting property in this embodiment, the second electrode is formed by forming these metals or the alloy including these metals extremely thinly and by stacking together with ITO, IZO, ITSO, or another metal (including alloy).

Here, the second electrode (cathode) 4016 is formed using a stacked layer of a thin metal film with a thin thickness having a low work function and a transparent conductive film (such as ITO, IZO, or ZnO) so that the emitted light passes through the second electrode 4016. In this way, an electroluminescent element 4018 including the first electrode (anode) 4013, the electroluminescent layer 4015, and the second electrode (cathode) 4016 is formed.

In this embodiment, the electroluminescent layer 4015 is formed in the following manner: a hole injecting layer is formed in 20 nm thick using copper phthalocyanine (abbreviation: Cu-Pc) as a material; a first light emitting layer having a hole transporting property, in 30 nm thick using α-NPD as a material; a second light emitting layer, in 20 nm thick using a substance in which Pt(ppy)acac is added with 15 wt % into CBP (4,4'-N,N'-dicarbazol-biphenyl); and an electron transport layer, in 30 nm thick using BCP (2,9-dimethyl-4,7-diphenyl-1,10-phenanthrolin) as a material. Since a thin metal film having a low work function is used as the second electrode (cathode) 4016, an electron injecting layer (calcium fluoride) is unnecessary here.

The electroluminescent element 4018 formed thus exhibits white emission. In order to achieve full color, a color filter including a colored layer 4031 and a light shielding layer (also referred to as BM) 4032 (an overcoat layer is not shown here for simplicity) is provided.

Moreover, a transparent protective layer 4017 is formed to seal the electroluminescent element 4018. The transparent protective layer 4017 is formed using a stacked layer of a first inorganic insulating film, a stress relaxing film, and a second inorganic insulating film. The first inorganic insulating film and the second inorganic insulating film can be formed using a silicon nitride film, a silicon oxide film, a silicon nitride film containing oxygen, a silicon oxide film containing nitrogen, or a thin film containing carbon as its main component (for example, a diamond like carbon (DLC) film or a carbon nitride (CN) film) formed by a sputtering method or a CVD method. These inorganic insulating films have a high blocking effect against moisture; however, the inorganic insulating films are easier to be peeled as the film becomes thicker because the film stress increases.

However, when the stress relaxing film is interposed between the first inorganic insulating film and the second inorganic insulating film, moisture can be absorbed as well as the stress can be relaxed. Even through a microscopic hole (such as a pinhole) is formed in the first inorganic insulating film from any cause during forming the film, the stress relaxing film can cover the hole, and an extremely high blocking effect can be obtained against moisture or oxygen by providing the second inorganic insulating film thereover.

The stress relaxing film is preferably formed using a moisture-absorbing material which has smaller stress than the inorganic insulating film. Moreover, the stress relaxing film desirably has a light-transmitting property. Further, a material film containing an organic compound such as α-NPD, BCP, MTDATA, Alq$_3$, or the like may be used as the stress relaxing film. These material films have a moisture-absorbing property and are almost transparent if the films are thin. Moreover, since MgO, SrO$_2$, and SrO have a moisture-absorbing property and a light-transmitting property and can be formed into a thin film by an evaporation method, these materials can be used for the stress relaxing film.

In this embodiment, a film formed by using a silicon target in an atmosphere containing nitrogen and argon, that is, a silicon nitride film having a high blocking effect against impurities such as moisture and alkali metal is used as the first inorganic insulating film or the second inorganic insulating film, and a thin film of Alq$_3$ by an evaporation method is used as the stress relaxing film. The total thickness of the transparent protective stacked layer is preferably made as small as possible to make the emitted light pass through the transparent protective stacked layer.

Further, the sealing substrate 4004 is attached with the use of the first sealing material 4005 and the second sealing material 4006 to seal the electroluminescent element 4018 in an inert gas atmosphere. It is preferable to use an epoxy-based resin as the first sealing material 4005 and the second sealing material 4006. Further, the first sealing material 4005 and the second sealing material 4006 are desirably materials which do not transmit moisture or oxygen as much as possible.

In this embodiment, the sealing substrate 4004 may be a glass substrate, a quartz substrate, or a plastic substrate formed using FRP (Fiberglass-Reinforced Plastics), PVF (polyvinyl fluoride), polyester, acrylic, or the like. Moreover, it is possible to seal with a third sealing material so as to cover a side surface (exposed surface) after adhering the sealing substrate 4004 with the first sealing material 4005 and the second sealing material 4006.

In this way, the electroluminescent element 4018 is sealed with the first sealing material 4005 and the second sealing material 4006, whereby the electroluminescent element 4018 can be completely shielded from outside and the intrusion of a substance promoting deterioration of the electroluminescent layer 4015 such as moisture or oxygen from outside can be prevented. Therefore, a light emitting device with high reliability can be obtained.

Further, a light emitting device can be manufactured, in which light can be obtained from both sides of a substrate and a sealing substrate, using a transparent conductive film as the first electrode (anode) 4013.

This embodiment can be freely combined with the embodiment mode or other embodiments. Moreover, not only the display device using the light emitting element but also a display device using a liquid crystal can be manufactured by using a semiconductor film crystallized by the present invention.

In this embodiment, as a light emitting device which emits light by flowing current, an example is shown, in which an organic substance is used for the light emitting layer of the electroluminescent layer 4015. However, a light emitting device using an inorganic substance such as zinc sulfide (ZnS) or strontium sulfide (SrS) for the light emitting layer can be similarly manufactured.

Embodiment 5

In this embodiment, a liquid crystal display device will be explained with reference to the drawings, as an example of a semiconductor device manufactured using, as a material, a semiconductor film crystallized using a laser irradiation apparatus of the present invention. In this embodiment, an example will be shown, in which a pixel portion, a driver circuit, and a terminal portion are formed over the same substrate. However, the present invention is not limited thereto. A pixel portion and a driver circuit are formed over the same substrate, and a terminal portion is separately formed to be connected by a wiring in a later step.

Figure 11:
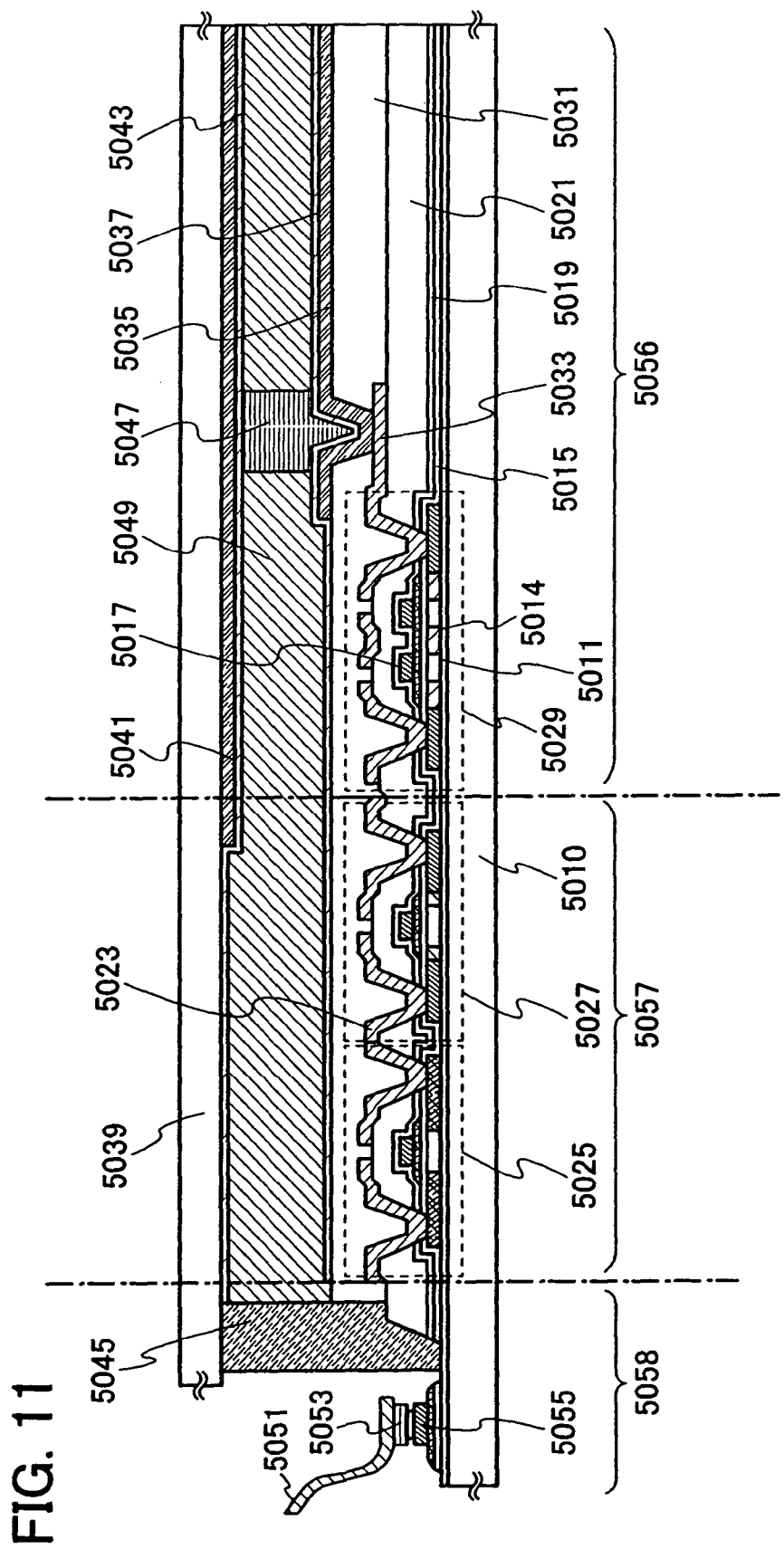
FIG. 11 is an explanatory view of a semiconductor device (a liquid crystal display device) using a laser irradiation apparatus of the present invention.

In FIG. 11, a base insulating film 5011 is formed over a substrate 5010. A glass substrate or a quartz substrate having a light-transmitting property may be used as the substrate 5010. Alternatively, a light-transmissive plastic substrate having heat resistance which can withstand a processing temperature may also be used. In a case of a reflective liquid crystal display device, a silicon substrate, a metal substrate, or a stainless steel substrate having a surface provided with an insulating film may be used beside the above substrate. Here, a glass substrate is used as the substrate 5010.

As the base insulating film 5011, an insulating film such as a silicon oxide film, a silicon nitride film, or a silicon oxynitride film is formed. Although an example in which the base insulating film 5011 is a single layer is shown here, the base insulating film 5011 may be a stacked layer of two or more insulating films. Note that the base insulating film 5011 is not necessarily formed if unevenness of the substrate or impurity diffusion from the substrate does not lead a problem.

The surface of the glass substrate may be directly processed by high density plasma with an electron temperature of less than or equal to 2 eV, an ion energy of less than or equal to 5 eV, and an electron density of approximately $10^{11}$ to $10^{13}/cm^3$, which is excited by a microwave. Plasma can be generated by a plasma processing apparatus utilizing microwave excitation, which employs a radial slot antenna. At this time, the surface of the glass substrate can be nitrided by introducing a nitride gas such as nitrogen ($N_2$), ammonia ($NH_3$), or nitrous oxide ($N_2O$). Since a nitride layer formed over the surface of the glass substrate contains silicon nitride as its main component, the nitride layer can be used as a blocking layer of an impurity diffused from the glass substrate side. A silicon oxide film or a silicon oxynitride film may be formed over the nitride layer by a plasma CVD method to serve as the base insulating film 5011.

Subsequently, an island-like semiconductor film is formed over the base insulating film 5011 in the following manner. First, an amorphous semiconductor film is formed by a sputtering method, an LPCVD method, a plasma CVD method, or the like. By using a plasma CVD method, the base insulating film 5011 and an amorphous semiconductor film can be continuously stacked without being exposed to an atmospheric air. The amorphous semiconductor film is formed to have a thickness of 25 to 80 nm (preferably 30 to 70 nm). Although a material for a crystalline semiconductor film is not particularly limited, it is preferable to form the amorphous semiconductor film by using silicon or a silicon germanium (SiGe) alloy.

The amorphous semiconductor film is shaped into a desired shape by a photolithography technique to form the island-like semiconductor film. Thereafter, the island-like semiconductor film is irradiated with a laser beam using a laser irradiation apparatus of the present invention, thereby obtaining a crystalline semiconductor film 5014. As a laser, the laser described in the embodiment mode or other embodiments can be used.

By using the laser irradiation apparatus of the present invention, various effects can be obtained. For example, divergence of a beam diameter of the laser beam and short-term fluctuation of an optical axis can be corrected by a transfer lens. Therefore, a laser beam can be propagated without being hit on an inner wall of a pipe, and accordingly, a semiconductor film can be irradiated with the energy of the laser beam kept, which is emitted from the laser irradiation apparatus. Further, even if a space is small, irradiation with a laser beam is possible as long as a place to dispose a beam propagator is secured. Therefore, irradiation with a laser beam, which is greater in quantity than a conventional one, can be performed at one time, whereby efficiency in laser irradiation treatment is significantly improved. In a case of using a large-sized substrate having a side more than one meter, there is a great effect in that a semiconductor film can be irradiated with several to several tens of laser beams at one time at the same time.

Since setting such as optical axis alignment becomes the minimum necessary, time for setting is drastically reduced. Setting is performed only by rotating a joint of a pipe, whereby setting can be performed safely and easily without contact with a laser beam or without deviation of an optical axis on contact with another optical system. Further, a propagating distance of a laser beam is not changed even when a position of a pipe is changed; therefore, setting of an optical system such as a condensing lens is not necessary to be changed. Accordingly, uniform laser irradiation treatment is possible, thereby generating no variation in processing state of an object to be irradiated.

If necessary, the crystalline semiconductor film 5014 formed by laser irradiation treatment is doped with a minute amount of an impurity element (boron or phosphorus) to control a threshold voltage of a TFT. For example, an ion doping method in which diborane ($B_2H_6$) is not mass-separated but plasma-excited can be used.

Next, the surface of the crystalline semiconductor film 5014 is washed concurrently with removing an oxide film over the surface of the semiconductor film with etchant containing hydrofluoric acid. Then, a gate insulating film 5015 covering the crystalline semiconductor film 5014 is formed. The gate insulating film 5015 is formed to have a thickness of 1 to 200 nm by a plasma CVD method or a sputtering method. The gate insulating film 5015 is formed in a single-layer or stacked-layer structure of an insulating film containing silicon, which is preferably as thin as 10 to 50 nm, and then surface nitriding treatment using plasma by a microwave is performed.

Before forming the gate insulating film 5015, the surface of the crystalline semiconductor film 5014 may be processed by high density plasma treatment with an electron temperature of less than or equal to 2 eV, an ion energy of less than or equal to eV, and an electron density of approximately $10^{11}$ to $10^{13}/cm^3$, which is excited by a microwave; thereby being oxidized or nitrided to be densified. At this time, by performing the treatment with a substrate temperature of 300 to 450° C. in an oxygen atmosphere ($O_2$, $N_2O$, or the like) or a nitrogen atmosphere ($N_2$, $NH_3$, or the like), a favorable interface with the gate insulating film 5015 which is stacked thereover can be formed.

Subsequently, a first conductive film having a thickness of 20 to 100 nm and a second conductive film having a thickness of 100 to 400 nm are stacked over the gate insulating film 5015. In this embodiment, a tantalum nitride film having a thickness of 50 nm and a tungsten film having a thickness of 370 nm are sequentially stacked over the gate insulating film 5015 and shaped into a desired shape to form a gate electrode 5017. In this embodiment, the gate electrode 5017 is formed using a photomask or a reticle.

Although the gate electrode 5017 is a stacked layer of the tantalum nitride (TaN) film and the tungsten (W) film in this embodiment. Specifically, the gate electrode 5017 may be a stacked layer of an element selected from Ta, W, Ti, Mo, Al, and Cu, or an alloy material or a compound material thereof containing the element as its main component, without being particularly limited. In addition, a semiconductor film which is represented by a polycrystalline silicon film doped with an impurity element such as phosphorus may be used. In addition, the gate electrode 5017 is not limited to a two-layer structure, and for example, a three-layer structure may also be used, in which a tungsten film having a thickness of 50 nm, an alloy film of aluminum and silicon (Al—Si) having a thickness of 500 nm, and a titanium nitride film having a thickness of 30 nm are sequentially stacked.

It is preferable to use an ICP (inductively coupled plasma) etching method for etching the first conductive film and the second conductive film (first etching treatment and second etching treatment). The films can be etched into a desired tapered shape by appropriately adjusting the etching condition (the amount of power applied to a coil-shaped electrode, the amount of power applied to an electrode on the substrate side, the electrode temperature on the substrate side, or the like).

Next, in order to add an impurity element imparting n-type conductivity to the crystalline semiconductor film 5014, first doping treatment, in which doping is performed over the entire surface by using the gate electrode 5017 as a mask, is performed. The first ion doping treatment may be performed by an ion doping method or an ion implantation method. An ion doping method is performed under the condition where the dose amount is $1.5 \times 10^{13}$ atoms/cm$^2$ and an acceleration voltage is 50 to 100 kV. As an impurity element imparting n-type conductivity, phosphorus (P) or arsenic (As) is typically used.

Next, after forming a resist mask, a second doping step for adding an impurity element imparting n-type conductivity to the crystalline semiconductor film 5014 in a high concentration is performed. The mask is provided in order to protect a channel formation region of a semiconductor layer forming a p-channel TFT of a pixel portion; a peripheral region thereof; part of an n-channel TFT of the pixel portion; a channel formation region of a semiconductor layer forming a p-channel TFT of a driver circuit portion; and a peripheral region thereof. The second doping step is performed by an ion doping method under the condition where the dose amount is $1 \times 10^{13}$ to $5 \times 10^{15}$/cm$^2$ and an acceleration voltage is 60 to 100 kV.

Then, a third doping step for adding an impurity element imparting p-type conductivity (typically, boron) to the crystalline semiconductor layer 5014 in a high concentration is performed. The mask is provided to protect a channel formation region of a semiconductor layer forming an n-channel TFT of the pixel portion; a peripheral region thereof; a channel formation region of a semiconductor layer forming an n-channel TFT of the driver circuit portion; and a peripheral region thereof.

Through the above steps, an impurity region having n-type or p-type conductivity is formed in each crystalline semiconductor film 5014.

Next, an insulating film 5019 containing hydrogen is formed by a sputtering method, an LPCVD method, a plasma CVD method, or the like. The insulating film 5019 is formed using silicon nitride or silicon oxynitride. The insulating film 5019 serves as a protective film which prevents contamination of the semiconductor layer. After stacking the insulating film 5019, the insulating film 5019 may be hydrogenated by introducing a hydrogen gas and performing high density plasma treatment which is excited by a microwave as described above. Alternatively, the insulating film 5019 may be nitrided and hydrogenated by introducing an ammonia gas. Further alternatively, oxynitride treatment and hydrogen treatment may be performed on the insulating film 5019 by introducing oxygen, an NO$_2$ gas, and a hydrogen gas. By this method, the surface of the insulating film 5019 can be densified by performing nitriding treatment, oxidizing treatment, or oxynitriding treatment. Accordingly, the function as the protective film can be enhanced. Thereafter, the hydrogen introduced in the insulating film 5019 can be discharged from the silicon nitride which forms the insulating film 5019, by performing heat treatment at a temperature of 400 to 450° C.; thus, a semiconductor film 5013 can be hydrogenated.

Then, a first interlayer insulating film 5021 is formed by a sputtering method, an LPCVD method, a plasma CVD method, or the like. The first interlayer insulating film 5021 is formed using a single layer or a stacked layer of an insulating film such as a silicon oxide film, a silicon nitride film, or a silicon oxynitride film. The first interlayer insulating film 5021 is formed to have a thickness of 600 to 800 nm. Then, a resist mask is formed using a photomask, the first interlayer insulating film 5021 is selectively etched, and a contact hole is formed. Thereafter, the resist mask is removed.

After stacking a metal film by a sputtering method, a resist mask is formed using a photomask, the metal stacked film is selectively etched, thereby forming an electrode 5023 serving as a source electrode or drain electrode of a TFT. Further, the metal stacked film is continuously formed in the same metal sputtering apparatus. Then the resist mask is removed.

Through the above steps, top-gate TFTs 5025, 5027, and 5029, each of which uses a polysilicon film as an active layer, can be manufactured over the same substrate.

Note that the TFT 5029 disposed in the pixel portion is an n-channel TFT having a plurality of channel formation regions in one TFT. The TFT 5029 is a multi-gate TFT.

In addition, the TFT 5027 disposed in the driver circuit portion is an n-channel TFT provided with a low concentration impurity region (also referred to as an LDD region) which overlaps with the gate electrode, and the TFT 5025 is a p-channel TFT. Both of the TFTs 5027 and 5025 are single gate TFTs. In the driver circuit portion, a CMOS circuit is formed by complementarily connecting the TFT 5027 to the TFT 5025, and various types of circuits can be realized. Moreover, if necessary, the TFTs 5025 and 5027 can be multi-gate TFTs.

A second interlayer insulating film 5031 is formed using an organic resin insulating material such as polyimide or an acrylic resin by a spin coating method. The second interlayer insulating film 5031 serves as a flattening film so that its surface is not affected by the unevenness of the surface of the base.

A contact hole, which exposes a wiring 5033 connected to the n-channel TFT 5029 placed in the lower layer, is formed in the second interlayer insulating film 5031, and a pixel electrode 5035 is formed. As the pixel electrode 5035, a transparent conductive film formed using a conductive material having a light-transmitting property may be used, and indium oxide containing tungsten oxide; indium zinc oxide containing tungsten oxide; indium oxide containing titanium oxide; indium tin oxide containing titanium oxide; or the like can be used. It is needless to say that indium tin oxide (ITO), indium zinc oxide (IZO), indium tin oxide to which silicon oxide (ITSO) is added, or the like can also be used.

An example of a composition ratio of the conductive material having a light-transmitting property will be described. As an example of the composition ratio of indium oxide containing tungsten oxide, tungsten oxide may be 1.0 wt % and indium oxide may be 99.0 wt %. As an example of the composition ratio of indium zinc oxide containing tungsten oxide, tungsten oxide may be 1.0 wt %, zinc oxide may be 0.5 wt %, and indium oxide may be 98.5 wt %. As an example of the composition ratio of indium oxide containing titanium oxide, titanium oxide may be 1.0 to 5.0 wt % and indium oxide may be 99.0 to 95.0 wt %. As an example of the composition ratio of indium tin oxide (ITO), tin oxide may be 10.0 wt % and indium oxide may be 90.0 wt %. As an example of the composition ratio of indium zinc oxide (IZO), zinc oxide may be 10.7 wt % and indium oxide may be 89.3 wt %. As an example of the composition ratio of indium tin oxide containing titanium oxide, titanium oxide may be 5.0 wt %, tin oxide may be 10.0 wt %, and indium oxide may be 85.0 wt %. The above composition ratios are examples, and the proportion of the composition ratio may be appropriately set.

An orientation film 5037 is formed over the pixel electrode 5035. In the same manner, an opposing electrode 5041 and an orientation film 5043 which are both formed using a transparent conductive film formed using a conductive material having a light-transmitting property are formed over an opposing substrate 5039.

Then, the substrate 5010 and the opposing substrate 5039 are fixed to each other having a space therebetween by a sealing material 5045. The space between the substrates is held by a spacer 5047. A liquid crystal layer 5049 is formed between the substrate 5010 and the opposing substrate 5039. The liquid crystal layer 5049 may be formed by a dropping method before fixing the opposing substrate 5039.

Finally, an FPC 5051 is attached to a terminal electrode 5055 with an anisotropic conductive film 5053 by a known method (refer to FIG. 11). Further, the terminal electrode 5055 can be obtained in the same process where the gate electrode 5017 is obtained.

Through the above steps, a pixel portion 5056, a driver circuit portion 5057, and a terminal portion 5058 can be formed over the same substrate. This embodiment can be freely combined with the embodiment mode and other embodiments.

Embodiment 6

In this embodiment, as an example of a semiconductor device manufactured using, as a material, a semiconductor film crystallized using a laser irradiation apparatus of the present invention, a photo IC and a method for manufacturing the photo IC will be explained with reference to the drawings.

Figure 12A:
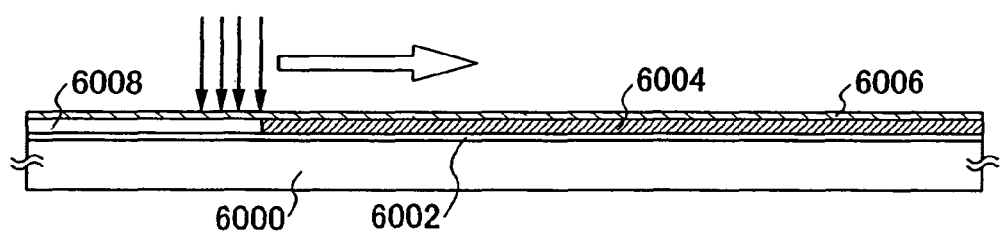
FIGS. 12A to 12C are explanatory views of a semiconductor device (a photo IC) using a laser irradiation apparatus of the present invention, and a manufacturing method thereof.

In FIG. 12A, an element is formed over a substrate (a first substrate) 6000. In this embodiment, AN 100 (manufactured by Asahi Glass CO., LTD), which is one of glass substrates, is used as the substrate 6000.

Subsequently, a silicon oxide film containing nitrogen (with a thickness of 100 nm) to be a base insulating film 6002 is formed by a plasma CVD method, and an amorphous semiconductor film 6004 having a thickness of greater than or equal to 20 nm and less than or equal to 150 nm, preferably greater than or equal to 30 nm and less than or equal to 80 nm, is stacked without being exposed to an atmospheric air. In this embodiment, an amorphous silicon film containing hydrogen is formed as the amorphous semiconductor film 6004. A detailed method will be explained below.

Further, the base insulating film 6002 may be formed by stacking a silicon oxide film, a silicon nitride film, and a silicon oxide film containing nitrogen. For example, a film in which a silicon nitride film containing oxygen with a thickness of 50 nm and a silicon oxide film containing nitrogen with a thickness of 100 nm are stacked may be formed as the base insulating film 6002. The silicon oxide film containing nitrogen and the silicon nitride film serve as a blocking layer which prevents an impurity such as alkali metal from diffusing from the glass substrate.

Then, the amorphous semiconductor film 6004 is crystallized by a laser irradiation apparatus of the present invention to form, for example, a polycrystalline silicon film 6008, as one type of a semiconductor film having a crystalline structure (a crystalline semiconductor film). The specific method will be shown as follows.

In this embodiment, a polycrystalline silicon film 6008 is formed by a crystallization method using a catalytic element. Part of or the entire surface of the amorphous semiconductor film 6004 is coated with a solution containing nickel of 10 to 100 ppm by weight, for example a solution of nickel acetate, by a spinner. It is to be noted that a nickel element may be dispersed over the entire surface by a sputtering method instead of the above method. In substitution for the above method, a method for dispersing a nickel element over the entire surface by a sputtering method may be employed. Alternatively, nickel may be added by an evaporation method, plasma treatment, or the like. A catalytic element which can be used here is not limited to nickel, and germanium, iron, palladium, tin, lead, cobalt, platinum, copper, gold, or the like can be used. FIG. 12A shows a catalyst 6006 which is made to be in contact with the surface of the amorphous semiconductor film 6004 in such a manner.

In crystallizing the amorphous semiconductor film 6004, in order to control a growth direction of a crystal to a perpendicular direction (longitudinal direction) to the surface of the substrate 6000, the entire surface of the semiconductor film may be coated with a solution containing a catalytic element. In order to control the growth direction of a crystal in a direction parallel to the surface of the substrate 6000, the surface of part of the amorphous semiconductor film 6004 may be coated with the solution containing a catalytic element.

Then, heat treatment is performed for crystallization to form a semiconductor film having a crystalline structure (here, the polycrystalline silicon film 6008). Here, heat treatment for crystallization (at 550° C. for 4 hours) is performed after performing heat treatment (at 500° C. for one hour). The amorphous semiconductor film 6004 and the catalytic element are reacted with each other by the heat treatment of the former, thereby forming a compound over a surface on which the catalytic element and the amorphous semiconductor film 6004 are in contact with each other. In this embodiment, silicide is formed over the surface of the amorphous silicon film serving as the amorphous semiconductor film 6004.

In the heat treatment of the latter, crystal growth occurs using this compound as a core. A crystallization temperature is lowered and the crystallization takes shorter time due to the function of a metal element with catalytic action. The polycrystalline silicon film 6008 can be obtained by heat treatment of the former and the latter. By using the catalytic element, crystallinity is enhanced.

Next, an oxide film over the surface of the polycrystalline silicon film 6008 is removed by dilute hydrofluoric acid or the like. Thereafter, irradiation with a laser beam is performed using a laser irradiation apparatus of the present invention in order to raise a degree of crystallization and repair a defect left in a crystal grain.

In a case where a crystalline semiconductor film is obtained by crystallizing the amorphous semiconductor film 6004 by a laser crystallization method or a case where laser irradiation is performed to repair a defect left in a crystal grain after obtaining a semiconductor film having a crystalline structure, the laser irradiation apparatus of the present invention may be used. The following types of a laser beam can be used.

A continuous wave laser beam (CW laser beam) can be used for the laser irradiation. Types of the laser beam that can be used here are as follows: a laser using a laser crystal in which, as a dopant, one or more of Nd, Yb, Cr, Ti, Ho, Er, Tm, and Ta is added to a host crystal which is any one of single crystalline YAG, YVO$_4$, forsterite (Mg$_2$SiO$_4$), YAlO$_3$, or GdVO$_4$ and polycrystalline (ceramic) YAG, Y$_2$O$_3$, YVO$_4$, YAlO$_3$, or GdVO$_4$; an alexandrite laser; and a Ti:sapphire laser. A laser beam oscillated from one or more of the above laser beams can be selected to be used. By irradiation with a laser beam having a fundamental wave, a second harmonic, a third harmonic, or a fourth harmonic of the above-described laser beams, a crystal with a large grain size can be obtained. For example, a second harmonic (532 nm) or a third harmonic (355 nm) of a Nd:YVO$_4$ laser (fundamental wave: 1064 nm) can be used. In this case, energy density of approximately 0.01 to 100 MW/cm$^2$ (preferably, 0.1 to 10 MW/cm$^2$) is required for a laser. The scanning speed is set to be approximately 10 to 2000 cm/sec for the irradiation.

When ceramic (polycrystal) is used as a laser crystal, a laser crystal can be formed to have any shape for a short time and at low cost. When a single crystal is used, a columnar laser crystal with several mm in diameter and several tens of mm in length is usually used. In the case of using the ceramic, a laser crystal much larger can be formed.

The concentration of a dopant such as Nd or Yb in a laser crystal, which directly contributes to a light emission, cannot be changed largely in both cases of the single crystal and the polycrystal; therefore, there is a limitation to some extent in improvement in output of a laser by increasing the concentration. However, in the case of using the ceramic, the size of a laser crystal can be increased as compared with the single crystal; therefore, drastic improvement in output of a laser can be realized.

Further, in the case of using the ceramic, a laser crystal with an arbitrary shape can be easily formed. A laser crystal using the ceramic can be largely formed as compared with a single crystalline laser crystal; therefore, a longer oscillation light path can be obtained as compared with the case of using a single crystalline laser crystal. When the oscillation light path is long, amplitude is increased and a laser beam can be oscillated at high output. When a laser crystal with a parallel hexahedron shape or a rectangular parallelepiped shape is used, an oscillated light can be made to travel in a straight line inside the laser crystal or in a zigzag inside the laser crystal. A longer oscillation light path can be obtained in the latter than the former, whereby a laser beam can be oscillated at higher output. Further, a laser beam emitted from a laser crystal having such a shape has a quadrangular shape in cross section in the emission; therefore, as compared with a laser beam with a circular shape in cross section, the laser beam with a quadrangular shape in cross section has an advantage to be shaped into a linear beam. By shaping the laser beam emitted in the above described manner using an optical system, a linear beam having 1 mm or less in length of a short side and several mm to several m in length of a long side can be easily obtained. In addition, when a laser crystal is uniformly irradiated with excited light, a linear beam is emitted with uniform energy distribution in a long side direction.

By irradiation with the linear beam to the semiconductor film, the semiconductor film can be annealed further uniformly. In a case where uniform annealing is necessary from one end to the other end of the linear beam, slits may be provided for the opposite ends so as to shield a portion, where energy is attenuated, from light.

By using the laser irradiation apparatus of the present invention, various effects can be obtained. For example, divergence of a beam diameter of the laser beam and short-term fluctuation of an optical axis can be corrected by a transfer lens. Therefore, a laser beam can be propagated without being hit on an inner wall of a pipe, and accordingly, a semiconductor film can be irradiated with the energy of the laser beam kept, which is emitted from the laser irradiation apparatus. Further, even if a space is small, irradiation with a laser beam is possible as long as a place to dispose a beam propagator is secured. Therefore, irradiation with a laser beam, which is greater in quantity than a conventional one, can be performed at one time, whereby efficiency in laser irradiation treatment is significantly improved. In a case of using a large-sized substrate having a side more than one meter, there is a great effect in that a semiconductor film can be irradiated with several to several tens of laser beams at one time at the same time.

Since setting such as optical axis alignment becomes the minimum necessary, time for setting is drastically reduced. Setting is performed only by rotating a joint of a pipe, whereby setting can be performed safely and easily without contact with a laser beam or without deviation of an optical axis on contact with another optical system. Further, a propagating distance of a laser beam is not changed even when a position of a pipe is changed; therefore, setting of an optical system such as a condensing lens is not necessary to be changed. Accordingly, uniform laser irradiation treatment is possible, thereby generating no variation in processing state of an object to be irradiated.

In a case where laser irradiation is performed in an atmospheric air or an oxide atmosphere, an oxide film is formed over a surface of the semiconductor film by the laser irradiation.

Then, in addition to the oxide film formed over the polycrystalline silicon film 6008 by the laser beam irradiation, a barrier layer 6010 formed using an oxide film having a thickness of 1 to 5 nm in total is formed by treating a surface with ozone water for 120 seconds. The barrier layer is formed in order to remove a catalytic element, which is added for crystallization, such as nickel (Ni) from the film. Although the barrier layer is formed by using ozone water here, a barrier layer may also be formed by depositing an oxide film having a thickness of approximately 1 to 10 nm by a method for oxidizing a surface of a semiconductor film having a crystalline structure by UV-ray irradiation in an oxygen atmosphere; a method for oxidizing a surface of a semiconductor film having a crystalline structure by oxygen plasma treatment; a plasma CVD method, a sputtering method, an evaporation method, or the like. In addition, before forming the barrier layer 6010, the oxide film formed by laser beam irradiation may be removed.

Figure 12B:
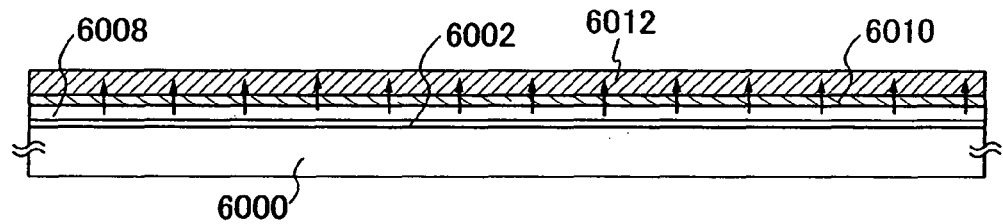

Subsequently, over the barrier layer 6010, an amorphous silicon film 6012 containing a rare gas element is formed to have a thickness of 10 nm to 400 nm, in this embodiment 100 nm, by a sputtering method to serve as a gettering site (FIG. 12B). In this embodiment, the amorphous silicon film 6012 is formed in an atmospheric air containing argon using a silicon target. When a plasma CVD method is used to form the amorphous silicon film containing an argon element, the film formation condition is as follows: a flow ratio between monosilane and argon ($SiH_4$:Ar) is set to be 1:99; film formation pressure is set to be 6.665 Pa; RF power density is set to be 0.087 W/cm$^2$; and a film formation temperature is set to be 350° C. It is desirable that the density of the amorphous silicon film 6012 which is formed here be lower than that of the polycrystalline silicon film 6008 in order to increase etching selectivity between the amorphous silicon film 6012 and the polycrystalline silicon film 6008. As the rare gas element, one or more selected from helium (He), neon (Ne), argon (Ar), krypton (Kr), and xenon (Xe) can be used.

After that, removing (gettering) of the catalytic element is performed by heat treatment for three minutes in a furnace heated to be 650° C. Thus, the concentration of the catalytic element in the polycrystalline silicon film 6008 is decreased. A lamp annealing apparatus may be used instead of the furnace. Through the heat treatment, the catalytic element in the polycrystalline silicon film 6008 is moved to a semiconductor film for the gettering, namely the amorphous silicon film 6012, due to the diffusion as indicated by an arrow.

Subsequently, the amorphous silicon film 6012 containing an argon element, which is a gettering site, is selectively removed with the barrier layer 6010 as an etching stopper, and then, the barrier layer 6010 is selectively removed by dilute hydrofluoric acid. It is to be noted that there is a tendency that nickel is easily moved to a region with a high oxygen concentration in gettering, and thus, it is desirable that the barrier layer 6010 formed using the oxide film be removed after gettering.

It is to be noted that, in a case where crystallization of a semiconductor film using a catalytic element is not performed, the above described steps such as the formation of the barrier layer 6010, the formation of the gettering site (the amorphous silicon film 6012 containing an argon element), the heat treatment for gettering, the removal of the gettering site, and the removal of the barrier layer are not required.

Figure 12C:
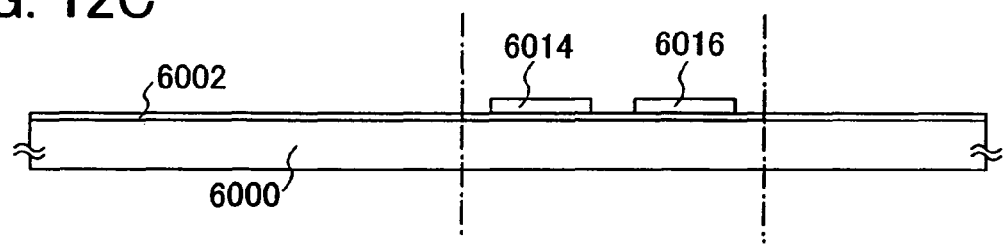

Next, after a thin oxide film is formed with ozone water over a surface of the obtained semiconductor film having a crystalline structure (such as a crystalline silicon film), a mask made of resist is formed by using a first photomask, and etching treatment is performed to obtain a desired shape, thereby forming semiconductor films 6014 and 6016 separated in island shapes (referred to as "island-like semiconductor films" in this specification) (refer to FIG. 12C). After forming the island-like semiconductor films 6014 and 6016, the mask made of resist is removed.

Subsequently, if necessary, doping of the minute amount of an impurity element (boron or phosphorus) is performed to control a threshold voltage of a TFT. Here, an ion doping method is used, in which diborane ($B_2H_6$) is not separated by mass but excited by plasma.

Next, surfaces of the island-like semiconductor films 6014 and 6016 are washed concurrently with removing the oxide film by using etchant containing hydrofluoric acid. Thereafter, an insulating film containing silicon as its main component, which serves as a gate insulating film 6018, is formed FIG. 13A. Here, a silicon oxide film containing nitrogen (composition ratio: Si=32%, O=59%, N=7%, H=2%) is formed to have a thickness of 115 nm by a plasma CVD method.

Figure 13A:
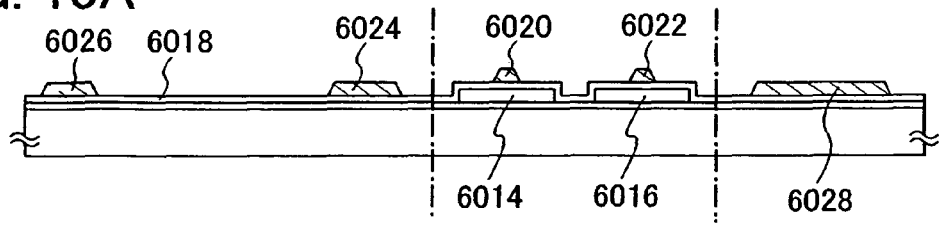
FIGS. 13A to 13D are explanatory views of a semiconductor device (a photo IC) using a laser irradiation apparatus of the present invention, and a manufacturing method thereof.

Then, after a metal film is formed over the gate insulating film 6018, treatment of forming (pattering) the metal film in a predetermined shape is performed using a second photomask, thereby forming gate electrodes 6020 and 6022, wirings 6024 and 6026, and a terminal electrode 6028 (refer to FIG. 13A). For example, as the metal film, a film in which tantalum nitride (TaN) and tungsten (W) are stacked to be 30 nm and 370 nm, respectively, is used.

In addition to the above materials, as the gate electrodes 6020 and 6022, the wirings 6024 and 6026, and the terminal electrode 6028, a single-layer film formed using an element selected from titanium (Ti), tungsten (W), tantalum (Ta), molybdenum (Mo), neodymium (Nd), cobalt (Co), zirconium (Zr), zinc (Zn), ruthenium (Ru), rhodium (Rh), palladium (Pd), osmium (Os), iridium (Ir), platinum (Pt), aluminum (Al), gold (Au), silver (Ag), or copper (Cu), or an alloy material or a compound material containing the above element as its main component; or nitride thereof can be used. For example, a single-layer film formed using titanium nitride, tungsten nitride, tantalum nitride, or molybdenum nitride can be given.

Figure 13B:
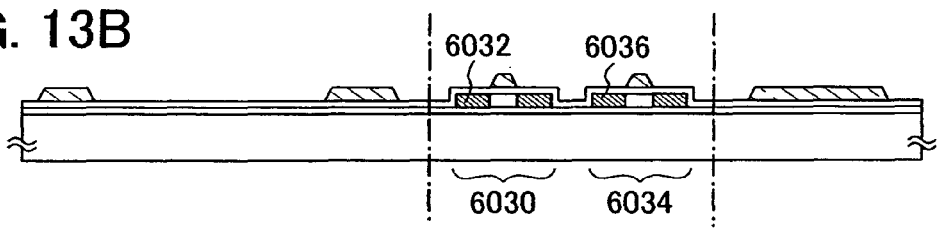

Then, an impurity imparting one conductivity type is introduced to the island-like semiconductor films 6014 and 6016 to form a source region or drain region 6032 of a TFT 6030, and a source region or drain region 6036 of a TFT 6034. An n-channel TFT is formed in this embodiment; therefore, an impurity imparting n-type conductivity, for example phosphorus (P) or arsenic (As), is introduced to the island-like semiconductor films 6014 and 6016 (refer to FIG. 13B).

Subsequently, a first interlayer insulating film 6038 including a silicon oxide film is formed to have a thickness of 50 nm by a CVD method. Further, a step for activating an impurity element added to the source region or drain region 6032 of the TFT 6030, and the source region or drain region 6036 of the TFT 6034 is performed. The activation step is performed by a rapid thermal annealing method (RTA method) using a lamp light source, a method of irradiation with a YAG laser or an excimer laser from a rear surface, heat treatment using a furnace, or a method that is a combination of any of the foregoing methods.

Figure 13C:
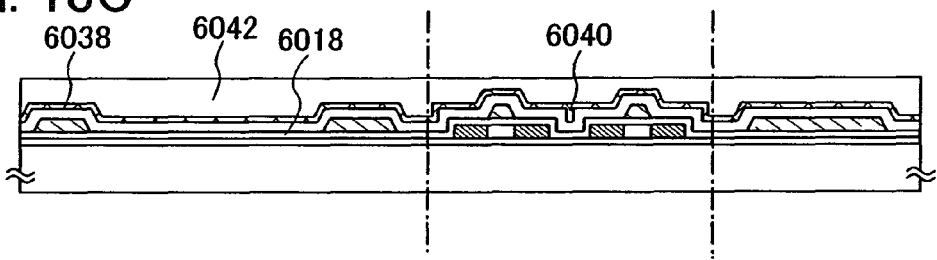

Next, a second interlayer insulating film 6040 including a silicon nitride film that contains hydrogen and oxygen is formed to have a thickness of, for example, 10 nm (FIG. 13C).

Subsequently, a third interlayer insulating film 6042 made of an insulator material is formed over the second interlayer insulating film 6040 (refer to FIG. 13C). As for the third interlayer insulating film 6042, an insulating film obtained by a CVD method can be used. In order to improve adhesiveness, a silicon oxide film containing nitrogen with a thickness of 900 nm is formed as the third interlayer insulating film 6042 in this embodiment.

Then, heat treatment (at 300 to 550° C. for 1 to 12 hours, for example, at 410° C. in a nitrogen atmosphere for one hour) is performed to hydrogenate the island-like semiconductor films 6014 and 6016. This process is performed so as to terminate a dangling bond of the island-like semiconductor films 6014 and 6016 by hydrogen contained in the second interlayer insulating film 6040. The island-like semiconductor films 6014 and 6016 can be hydrogenated regardless of whether or not the gate insulating film 6018 is formed.

Further, as the third interlayer insulating film 6042, an insulating film using siloxane or a stacked structure thereof can be used. In this case, after the second interlayer insulating film 6040 is formed, heat treatment for hydrogenating the island-like semiconductor films 6014 and 6016 is performed, then, the third interlayer insulating film 6042 can be formed. Siloxane is composed of a skeleton formed by the bond of silicon and oxygen (siloxane bond), in which at least one of fluorine, aliphatic hydrocarbon, and aromatic hydrocarbon is bonded to silicon.

Next, a resist mask is formed using a third photomask, and the first interlayer insulating film 6038, the second interlayer insulating film 6040, and the third interlayer insulating film 6042 or the gate insulating film 6018 are selectively etched to form a contact hole. Then, the resist mask is removed.

It is to be noted that the third interlayer insulating film 6042 may be formed as needed. When the third interlayer insulating film 6042 is not formed, after forming the second interlayer insulating film 6040, the first interlayer insulating film 6038, the second interlayer insulating film 6040, and the gate insulating film 6018 are selectively etched to form a contact hole.

Figure 13D:
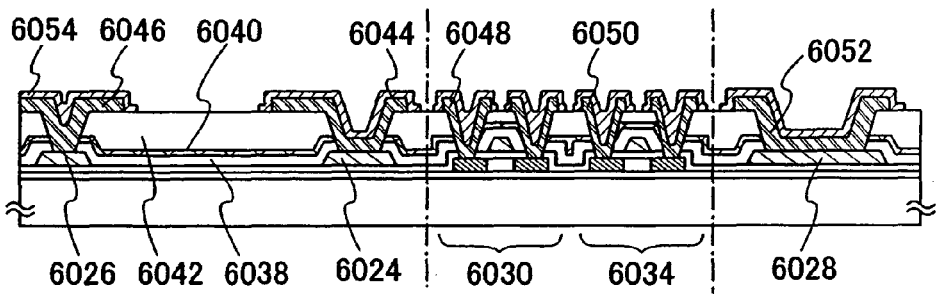

Subsequently, as shown in FIG. 13D, after forming a metal stacked film by a sputtering method, a resist mask is formed using a fourth photomask, and then, the metal film is selectively etched to form a wiring 6044 to be connected to the wiring 6024, a wiring 6046 to be connected to the wiring 6026, an electrode to be connected to the source region or drain region 6032 of the TFT 6030 (hereinafter, referred to as a source electrode or drain electrode) 6048, a source electrode or drain electrode 6050 to be connected to the source region or drain region 6036 of the TFT 6034, and a wiring 6052 to be connected to the terminal electrode 6028. Then, the resist mask is removed. The metal film in this embodiment is formed by stacking three layers of a 100-nm-thick Ti film, a 350-nm-thick Al film containing an extremely small amount of Si, and another 100-nm-thick Ti film.

Subsequently, after forming a conductive metal film (such as titanium (Ti) or molybdenum (Mo)) which is not likely to be alloy by reacting with a photoelectric conversion layer (typically, amorphous silicon) which is formed later, a resist mask is formed using a fifth photomask, and then, the conductive metal film is selectively etched to form a protective electrode 6054 which covers the wirings 6044 and 6046, the source electrodes or drain electrodes 6048 and 6050, and the wiring 6052 (refer to FIG. 13D). Here, a Ti film having a thickness of 200 nm obtained by a sputtering method is used. By covering the side surfaces of the wirings 6044 and 6046, the source electrodes or drain electrodes 6048 and 6050, and the wiring 6052, with the protective electrode 6054, the side surfaces where the Al film is exposed in these electrodes can also be covered. Therefore, the protective electrode 6054 can prevent diffusion of an aluminum atom to the photoelectric conversion layer to be formed later.

Figure 14A:
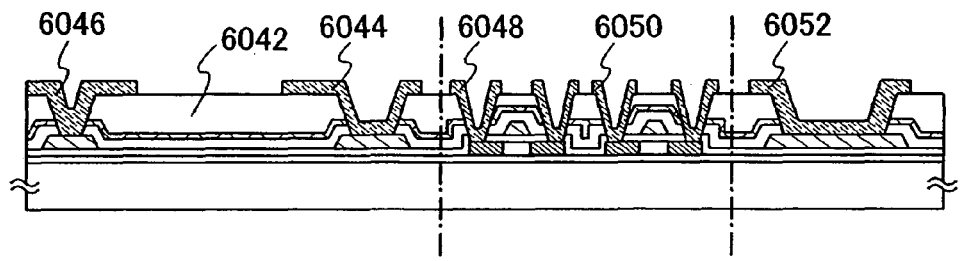
FIGS. 14A to 14C are explanatory views of a semiconductor device (a photo IC) using a laser irradiation apparatus of the present invention, and a manufacturing method thereof.

FIG. 14A shows a case where the wirings 6044 and 6046, the source electrodes or drain electrodes 6048 and 6050, and the wiring 6052 are formed using a single-layer conductive film. In this case, when a substance, which is not diffused into the photoelectric conversion layer, such as aluminum is used for a material of these electrodes, the protective electrode 6054 may not be formed. In this case, a titanium film (i) is preferably used in terms of heat resistance, conductivity, and the like.

The material is not limited to titanium, and other materials may be used. As a material other than titanium, the following can be used: a single-layer film formed using an element selected from tungsten (W), tantalum (Ta), molybdenum (Mo), neodymium (Nd), cobalt (Co), zirconium (Zr), zinc (Zn), ruthenium (Ru), rhodium (Rh), palladium (Pd), osmium (Os), iridium (Ir), and platinum (Pt), or an alloy material or a compound material containing the above element as its main component; or a single-layer film formed using nitride thereof, for example, titanium nitride, tungsten nitride, tantalum nitride, or molybdenum nitride.

The number of deposition can be reduced in the manufacturing process by forming the wirings 6044 and 6046, the source electrodes or drain electrodes 6048 and 6050, and the wiring 6052 to have a single-layer film as shown in FIG. 14A.

Next, in a case where the protective electrode 6054 is provided, a photoelectric conversion layer 6056 including a p-type semiconductor layer 6056p, an i-type semiconductor layer 6056i, and an n-type semiconductor layer 6056n is formed over the third interlayer insulating film 6042. The p-type semiconductor layer 6056p may be formed by forming an amorphous silicon film including an impurity element belonging to Group 13, for example, boron (B) by a plasma CVD method.

The wiring 6024 and the protective electrode 6054 are electrically connected to a lowest layer of the photoelectric conversion layer 6056, in this embodiment, the p-type semiconductor layer 6056p.

Figure 14B:
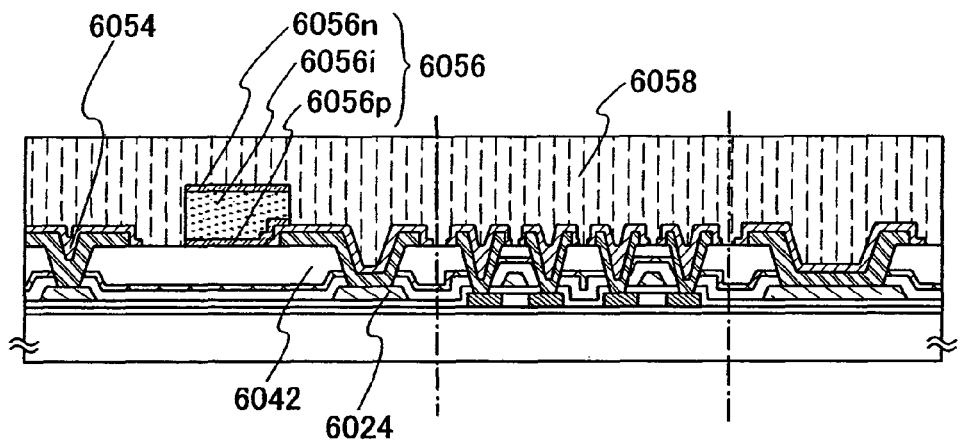
Figure 14C:
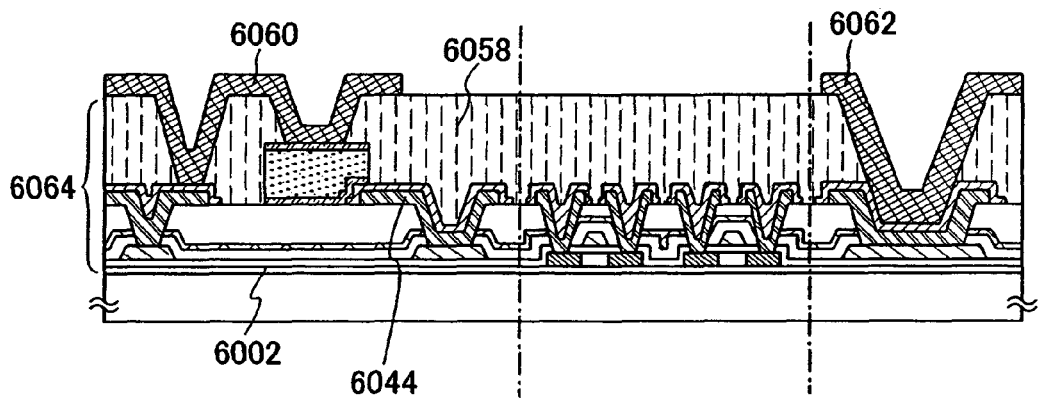

In a case where the wirings 6044 and 6046, the source electrodes or drain electrodes 6048 and 6050, and the wiring 6052 are formed using a single-layer conductive film, without forming the protective electrodes unlike FIG. 14A, the lowest layer of the photoelectric conversion layer 6056 is in contact with the wiring 6044 over the wiring 6044 (FIG. 14C).

Also in this case, in the same manner as shown in FIG. 14B, after forming the p-type semiconductor layer 6056p, the i-type semiconductor layer 6056i and the n-type semiconductor layer 6056n are sequentially formed. Accordingly, the photoelectric conversion layer 6056 including the p-type semiconductor layer 6056p, the i-type semiconductor layer 6056i, and the n-type semiconductor layer 6056n is formed.

As the i-type semiconductor layer 6056i, an amorphous silicon film may be formed by, for example, a plasma CVD method. As the n-type semiconductor layer 6056n, an amorphous silicon film including an impurity element belonging to Group 15, such as phosphorus (P) may be formed, or after an amorphous silicon film is formed, an impurity element belonging to Group 15 may be introduced.

As the p-type semiconductor layer 6056p, the i-type semiconductor layer 6056i, and the n-type semiconductor layer 6056n, a semiamorphous semiconductor film may be used as well as the amorphous semiconductor film.

Then, a sealing layer 6058 formed using an insulator material (for example, an inorganic insulating film containing silicon) is formed to have a thickness of 1 to 30 µm over the entire surface. Here, a silicon oxide film containing nitrogen having a thickness of 1 µm is formed by a CVD method as the insulator material film. It is intended that adhesiveness be improved by using the insulating film formed by a CVD method, for the sealing layer 6058.

After the sealing layer 6058 is etched to provide an opening portion, terminal electrodes 6060 and 6062 are formed by a sputtering method (FIG. 14C). The terminal electrodes 6060 and 6062 are formed using a stacked film of a titanium film (Ti film, 100 nm), a nickel film (Ni film, 300 nm), and a gold film (Au film, 50 nm). The fixing intensity of the terminal electrodes 6060 and 6062 obtained as described above is more than 5N, which is sufficient fixing intensity for a terminal electrode.

Through the above-described steps, the terminal electrodes 6060 and 6062 that can be connected with solder are formed, and a structure shown in FIG. 14C is obtained. An element formation layer 6064 refers to a layer in which the formation from the base insulating film 6002 to the sealing layer 6058 is finished.

Subsequently, a plurality of light sensor chips is cut out by cutting the substrate into individual pieces. A large number of light sensor chips (2 mm×1.5 mm) can be manufactured from one large-area substrate (for example, 600 cm×720 cm).

Figure 15A:
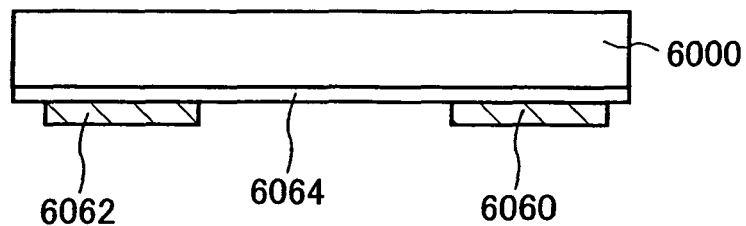
FIGS. 15A to 15C are explanatory views of a semiconductor device (a photo IC) using a laser irradiation apparatus of the present invention, and a manufacturing method thereof.
Figure 15B:
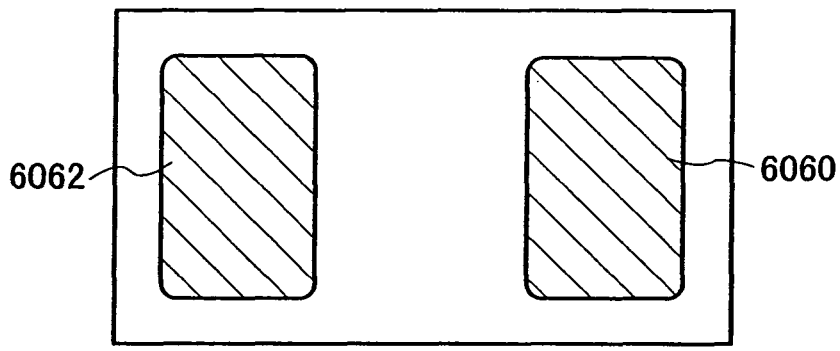
Figure 15C:
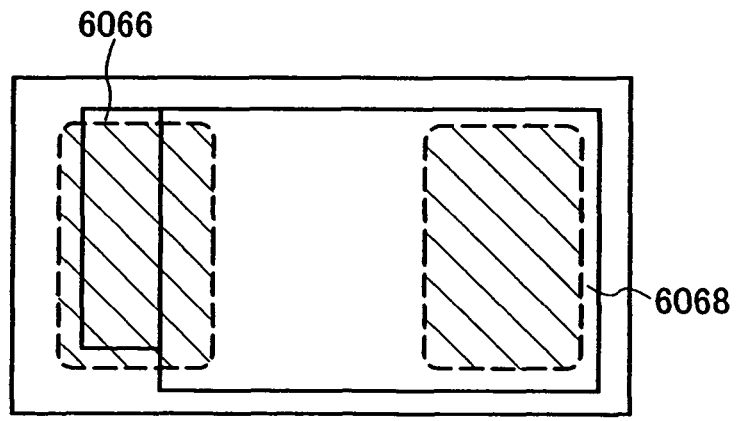

FIG. 15A shows a cross-sectional view of one light sensor chip (2 mm×1.5 mm) that is cut out, FIG. 15B shows a bottom view thereof, and FIG. 15C shows a top view thereof. In FIG. 15A, a thickness of the substrate 6000, the element formation layer 6064, and the terminal electrodes 6060 and 6062 in total is 0.8±0.05 mm.

In addition, in order to make the total thickness of the light sensor chip thinner, a plurality of light sensor chips may be cut out by cutting the substrate into individual pieces using a dicer after the substrate 6000 is ground and thinned by CMP treatment or the like.

In FIG. 15B, the electrode size of one of the terminal electrodes 6060 and 6062 is 0.6 mm×1.1 mm, and the electrode interval is 0.4 mm. In addition, in FIG. 15C, the area of a light receiving portion 6066 is 1.57 mm$^2$. Further, an amplifier circuit portion 6068 is provided with approximately 100 TFTs.

Figure 16A:
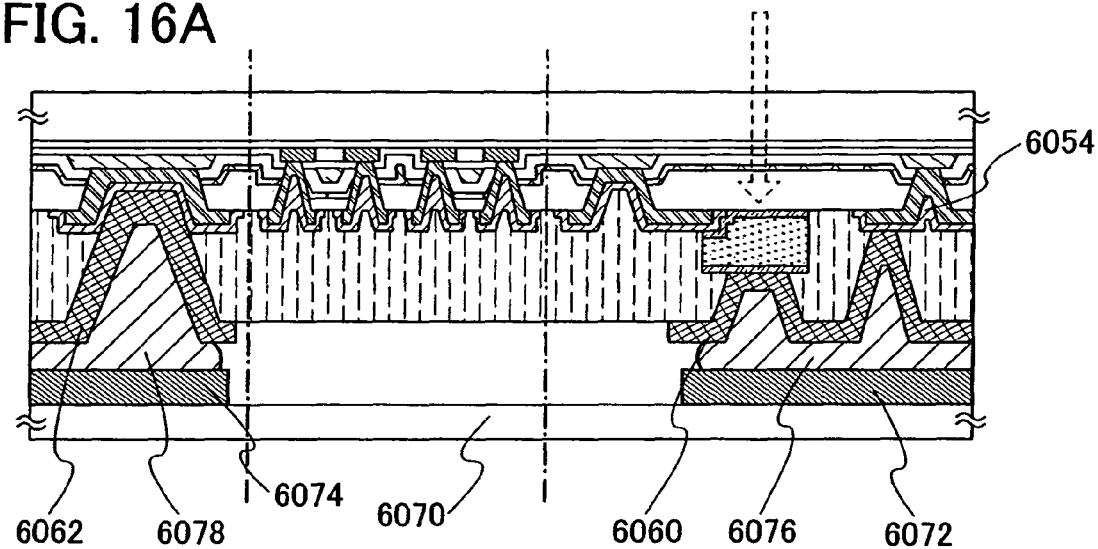
FIGS. 16A and 16B are explanatory views of a semiconductor device (a photo IC) using a laser irradiation apparatus of the present invention, and a manufacturing method thereof.
Figure 16B:
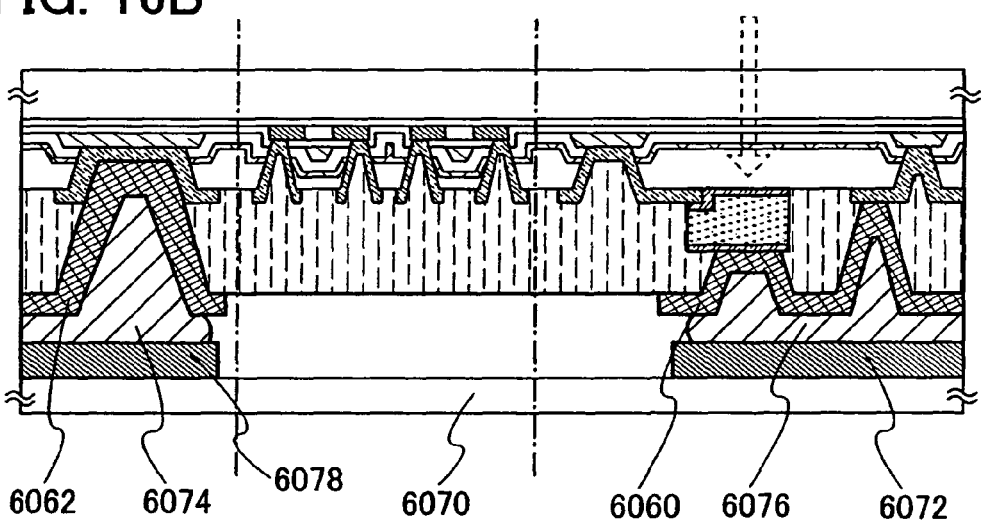

Finally, the obtained light sensor chip is mounted on the mounting side of a substrate 6070. Solder 6076 and 6078 are used for connecting the terminal electrode 6060 to an electrode 6072, and the terminal electrode 6062 to an electrode 6074, respectively. The solder is formed in advance by a screen printing method or the like over the electrodes 6072 and 6074 of the substrate 6000, and the solder and the terminal electrode are made in an abutted state to perform mounting by reflow soldering treatment. The reflow soldering treatment is performed, for example, at approximately 255 to 265° C. for about 10 seconds in an inert gas atmosphere. Further, as well as the solder, a bump formed using metal (such as gold or silver), a bump formed using a conductive resin, or the like can be used. In addition, lead-free solder may be used in consideration of an environmental problem. According to the above steps, a light sensor chip shown in FIGS. 16A and 16B is completed. Light is received from a portion indicated by an arrow. The difference between FIG. 16A and FIG. 16B is whether the protective electrode 6054 exists or not.

This embodiment can be combined with the embodiment mode and other embodiments.

Embodiment 7

In this embodiment, explanation will be made on a TFT manufactured using a laser irradiation apparatus of the present invention, to be used as a thin film integrated circuit device or a non-contact type thin film integrated circuit device (also referred to as a wireless IC tag or an RFID (also referred to as wireless authentication or radio frequency identification)). The thin film integrated circuit device or the non-contact thin film integrated circuit device can be utilized as a tag or a memory in combination with the manufacturing method shown in other embodiments.

By using the laser irradiation apparatus of the present invention, various effects can be obtained. Divergence of a beam diameter of the laser beam and short-term fluctuation of an optical axis can be corrected by a transfer lens. Therefore, a laser beam can be propagated without being hit on an inner wall of a pipe, and accordingly, a semiconductor film can be irradiated with the energy of the laser beam kept, which is emitted from the laser irradiation apparatus. Further, even if a space is small, irradiation with a laser beam is possible as long as a place to dispose a beam propagator is secured. Therefore, irradiation with a laser beam, which is greater in quantity than a conventional one, can be performed at one time, whereby efficiency in laser irradiation treatment is significantly improved. In a case of using a large-sized substrate having a side more than one meter, there is a great effect in that a semiconductor film can be irradiated with several to several tens of laser beams at one time at the same time.

Since setting such as optical axis alignment becomes the minimum necessary, time for setting is drastically reduced. Setting is performed only by rotating a joint of a pipe, whereby setting can be performed safely and easily without contact with a laser beam or without deviation of an optical axis on contact with another optical system. Further, a propagating distance of a laser beam is not changed even when a position of a pipe is changed; therefore, setting of an optical system such as a condensing lens is not necessary to be changed. Accordingly, uniform laser irradiation treatment is possible, thereby generating no variation in processing state of an object to be irradiated.

The thin film integrated circuit device and the non-contact type thin film integrated circuit device manufactured using the semiconductor film crystallized using such a laser irradiation apparatus have favorable product quality, which can prevent variation in quality.

This embodiment shows an example of using an isolated TFT as a semiconductor element used for an integrated circuit of a wireless IC tag. However, the semiconductor element which can be used for an integrated circuit of a wireless IC tag is not limited to the TFT, and other elements can be used. For example, a storage element, a diode, a photoelectric conversion element, a resistance element, a coil, a capacitor element, an inductor, and the like can be typically given. These elements can be similarly formed.

A method for manufacturing a wireless IC tag will be explained with reference to the following drawings. Actually, the wireless IC tag is manufactured as follows: a plurality of semiconductor elements are concurrently formed over a substrate which is greater than 1 m on a side, then an element group is peeled from the substrate to be cut into individual semiconductor elements, and then sealing is performed on each of the semiconductor elements. In addition, not only the above-described method, but also the following method can be used: after a plurality of semiconductor elements are concurrently formed over the surface of a substrate which is greater than 1 m on a side and the substrate is thinly grinded from a rear surface of the substrate, the substrate is cut into individual semiconductor elements and sealing is performed by a film or the like.

Figure 17A:
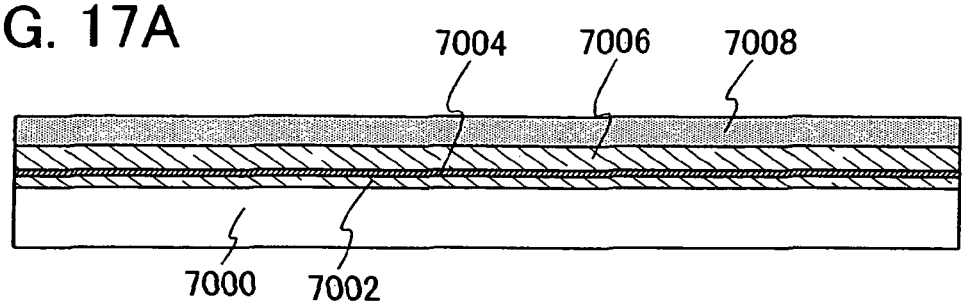
FIGS. 17A to 17D are explanatory views of a semiconductor device (a wireless IC tag) using a laser irradiation apparatus of the present invention, and a manufacturing method thereof.
Figure 17B:
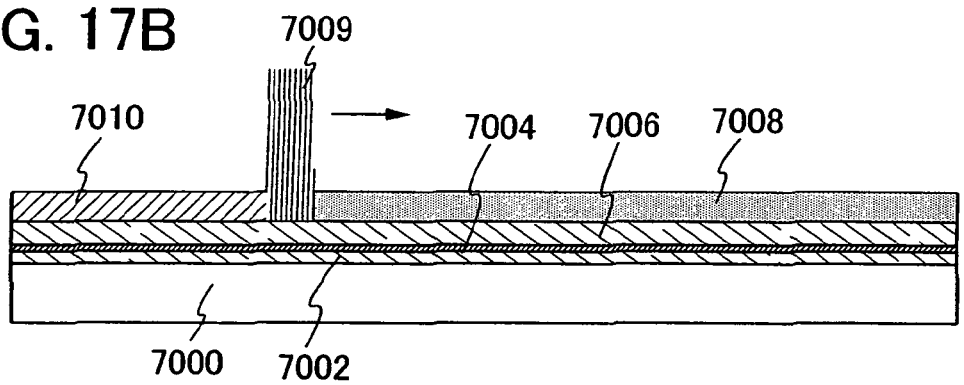

First, a substrate 7000 is prepared as shown in FIG. 17A. As the substrate 7000, a glass substrate such as a barium borosilicate glass or an alumino borosilicate glass, a quartz substrate, or the like can be used. Instead, a flexible synthetic resin such as acrylic or plastic typified by polyethylene terephthalate (PET), polyethylene naphthalate (PEN), and polyethersulfone (PES) may be used. A synthetic resin can be used as the substrate as long as the synthetic resin can withstand a processing temperature in a manufacturing process of the wireless IC tag.

There is not so much limitation on the square measure or shape of the substrate 7000 if the substrate 7000 is formed using the above-described material. Therefore, productivity can be drastically improved if a substrate which is, for example 1 m or more on a side and is rectangular, is used as the substrate 7000. These are great advantages.

In addition, the surface of the substrate formed using the above-described material may be thinned by polishing such as a CMP method. For example, a semiconductor element may be formed by the following method over a glass substrate, a quartz substrate, or a semiconductor substrate after polishing these substrates.

After preparing the substrate 7000, an insulating film 7002 is formed over the substrate 7000 (FIG. 17A). The insulating film 7002 can be provided by a single-layer structure or a stacked-layer structure of an insulating film containing oxygen or nitrogen, such as silicon oxide (SiOx), silicon nitride (SiNx), a silicon oxide film containing nitrogen, a silicon nitride film containing oxygen, or the like. In this embodiment, a silicon oxide film containing nitrogen is formed in 100 nm thick as the insulating film 7002. In addition, the insulating film 7002 may be oxidized or nitrided by performing high-density plasma treatment to the insulating film 7002.

High-density plasma is generated by using a microwave at, for example, 2.45 GHz. Specifically, high-density plasma with electron density of $10^{11}$ to $10^{13}/cm^3$, electron temperature of 2 eV or less, and ion energy of 5 eV or less is used. As for high-density plasma of which low electron temperature is a feature as described above, active species have low kinetic energy. Therefore, a film with less plasma damage and fewer defects compared with conventional plasma treatment can be formed. In plasma generation, a microwave excitation plasma process apparatus using a radial slot antenna can be used. The distance between the substrate 7000 and the antenna for generating the microwave is set to 20 to 80 mm (preferably 20 to 60 mm).

Next, a peeling layer 7004 is formed (FIG. 17A). In this embodiment, tungsten is formed in 30 nm thick by a plasma CVD method. The peeling layer 7004 can be formed using a metal film, a stacked-layer structure of a metal film and a metal oxide film, or the like. The metal film is formed in a single-layer or stacked-layer structure of a film of an element selected from tungsten (W), molybdenum (Mo), titanium (Ti), tantalum (Ta), niobium (Nb), nickel (Ni), cobalt (Co), zirconium (Zr), zinc (Zn), ruthenium (Ru), rhodium (Rh), palladium (Pd), osmium (Os), or iridium (Ir), or a film formed using an alloy material or a compound material containing the above element as its main component. These materials can be formed by a known method (a sputtering method or various CVD methods such as a plasma CVD method).

For example, in the case of forming the peeling layer 7004 in a stacked layer of a metal film and a metal oxide film, each of the metal film and the metal oxide film can be formed by a sputtering method or a plasma CVD method. As another method, after forming the above metal film, oxide of the metal can be formed over the surface of the metal film by heat treatment or plasma treatment under an oxygen atmosphere. As plasma treatment, high-density plasma treatment may be performed. In addition, metal nitride, metal nitride containing oxygen, or metal oxide containing nitrogen may be used instead of a metal oxide film. In the case of forming metal nitride, plasma treatment or heat treatment may be performed on the metal film under a nitrogen atmosphere. In the case of forming metal nitride containing oxygen or metal oxide containing nitrogen, plasma treatment or heat treatment may be performed on the metal film under atmosphere containing nitrogen and oxygen. The type of a film to be formed is different depending on a flow ratio of a gas which is to be used.

When the peeling layer 7004 is formed, oxide, nitride, or nitride oxide is formed on its surface. These compounds can be peeled easily in short time because the reaction speed with an etching gas, especially chlorine trifluoride ($ClF_3$) is high. That is to say, the peeling is possible when any of the metal, the metal oxide, the metal nitride, or the metal nitride oxide is removed by an etching gas.

When the oxide, the nitride, or the nitride oxide is formed on the surface of the peeling layer 7004, the chemical condition may change. For example, in the case where an oxide film containing tungsten (W) is formed, the valence of a tungsten oxide ($WO_x$ (x=2 to 3)) changes. As a result, the oxide film is in such a state that the oxide film is easily peeled by a physical means. In the combination of the chemical means and physical means, the oxide film can be removed more easily in short time.

Although the peeling layer 7004 is formed over the entire surface of the insulating film 7002 in this embodiment, the peeling layer 7004 may be provided directly for the substrate 7000. In the case of providing directly on the substrate 7000, the peeling layer 7004 may be provided over the entire surface of the substrate 7000 or may be provided in an arbitrary position of the substrate 7000 by photolithography.

After forming the peeling layer 7004, an insulating film 7006 serving as a base film is formed. A silicon oxide is formed in 200 nm thick by a sputtering method in this embodiment.

Next, a semiconductor film 7008 is formed. The semiconductor film 7008 may be an amorphous semiconductor film, a microcrystal semiconductor film, or a crystalline semiconductor film. The material of the semiconductor film is not limited in particular; however, silicon or silicon germanium (SiGe) is preferably used. In this embodiment, an amorphous silicon film is formed to have a thickness of greater than or equal to 25 nm and less than or equal to 200 nm (preferably, greater than or equal to 30 nm and less than or equal to 80 nm). After forming the semiconductor film 7008, a step of removing hydrogen contained in the semiconductor film 7008 may be performed. Specifically, the semiconductor film 7008 may be heated at 500° C. for one hour.

Next, the semiconductor film 7008 is irradiated with a laser beam 7009 using a laser irradiation apparatus of the present invention to crystallize the semiconductor film 7008. In this embodiment, a Nd:$YVO_4$ laser of a second harmonic is used. The laser beam is condensed using an optical system, linearly shaped, and emitted at the scanning speed of approximately 10 to several hundred cm/sec.

As for the laser, a continuous wave laser beam (CW laser beam) can be used. As a type of the laser beam which can be used here, a laser beam oscillated from one or more of a laser using a laser crystal in which one or more of Nd, Yb, Cr, Ti, Ho, Er, Tm, or Ta is added as a dopant to single crystalline YAG, $YVO_4$, forsterite ($Mg_2SiO_4$), $YAlO_3$, or $GdVO_4$, or polycrystalline (ceramic) YAG $Y_2O_3$, $YVO_4$, $YAlO_3$, or $GdVO_4$; an alexandrite laser; or a Ti:sapphire laser can be used. A crystal with a large grain size can be obtained by emitting a laser beam having a fundamental wave of such laser beams and a second to fourth harmonic of the fundamental wave.

When ceramic (poly crystal) is used as the laser crystal of the laser, the laser crystal can be formed to have any shape for a short time and at low cost. In the case of using a single crystal, a columnar laser crystal with a diameter of several mm and with a length of several tens of mm is used; however, in the case of using ceramic, a laser crystal which is larger can be formed.

The concentration of the dopant such as Nd or Yb in the laser crystal, which contributes directly to light emission cannot be changed drastically in either the single crystal or the poly crystal; therefore, the improvement of outputting a laser by increasing the concentration has limitations to some extent. However, in case of ceramic, the concentration of the laser crystal can be heightened compared with the single crystal; therefore, the significant improvement of output can be expected.

Moreover, in the case of using ceramic, a laser crystal having an arbitrary shape can be easily formed. A laser crystal using ceramic can be largely formed as compared with a single crystalline laser crystal; therefore, a longer oscillation light path can be obtained as compared with a single crystalline laser crystal. When the oscillation light path is long, amplitude is increased and a laser beam can be oscillated at high output. Here, when a laser crystal with a parallel hexahedron shape or a rectangular parallelepiped shape is used, an oscillated light can be made to travel in a straight line inside the laser crystal or in a zigzag inside the laser crystal so as to be reflected inside the laser crystal. A longer oscillation light path can be obtained in the latter than the former, whereby a laser beam can be oscillated at higher output. Further, a laser beam emitted from a laser crystal having such a shape has a quadrangular shape in cross section in the emission; therefore, as compared with a laser beam with a circular shape in cross section, the laser beam with a quadrangular shape in cross section has an advantage to be shaped into a linear beam. By shaping the thus emitted laser beam using an optical system, a linear beam having a length of 1 mm or less in its short side and a length of several mm to several m in its long side can be easily obtained. Moreover, by uniformly irradiating the laser crystal with excitation light, the linear beam is made to have uniform energy distribution in the long side direction.

The crystallization can be performed more effectively when the laser crystallization method of this embodiment is combined with a crystallization method using a metal element which induces the crystallization (nickel (Ni), germanium (Ge), iron (Fe), palladium (Pd), tin (Sn), lead (Pb), cobalt (Co), platinum (Pt), copper (Cu), gold (Au), or the like).

Figure 17C:
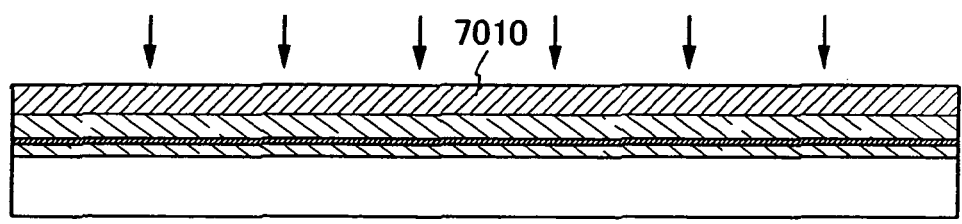

A crystalline semiconductor film 7010 formed by laser irradiation is doped with an impurity element imparting p-type conductivity. Here, doping of boron (B) as the impurity element is performed (FIG. 17C).

Figure 17D:
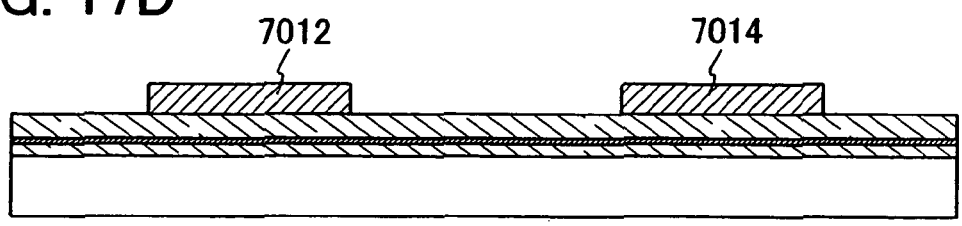

Next, the crystalline semiconductor film 7010 is etched selectively, thereby forming a first semiconductor film 7012 and a second semiconductor film 7014 (FIG. 17D).

Figure 18A:
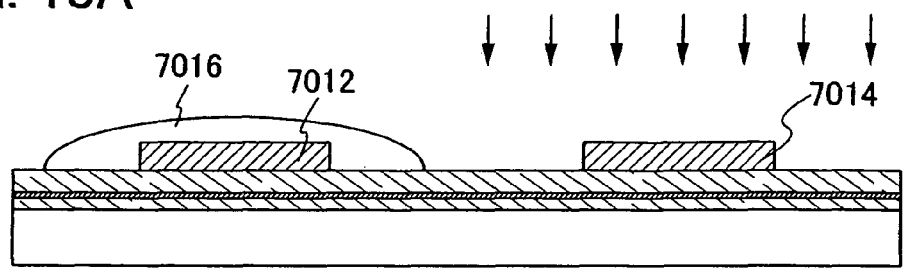
FIGS. 18A to 18D are explanatory views of a semiconductor device (a wireless IC tag) using a laser irradiation apparatus of the present invention, and a manufacturing method thereof.

Next, after a resist mask 7016 is formed so as to cover the first semiconductor film 7012, the second semiconductor film 7014 is doped with an impurity element imparting p-type conductivity (FIG. 18A). In this embodiment, doping of boron (B) as the impurity element is performed.

Figure 18B:
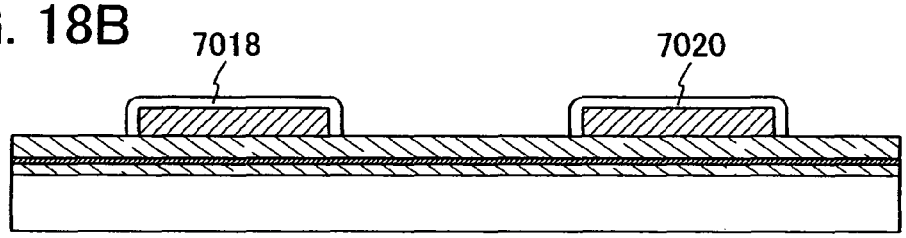

Next, the resist mask 7016 is removed, and the first semiconductor film 7012 and the second semiconductor film 7014 are oxidized or nitrided by plasma treatment so that first insulating films 7018 and 7020 (an oxide film or a nitride film) are formed over the surfaces of the first semiconductor film 7012 and the second semiconductor film 7014 (FIG. 18B). In this embodiment, the plasma treatment is performed in an atmosphere containing oxygen to oxidize the first semiconductor film 7012 and the second semiconductor film 7014, thereby forming silicon oxide (SiOx) as the first insulating film 7018. In the case of forming silicon nitride as the first insulating films 7018 and 7020, plasma treatment may be performed in a nitrogen atmosphere.

In general, since a silicon oxide film or a silicon oxide film containing nitrogen formed by a CVD method or a sputtering method contains a defect inside the film, the film quality is not high enough. Therefore, an insulating film, which is denser than the insulating film formed by a CVD method, a sputtering method, or the like can be formed over the first semiconductor film 7012 and the second semiconductor film 7014 by performing plasma treatment on the first semiconductor film 7012 and the second semiconductor film 7014 in an oxygen atmosphere to oxidize the surfaces thereof.

When a conductive film is provided above the first semiconductor film 7012 and the second semiconductor film 7014 by interposing the insulating film provided by a CVD method, a sputtering method, or the like therebetween, there is a risk that the coverage defect may occur due to the break by a step or the like of the insulating film at the edge portions of the first semiconductor film 7012 and the second semiconductor film 7014, which results in that the semiconductor film and the conductive film short out, for example. However, when the surfaces of the first semiconductor film 7012 and the second semiconductor film 7014 are oxidized or nitrided by plasma treatment in advance, the coverage defect of the insulating film at the edge portions of the first semiconductor film 7012 and the second semiconductor film 7014 can be suppressed.

Subsequently, a second insulating film 7022 is formed so as to cover the first insulating films 7018 and 7020. The second insulating film 7022 is formed using silicon nitride (SiNx) or a silicon nitride film containing oxygen. Here, a silicon nitride film is formed in 4 to 20 nm thick as the second insulating film 7022 (FIG. 18C).

Figure 18C:
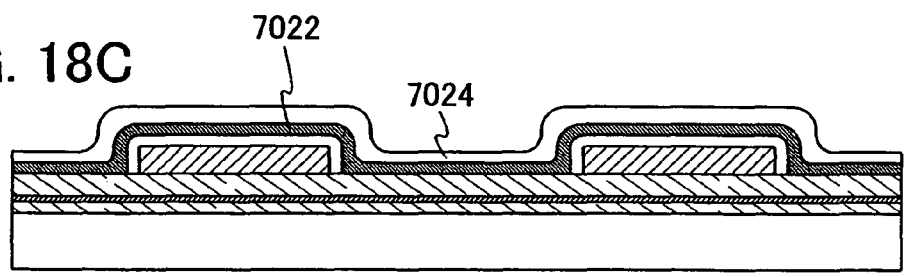

Next, plasma treatment is performed on the second insulating film 7022 in an oxygen atmosphere to oxidize the surface of the second insulating film 7022, thereby forming a third insulating film 7024 (FIG. 18C). The plasma treatment can be performed under the condition described above. Here, a silicon oxide film or a silicon oxide film containing nitrogen is formed in 2 to 10 nm thick as the third insulating film 7024 over the surface of the second insulating film 7022 by the plasma treatment.

Figure 18D:
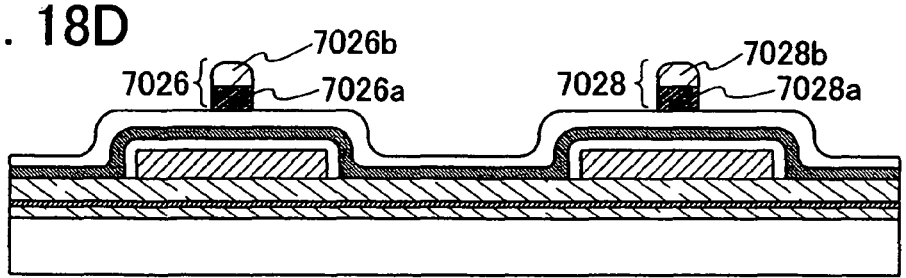

Next, conductive films 7026 and 7028 serving as gate electrodes are formed above the first semiconductor film 7012 and the second semiconductor film 7014 (FIG. 18D). Here, the conductive films 7026 and 7028 are formed to have a stacked-layer structure of first conductive films 7026a and 7028a and second conductive films 7026b and 7028b, respectively. Here, the first conductive films 7026a and 7028a are formed using tantalum nitride and the second conductive films 7026b and 7028b are formed using tungsten. The conductive film which can be used as the gate electrode may have a single-layer structure. The material for the conductive film is not limited to the above materials, but alloy containing one or more of elements selected from tantalum (Ta), tungsten (W), titanium (Ti), molybdenum (Mo), aluminum (Al), copper (Cu), chromium (Cr), and niobium (Nb), or a compound containing these elements can be used. Further, a semiconductor material typified by polycrystalline silicon doped with an impurity element such as phosphorus can also be used.

Figure 19A:
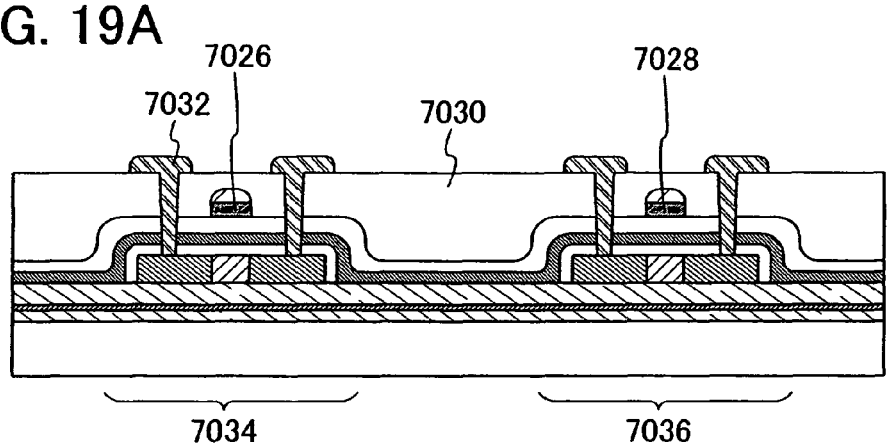
FIGS. 19A and 19B are explanatory views of a semiconductor device (a wireless IC tag) using a laser irradiation apparatus of the present invention, and a manufacturing method thereof.

Next, an impurity element imparting p-type conductivity is introduced into the first semiconductor film 7012 using the conductive film 7026 as a mask, and an impurity element imparting n-type conductivity is introduced into the second semiconductor film 7014 using the conductive film 7028 as a mask. With this step, a source region and a drain region are formed. After that, an insulating film 7030 is formed so as to cover the conductive films 7026 and 7028 (FIG. 19A).

A conductive film 7032 is formed over the insulating film 7030 so as to be connected electrically to the source or drain region of the first semiconductor film 7012, whereby a p-type thin film transistor 7034 using the first semiconductor film 7012 as a channel formation region and an n-type thin film transistor 7036 using the second semiconductor film 7014 as a channel formation region are provided (FIG. 32A). Although this embodiment shows an example of manufacturing a top-gate (staggered) TFT, the present invention is also applicable in the case of manufacturing a bottom-gate (inversely staggered) TFT or the like.

Figure 22A:
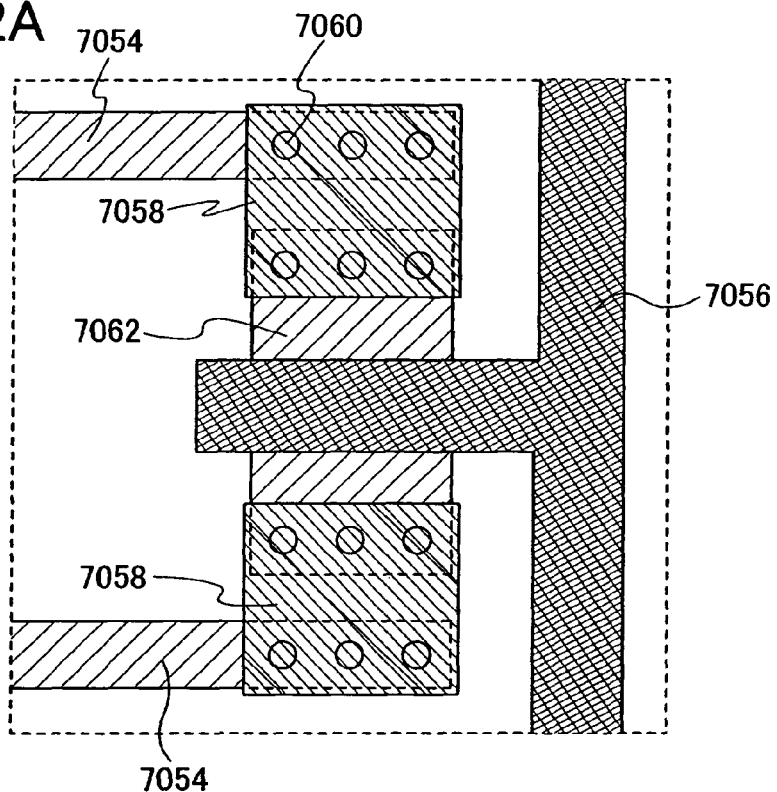
FIGS. 22A and 22B are explanatory views of a semiconductor device (a wireless IC tag) using a laser irradiation apparatus of the present invention, and a manufacturing method thereof.
Figure 22B:
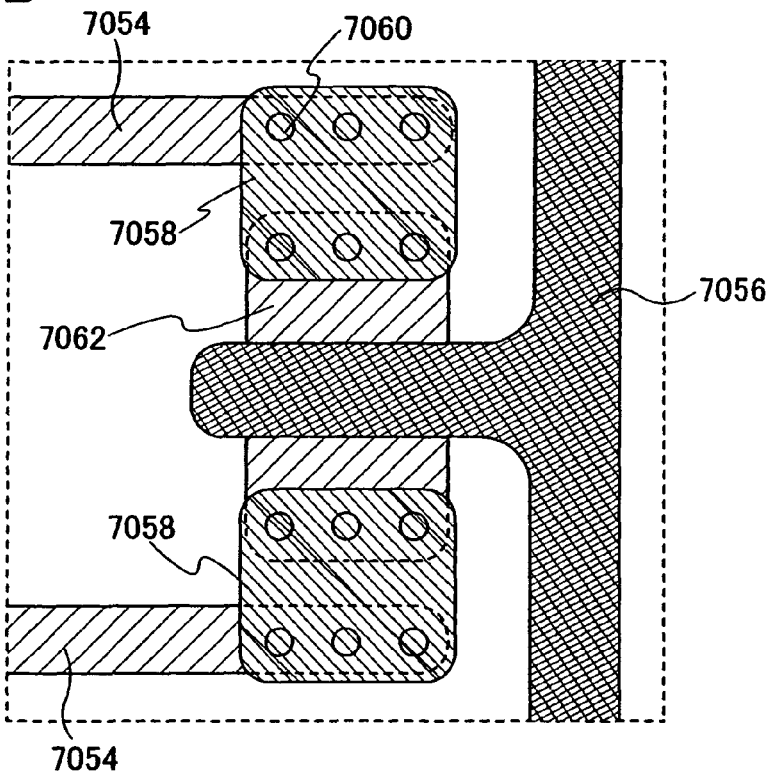

Here, it is preferable that the first semiconductor film 7012, the second semiconductor film 7014, and the conductive film 7032 (that is, a wiring) formed concurrently with these semiconductor films have round edge portions when viewed from above the substrate 7000. FIGS. 22A and 22B schematically show the state where the edges of the wiring and the like are rounded.

FIG. 22A shows a conventional forming method by which a first wiring 7054, a second wiring 7056, a third wiring 7058, and a contact hole 7060 are formed over the semiconductor film 7062. In order to form the edge portions of these wirings, a method for forming a film which is to be a material of the wiring and forming the film into a desired shape by etching treatment. However, it is not easy to form a minute and complicated wiring having accuracy by the micrometer or less. In the case of forming such a minute wiring, the distance between the wirings is extremely short; therefore, the generation of dust in an edge portion of the wiring tends to cause a defect.

FIG. 22B shows a state that the edges of the first wiring 7054, the second wiring 7056, the third wiring 7058, and a semiconductor film 7062 are formed to be rounded and a contact hole 7060 is formed. When the edge portions are rounded as shown in FIG. 22B, it is possible to suppress that the dust generated at the formation of the wiring is left at the edge portions of the wiring. Therefore, the defect of semiconductor devices due to the dust can be decreased, thereby increasing the yield.

Figure 19B:
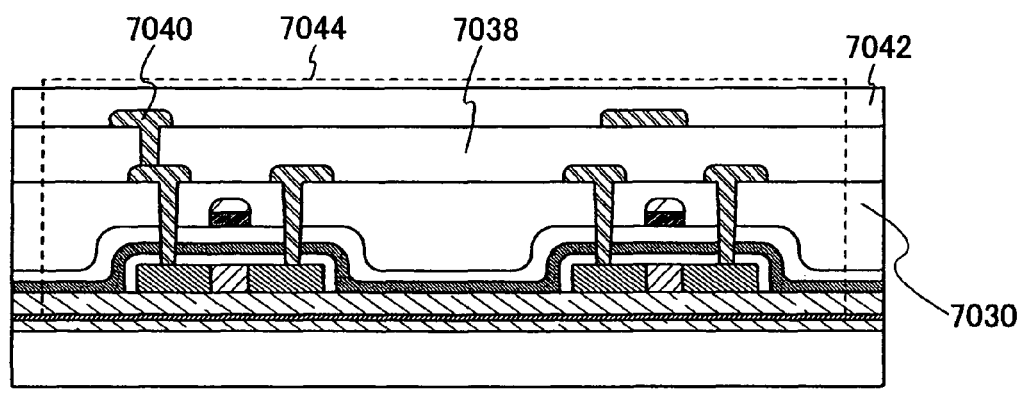

After providing the thin film transistors 7034 and 7036, an insulating film 7038 is formed so as to cover the conductive film 7032, and a conductive film 7040 serving as an antenna is formed over this insulating film 7038, and further, an insulating film 7042 is formed to cover the conductive film 7040 (FIG. 19B). It is to be noted that the conductive film 7040 and the like (a region surrounded by a dotted line) provided above the thin film transistors 7034 and 7036 are generically referred to as an element group 7044.

Each of the insulating films 7030, 7038, and 7042 may have either a single-layer or multilayer structure and may use either the same material or different materials. As the material, (1) an insulating film containing oxygen or nitrogen such as silicon oxide (SiOx), silicon nitride (SiNx), a silicon oxide film containing nitrogen, or a silicon nitride film containing oxygen; (2) a film containing carbon such as DLC (diamond like carbon); (3) an organic material such as epoxy, polyimide, polyamide, polyvinylphenol, benzocyclobutene, or acrylic or a siloxane-based material; and the like can be given.

Since the materials given in the above (3) can be formed by a spin coating method, a droplet discharge method, a printing method, or the like, the flattening can be performed efficiently and the process time can be shortened. Moreover, the insulating films 7030, 7038, and 7042 can be oxidized or nitrided by plasma treatment.

The conductive film 7040 can be formed using a conductive material containing one or more metals selected from copper (Cu), aluminum (Al), silver (Ag), gold (Au), chromium (Cr), molybdenum (Mo), titanium (Ti), tantalum (Ta), tungsten (W), nickel (Ni), carbon (C), or a metal compound containing the above metal.

Figure 20A:
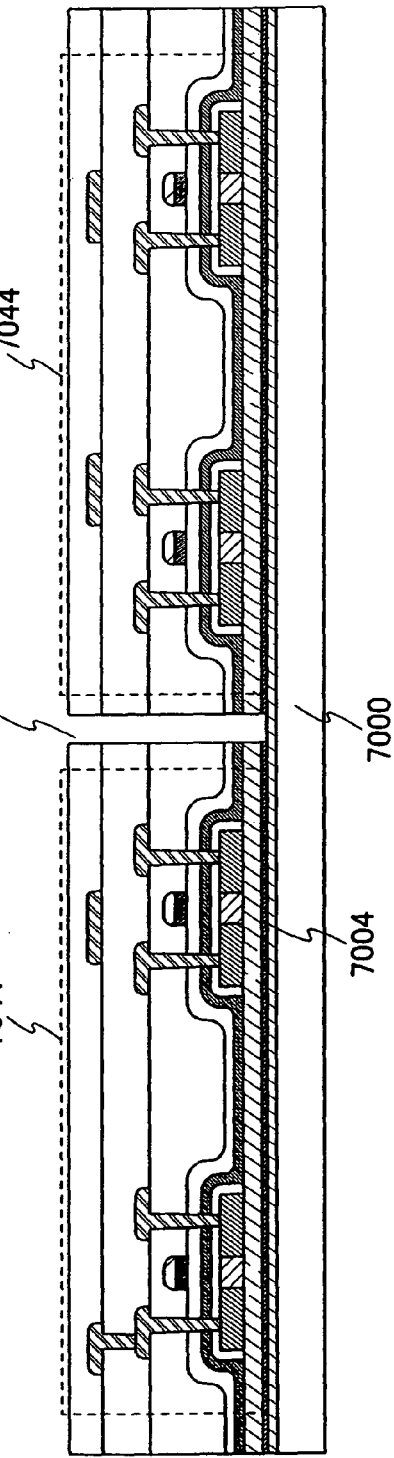
FIGS. 20A and 20B are explanatory views of a semiconductor device (a wireless IC tag) using a laser irradiation apparatus of the present invention, and a manufacturing method thereof.

Next, an opening portion 7046 is formed by a laser irradiation method or the like in a region other than the element group 7044 so as to expose the peeling layer 7004. Etchant is introduced from this opening portion 7046 to remove the peeling layer 7004 (FIG. 20A). The peeling layer 7004 may be removed completely or may be partially left. When the peeling layer 7004 is left, the thin film transistors 7034 and 7036 can be held over the substrate 7000 even after removing the peeling layer 7004 by the etchant, and moreover, the transistors can be treated easily in a later step. The etchant is, for example, gas or liquid which contains halogen or halogen fluoride such as chlorine trifluoride. For example, $CF_4$, $SF_6$, $NF_3$, $F_2$, or the like can be used.

Figure 20B:
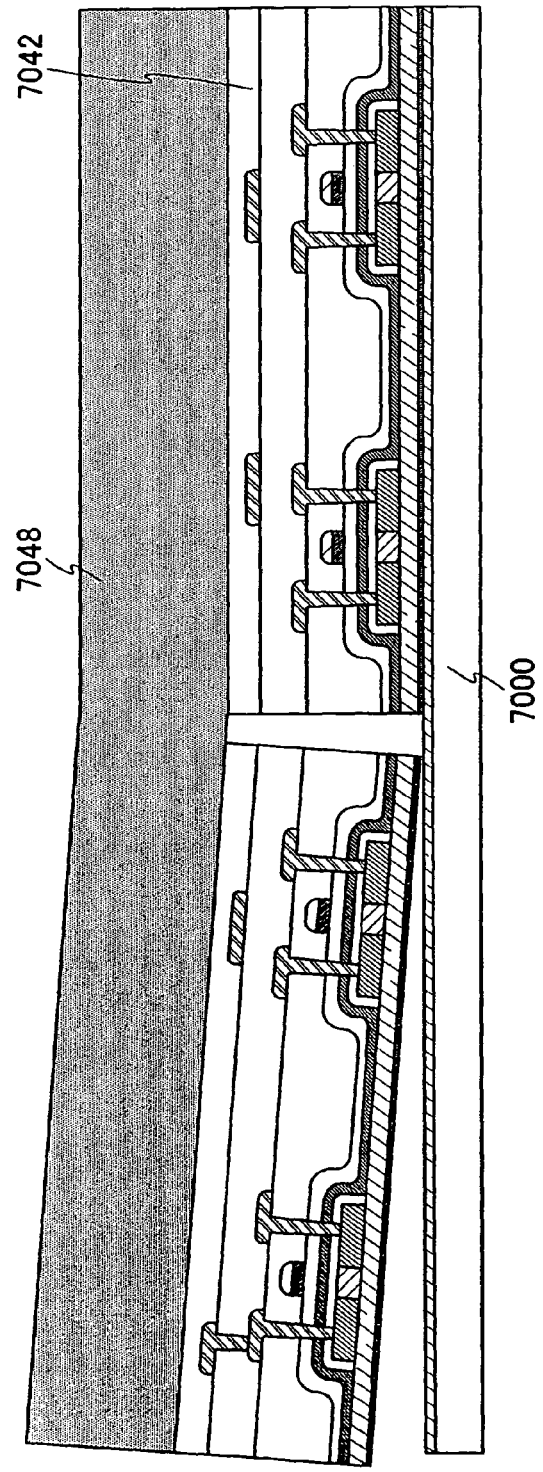

Next, a first sheet material 7048 having adhesiveness is adhered to the insulating film 7042, thereby peeling the element group 7044 from the substrate 7000 (FIG. 20B).

The purpose of adhering the first sheet material 7048 is to keep the mechanical strength of the element group 7044 to be peeled in a later step. For this reason, the thickness of the first sheet material 7048 is preferably greater than or equal to 50 μm. A flexible film having a sticking agent at least on one surface thereof can be used for the first sheet material 7048. As an example of the first sheet material 7048, a material having polyester as a base and having a sticking agent on an adhesive surface can be used. The sticking agent can be, for example, a resin material containing an acrylic resin or the like or a material containing a synthetic rubber material.

Figure 21A:
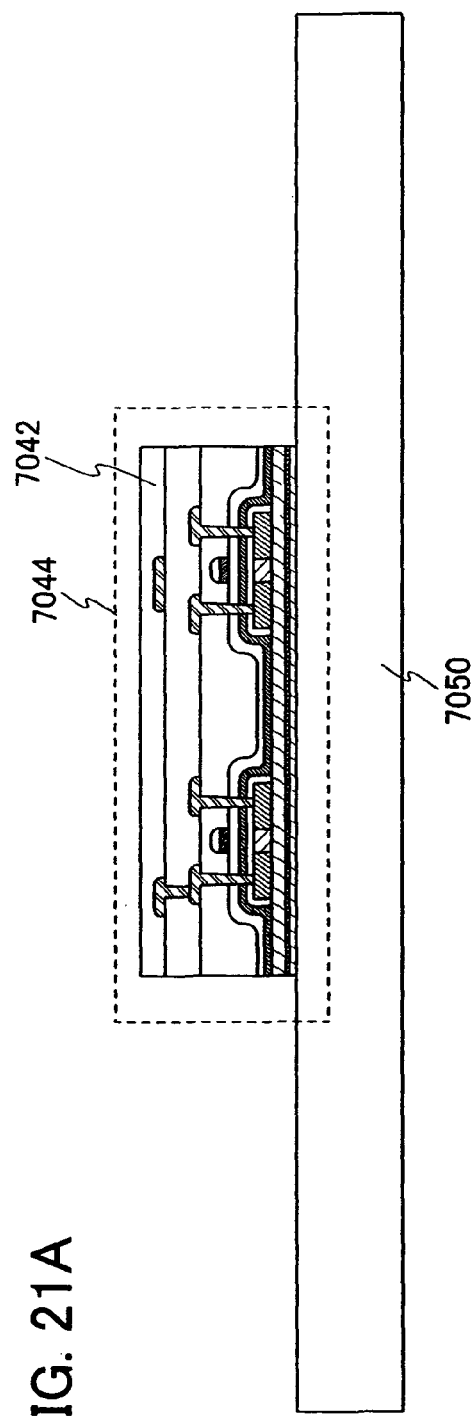
FIGS. 21A and 21B are explanatory views of a semiconductor device (a wireless IC tag) using a laser irradiation apparatus of the present invention, and a manufacturing method thereof.
Figure 21B:
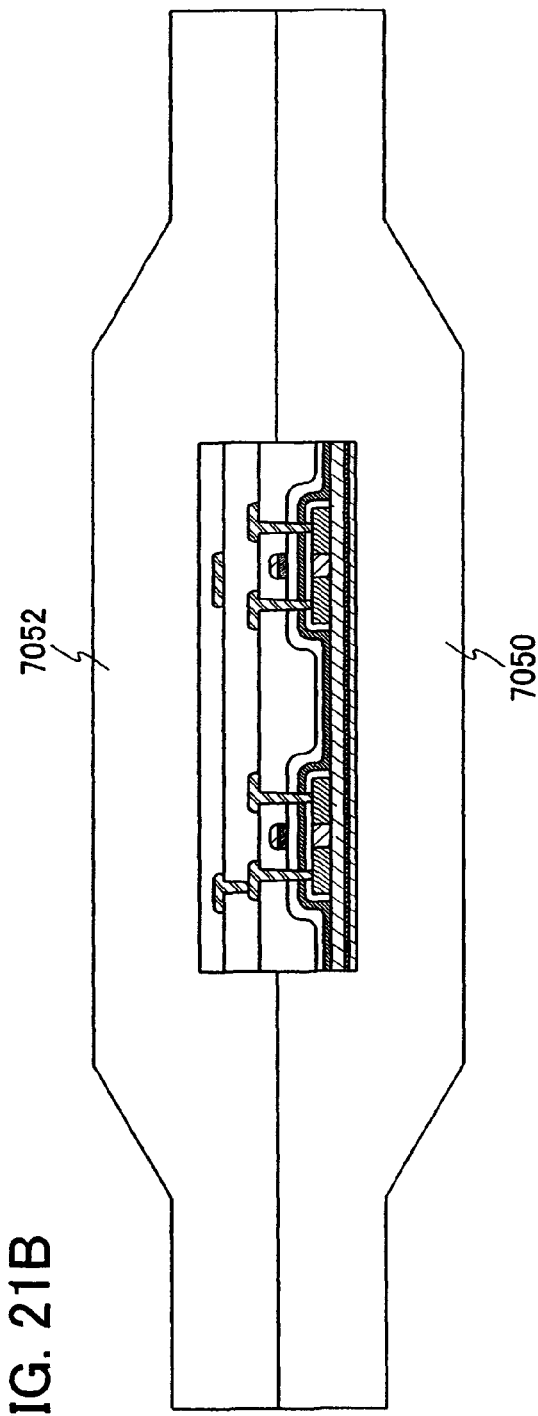

Next, the element group 7044 which is peeled is sealed with a flexible film. Here, the element group 7044 is pasted to a second sheet material 7050 and the element group 7044 is sealed by further using a third sheet material 7052 (FIGS. 21A and 21B).

The second sheet material 7050 and the third sheet material 7052 can be a flexible film, such as a film of polypropylene, polyester, vinyl, polyvinyl fluoride, or vinyl chloride, paper, a multilayer film of a base film (polyester, polyamide, an inorganic deposition film, paper, or the like) and an adhesive synthetic resin film (an acrylic-based synthetic resin, an epoxy-based synthetic resin, or the like) or the like. It is preferable that the film can be adhered with an adhesive layer provided on an outermost surface of the film or a layer provided on the outermost surface (not the adhesive layer) melted by heat treatment to be adhered by pressurization. In the case of sealing the element formation layer with the first sheet material 7048 and the second sheet material 7050, the first sheet material 7048 may also be formed using the same material.

According to the above steps, a semiconductor device which has a storage element and which can exchange data in a non-contact way can be obtained. The semiconductor device shown in this embodiment has flexibility. When the element group 7044 is attached to a flexible substrate, a semiconductor device is completed which is thin, lightweight, and difficult to be damaged even when the device is dropped. Moreover, when an inexpensive flexible substrate is used, a semiconductor device can be provided at low cost. Furthermore, the device can be pasted even to an object having a curved surface or a deformed shape. By reusing the substrate 7000, a semiconductor device can be manufactured at low cost.

Although a peeling layer is removed by a chemical method in this embodiment, there is another method for peeling a substrate and a thin film integrated element. For example, the following method can be used: laser is emitted from a rear surface of the first substrate, namely from a side where a thin film integrated element is not formed, by using poly-silicon for the peeling layer, whereby the first substrate is separated by releasing hydrogen included in the poly-silicon and generating an air gap. Further, a method for peeling separately using a physical means can be used.

In addition, a method for thinning the substrate 7000 by polishing by a CMP method or the like with an insulating film 7042 side fixed at a stage of completing the element group 7044 can be used. By using this method, a substrate to be adhered after peeling is not required, and peeling and adhering can be omitted. As a result, a semiconductor element which is formed is not bended in a peeling step. Therefore, damage that the semiconductor element is received can be prevented.

This embodiment can be appropriately combined with other embodiments.

Embodiment 8

Various electronic devices can be completed using a semiconductor material irradiated with a laser using a laser irradiation apparatus of the present invention. By using the present invention, laser irradiation treatment can be performed on a semiconductor film favorably with favorable throughput. Therefore, a semiconductor device can be manufactured with extremely favorable throughput as compared with a conventional one. The specific example will be explained hereinafter.

Figure 23A:
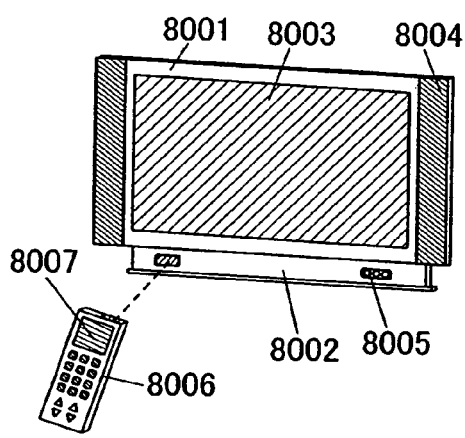
FIGS. 23A to 23F are views each showing electronic devices using a laser irradiation apparatus of the present invention.

FIG. 23A shows a display device which includes a chassis 8001, a support 8002, a display portion 8003, a speaker portion 8004, a video input terminal 8005, a remote control unit 8006, and the like. This display device is manufactured by using a TFT formed by a manufacturing method shown in another embodiment for a driving IC, the display portion 8003, or the like. A display device indicates a liquid crystal display device, a light emitting display device, and the like, and specifically, includes all types of display devices for displaying information, for example, a display device for a computer, for a television receiving, or for an advertisement display.

The above-described display device receives general TV broadcast. Further, when the display device is connected to a communication network by wired or wireless connections via a communication device such as a modem, one-way (from a sender to a receiver) or two-way (between a sender and a receiver or between receivers) information communication can be performed. The display device can be operated using a switch incorporated in the chassis 8001 or the remote control unit 8006. Besides, a display portion 8007 for displaying output information may also be provided in the remote control unit 8006.

Figure 23B:
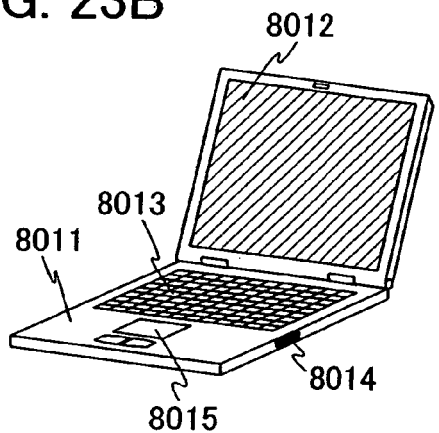

FIG. 23B shows a computer which includes a chassis 8011, a display portion 8012, a keyboard 8013, an external connection port 8014, a pointing mouse 8015, and the like. A TFT formed by using the present invention can be applied to not only a pixel portion of the display portion 8012 but also a semiconductor device such as a driving IC for display, a CPU inside a main body, a memory, or the like.

Figure 23C:
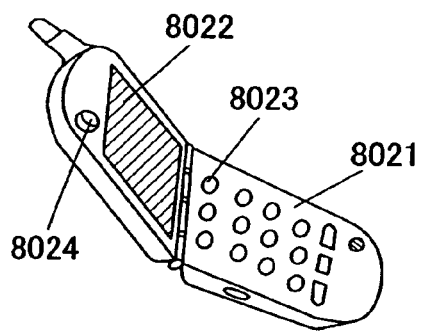

FIG. 23C shows a mobile phone which is one of the representative examples of a mobile terminal. The mobile phone includes a chassis 8021, a display portion 8022, an operation key 8023, and the like. A TFT formed by using the present invention can be applied to not only a pixel portion of the display portion 8012 or a sensor portion 8024 but also a driving IC for display, a memory, a speech processing circuit, and the like. The sensor portion 8024 has an optical sensor element, and power consumption of the mobile phone can be lowered by controlling the brightness of the display portion 8022 corresponding to the illumination intensity obtained by the sensor portion 8024 and suppressing the lighting control of the operation keys 8023 corresponding to the illumination intensity obtained by the sensor portion 8024.

Semiconductor materials formed by using the present invention can be used for electronic devices such as PDA (Personal Digital Assistants), digital cameras, small gaming machines, and the like as well as the mobile phone. For example, the semiconductor materials can be used for forming functional circuits such as CPUs, memories, and sensors. Further, the semiconductor materials can be applied to pixel portions of these electronic devices or driving ICs for display.

Figure 23D:
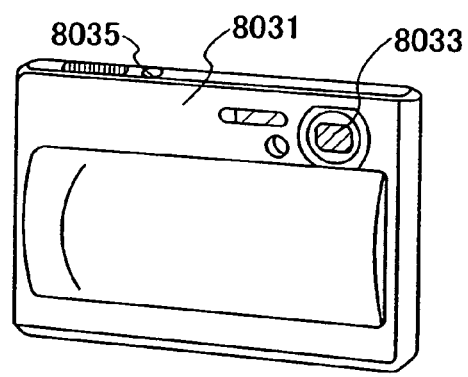
Figure 23E:
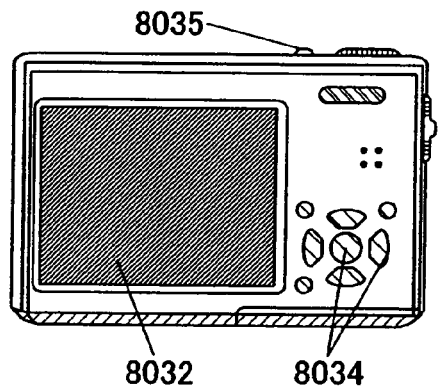

FIGS. 23D and 23E show a digital camera and FIG. 23E shows a view of a reverse side of FIG. 23D. The digital camera includes a chassis 8031, a display portion 8032, a lens 8033, an operation key 8034, a shutter 8035, and the like. A TFT formed by using the present invention can be used for a pixel portion of the display portion 8032, a driving IC for driving the display portion 8032, a memory, or the like.

Figure 23F:
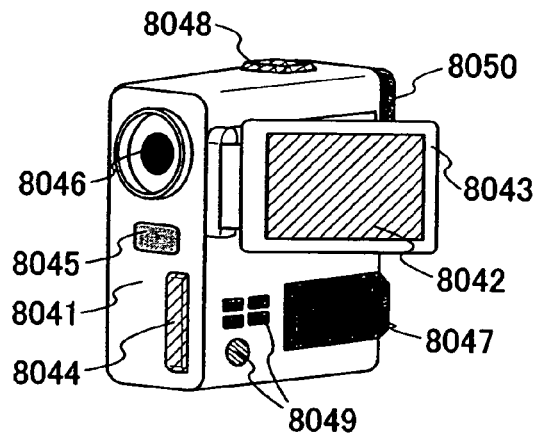

FIG. 23F shows a digital video camera. The digital video camera includes a main body 8041, a display portion 8042, a chassis 8043, an external connection port 8044, a remote control receive section 8045, an image receiving portion 8046, a battery 8047, an audio input portion 8048, an operation key 8049, an eye piece portion 8050, and the like. A TFT formed by using the present invention can be used for a digital input process device, a memory, a pixel portion of the display portion 8042, a driving IC for controlling the display portion 8042, or the like.

A TFT manufactured by the present invention can be used for a thin film integrated circuit or a non-contact thin film integrated circuit device (also referred to as a wireless IC tag or an RFID (Radio Frequency Identification)). By employing the manufacturing method shown in another Embodiment, the thin film integrated circuit and the non-contact thin film integrated circuit can be used as a tag or a memory.

For example, there are many patients in hospital, including patients with the same name and a patient who cannot communicate due to the condition of diseases. Further, medical treatment, medication, inspection, meal, and the like are necessary to be given in accordance with each patient. Since misidentification of patients threats the life of patients, it is critically important to distinguish patients from each other accurately. However, it is difficult to tremendously invest in accurate management of patients. Accordingly, a wireless IC tag can be used for easier management of patients at lower cost.

Figure 24A:
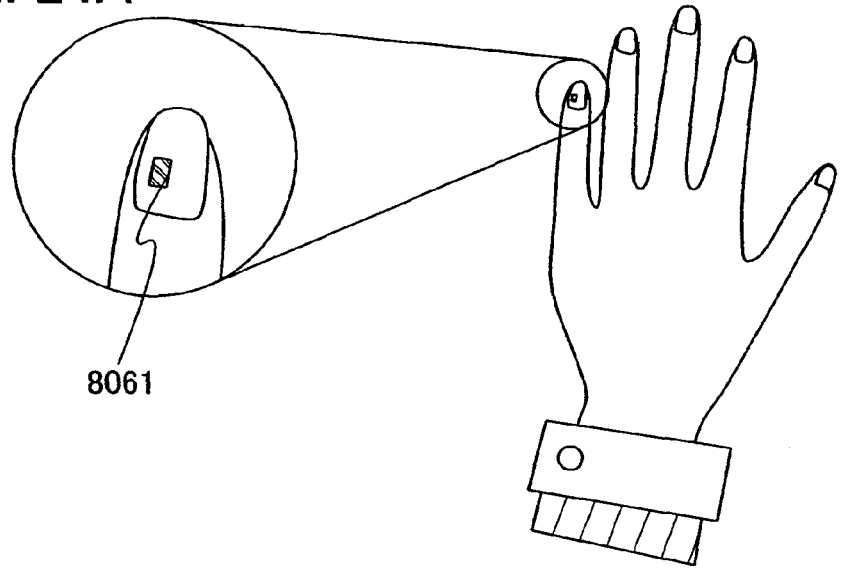
FIGS. 24A to 24D are explanatory views of a method for using a wireless IC chip manufactured using a laser irradiation apparatus of the present invention.

FIG. 24A shows a state where a wireless IC tag 8061 is attached to a human nail. Information is read and kept by a method to be described hereinafter A method to be employed is different depending on whether or not a memory capable of writing and reading at any time (RAM: Random Access Memory) is mounted on a wireless IC tag body.

Figure 24B:
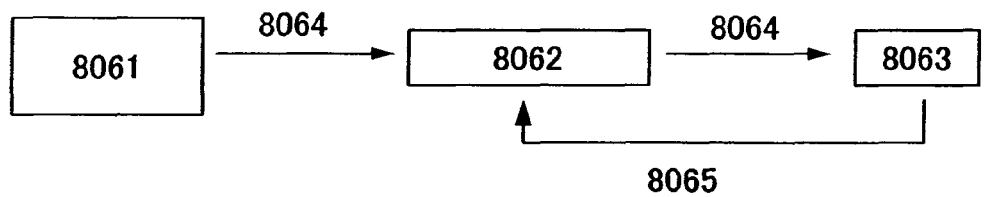
Figure 24C:
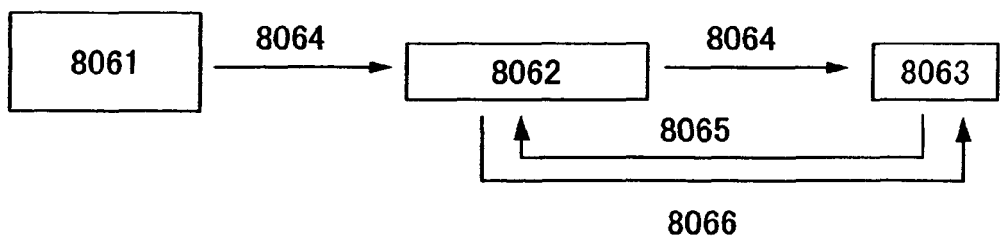
Figure 24D:
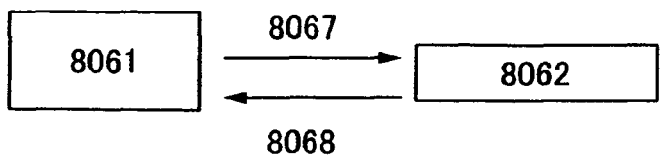

In a case where only a memory for reading only (ROM: Read Only Memory) is mounted on a wireless IC tag, and a RAM is not mounted, only a management number 8064 is inputted to the ROM of a wireless IC tag 8061. Individual information 8065 is kept, such as name, age, sex, insurance card number, the content of medical treatment, the content of medication, the content of a meal, and the content of inspection, with a calculator 8063 such as a computer. As shown in FIG. 24B, a management number 8064 of a wireless IC tag 8061 is read using a reading device 8062, and sent to a calculator 8063. Individual information 8065 kept in the calculator 8063 is taken in the reading device 8062. When information is added, as shown in FIG. 24C, a management number of a wireless IC tag 8061 is read using a reading device 8062, and a management number 8064 is sent to a calculator 8063. Individual information 8065 kept in the calculator 8063 is once sent to the reading device 8062, and information to be added 8066 is sent to the calculator 8063 while the information is checked.

In a case where a RAM is mounted on a wireless IC tag, the method described above can be employed, and further, another method can be employed. For example, individual information such as name, age, sex, insurance card number, the content of medical treatment, the content of medication, the content of a meal, and the content of inspection is put into a RAM of a wireless IC tag 8061. Information 8067 inputted to the RAM of the wireless IC tag 8061 owned by a patient is outputted and new information 8068 is written in the RAM, using a reading device 8062.

There are some advantages in attaching a wireless IC tag to a nail in order to manage patients. First, there is no need for expense of preparing a wristband provided with a name tag, or the like. Moreover, in a case of using a wristband, there are possibilities such that the wristband is removed and left off, missed, or broken after the wristband is removed from a wrist in taking a bath or the like; an unexpected situation occurs when the wristband is removed from a wrist; and so on. However, in a case of attaching a wireless IC tag to a nail, there is little possibility of occurrence of the above-described accidents.

Further, in a case of using a name tag, information such as name may be known to a person other than medical personnel. However, in a case of attaching a wireless IC tag, information can be read only in a case of using a reading device. Therefore, privacy of patients can also be easily managed. Further, it is not necessary to perform an operation for embedding a wireless IC tag into skin. Hence, a wireless IC tag can be easily provided without pain.

Other advantages will be given as follows. Even when a wireless IC tag is attached to a nail of a patient, the patient feels little unpleasant sensation because the wireless IC tag is thin and small, and behavior of patients is not restricted. For example, a nail can be painted over a wireless IC tag as long as information of a wireless IC tag attached to the nail can be read. Therefore, quality of life of patients can be improved.

Since a nail grows with time, in a case where a wireless IC tag is not necessary because of leaving hospital or the like, the wireless IC tag can be detached by cutting the nail. Therefore, the wireless IC tag can be easily detached as compared with a case where a wireless IC tag is embedded in skin.

Figure 25A:
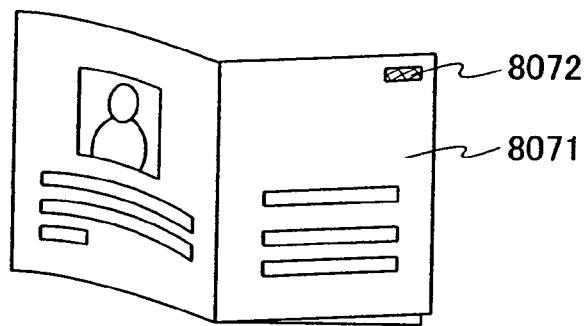
FIGS. 25A and 25B are explanatory views of a method for using a wireless IC chip manufactured using a laser irradiation apparatus of the present invention.

FIG. 25A shows a passport 8071 with a wireless IC tag 8072 attached thereto. Alternatively, the wireless IC tag 8072 may be embedded in the passport 8071. Similarly, the wireless IC tag can be attached or embedded in a driver's license, a credit card, a banknote, a coin, a certificate, a merchandise coupon, a ticket, a traveler's check (T/C), a health insurance card, a resident card, a family register, and the like. In this case, only the information saying this is the real one is inputted in the wireless IC tag and an access authority is set so that the information cannot be read and written illegally. This can be achieved by using the TFT formed by using the present invention. By using the tag in this way, it is possible to distinguish the forged one and the real one.

Figure 25B:
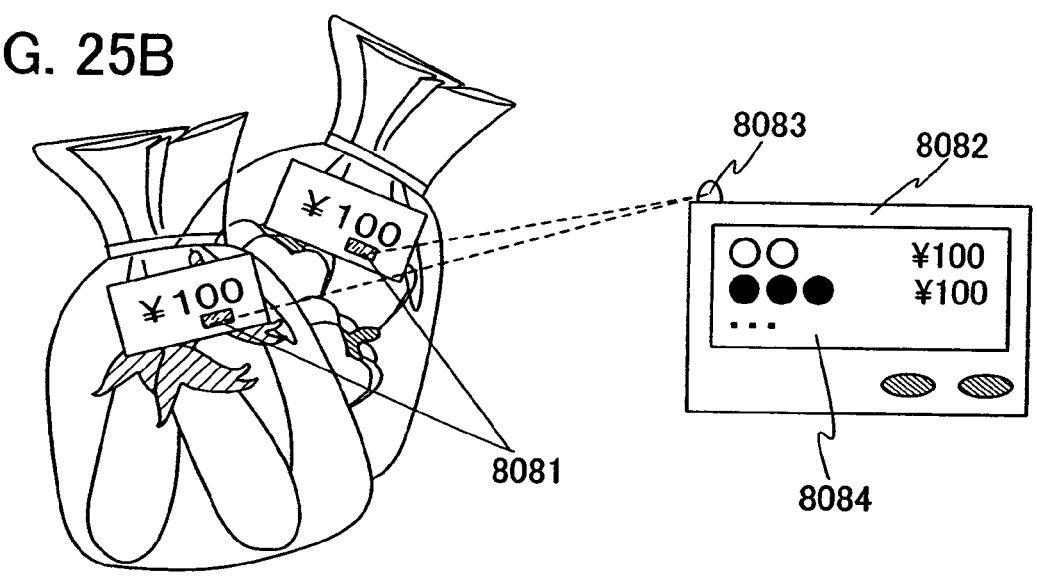

Besides, the wireless IC tag can be used as a memory. FIG. 25B shows an example of using a wireless IC tag 8081 for a label to be attached to a package of vegetables. Alternatively, the wireless IC tag may be attached directly to the package or embedded in the package. In the wireless IC tag 8081, a production area, a producer, a manufacturing date, and a process at a production stage such as a process method, a distribution process of the product, a price, quantity, an intended purpose, a shape, weight, an expiration date, each type of authentication information, and the like can be recorded. Information from the wireless IC tag 8081 is received by an antenna portion 8083 of a wireless reader 8082 and read out, and displayed in a display portion 8084 of the reader 8082. Thus, wholesalers, retailers, and consumers can know the information easily. Moreover, access authority can be set for each of producers, traders, and consumers. Those who do not have the access authority cannot read, write, rewrite, and erase the data in the wireless IC tag.

The wireless IC tag can be used in the following way. At the settlement, the information that the settlement has been made is written in the wireless IC tag, and the wireless IC tag is checked by a checking means provided at an exit whether or not the information that the settlement has been made is written in the wireless IC tag. If the wireless IC tag is brought out from the store without making the settlement, the alarm rings. With this method, forgetting of the settlement and shoplifting can be prevented.

In consideration of protecting customer's privacy, the following method is also possible. At the settlement at a cash register, any of the followings is performed; (1) data inputted in the wireless IC tag is locked by pin numbers or the like, (2) data itself inputted in the wireless IC tag are encrypted, (3) data inputted in the wireless IC tag is erased, and (4) data inputted in the wireless IC tag are destroyed. This can be achieved by using the memory shown in another Embodiment. Then, a checking means is provided at an exit, and whether any one of (1) to (4) has been performed or whether the data in the wireless IC tag are not processed is checked so that whether the settlement has been made or not is checked. In this way, whether the settlement has been made or not can be checked in the store, and reading out the information in the wireless IC tag against the owner's will outside the store can be prevented.

Several methods are given to destroy data inputted in the wireless IC tag in (4). For example, (a) only data are destroyed by writing one or both of "0 (off)" and "1 (on)" at least in a part of electronic data in the wireless IC tag, and (b) current is flowed excessively in the wireless IC tag to physically destroy a part of a wiring in a semiconductor element in the wireless IC tag.

By using the laser irradiation apparatus of the present invention, various effects can be obtained in crystallizing a semiconductor film. For example, divergence of a beam diameter of the laser beam and short-term fluctuation of an optical axis can be corrected by a transfer lens. Therefore, a laser beam can be propagated without being hit on an inner wall of a pipe, and accordingly, a semiconductor film can be irradiated with the energy of the laser beam kept, which is emitted from the laser irradiation apparatus. Further, even if a space is small, irradiation with a laser beam is possible as long as a place to dispose a beam propagator is secured. Therefore, irradiation with a laser beam, which is greater in quantity than a conventional one, can be performed at one time, whereby efficiency in laser irradiation treatment is significantly improved. In a case of using a large-sized substrate having a side more than one meter, there is a great effect in that a semiconductor film can be irradiated with several to several tens of laser beams at one time at the same time.

Since setting such as light path alignment becomes the minimum necessary, time for setting is drastically reduced. Setting is performed only by rotating a joint of a pipe, whereby setting can be performed safely and easily without contact with a laser beam or without deviation of an optical axis on contact with another optical system. Further, a propagating distance of a laser beam is not changed even when a position of a pipe is changed; therefore, setting of an optical system such as a condensing lens is not necessary to be changed. Accordingly, uniform laser irradiation treatment is possible, thereby generating no variation in processing state of an object to be irradiated.

Since the laser irradiation apparatus of the present invention has the effects described above, a semiconductor film can be favorably crystallized with favorable throughput. Therefore, a wireless IC tag with high quality and without variation in performance can be manufactured with favorable throughput. Accordingly, cost due to mass production can be lowered.

As thus described, the semiconductor device manufactured by the present invention can be applied to a wide range, and the semiconductor device manufactured by the present invention can be applied to electronic appliances of every field.

This embodiment can be appropriately combined with the embodiment mode and other embodiments.

This application is based on Japanese Patent Application serial No. 2005-366169 filed in Japan Patent Office on Dec. 20, 2005, the contents of which are hereby incorporated by reference.

The invention claimed is:

1. A laser irradiation apparatus comprising:
   a laser oscillator; and
   an articulated beam propagator configured to propagate a laser beam produced by the laser oscillator,
   an optical system configured to shape a beam shape of the laser beam emitted from an end of the articulated beam propagator into a linear shape on an irradiation surface;
   wherein the articulated beam propagator comprises:
      at least first and second articulated portions;
      a plurality of pipes, wherein one end of a first one of the plurality of pipes is connected to one end of a second one of the plurality of pipes through the first articulated portion, and wherein the other end of the first one of the plurality of pipes is connected to one end of a third one of the plurality of pipes through the second articulated portion;
      at least first and second course changers of the laser beam, the first and second course changers located in the first and second articulated portions respectively; and
      a lens included inside the first one of the plurality of pipes, wherein the lens is disposed so that the first and second course changers are conjugated to each other.

2. The laser irradiation apparatus according to claim 1 further comprising:
a means for moving a position of the optical system; and
a means for relatively scanning the laser beam which passed through the optical system, with respect to an object to be irradiated with the laser beam.

3. The laser irradiation apparatus according to claim 1 further comprising:
a means for moving a position of the optical system;
a means for relatively scanning the laser beam which passed through the optical system, with respect to an object to be irradiated which is irradiated with the laser beam;
a camera for obtaining positional information of a marker formed over the object to be irradiated; and
a means for determining an irradiation position of the laser beam based on the marker.

4. The laser irradiation apparatus according to claim 1,
wherein a joint is located in each of the first and second articulated portions,
wherein the joint is rotatable with respect to a plane by which each of the first and second articulated portions and each of the plurality of pipes are connected to each other.

5. The laser irradiation apparatus according to claim 1,
wherein each of the first and second course changers is a mirror or a prism.

6. The laser irradiation apparatus according to claim 1,
wherein the optical system include an imaging lens, and
wherein the imaging lens is disposed so that one of the first and second course changers by which the laser beam is finally reflected, and the irradiation surface which is irradiated with the laser beam, are conjugated to each other.

7. A laser irradiation apparatus comprising:
a laser oscillator;
an articulated beam propagator configured to propagate a laser beam produced by the laser oscillator; and
an optical system configured to shape a beam shape of the laser beam emitted from an end of the articulated beam propagator into a linear shape on an irradiation surface;
wherein the articulated beam propagator comprises:
first, second, and third pipes;
a first articulated portion connected to one end of the first pipe and one end of the second pipe;
a second articulated portion connected to the other end of the first pipe and one end of the third pipe;
a slit provided in the other end of the third pipe from which the laser beam is emitted;
a first course changer of the laser beam, the first course changer located in the first articulated portion;
a second course changer of the laser beam, the second course changer located in the second articulated portion; and
first and second lenses included inside the first and second pipes respectively,
wherein the optical system is provided between the slit and the irradiation surface,
wherein the second lens is disposed so that an emission opening of the laser oscillator and the first course changer are conjugated to each other, and
wherein the first lens is disposed so that the first course changer and the second course changer are conjugated to each other.

8. The laser irradiation apparatus according to claim 7 further comprising:
a means for moving a position of the optical system; and
a means for relatively scanning the laser beam which passed through the optical system, with respect to an object to be irradiated with the laser beam.

9. The laser irradiation apparatus according to claim 7 further comprising:
a means for moving a position of the optical system;
a means for relatively scanning the laser beam which passed through the optical system, with respect to an object to be irradiated which is irradiated with the laser beam;
a camera for obtaining positional information of a marker formed over the object to be irradiated; and
a means for determining an irradiation position of the laser beam based on the marker.

10. The laser irradiation apparatus according to claim 7,
wherein the articulated beam propagator further comprises a third lens disposed so that the slit and an irradiated surface with the laser beam are conjugated to each other.

11. The laser irradiation apparatus according to claim 7,
wherein a joint is located in each of the first and second articulated portions,
wherein the joint is rotatable with respect to a plane by which each of the first and second articulated portions and each of the first, second, and third pipes are connected to each other.

12. The laser irradiation apparatus according to claim 7,
wherein each of the first course changer and the second course changer is a mirror or a prism.

13. The laser irradiation apparatus according to claim 7,
wherein the optical system include an imaging lens, and
wherein the imaging lens is disposed so that one of the first course changer and the second course changer by which the laser beam is finally reflected, and the irradiation surface which is irradiated with the laser beam, are conjugated to each other.

14. The laser irradiation apparatus according to claim 7, further comprising a third lens adjacent to the laser oscillator,
wherein the third lens is configured to change a diameter of the laser beam produced by the laser oscillator.

15. A laser irradiation apparatus comprising:
a plurality of laser oscillators; and
a plurality of articulated beam propagators, each of the plurality of articulated beam propagators configured to propagate a laser beam produced by each of the plurality of laser oscillators respectively; and
a plurality of optical systems, each of the plurality of optical systems configured to shape a beam shape of the laser beam emitted from an end of each of the plurality of articulated beam propagator into a linear shape on an irradiation surface;
wherein each of the plurality of articulated beam propagators comprises:
at least first and second articulated portions;
a plurality of pipes, wherein one end of a first one of the plurality of pipes is connected to one end of a second one of the plurality of pipes through the first articulated portion, and wherein the other end of the first one of the plurality of pipes is connected to one end of a third one of the plurality of pipes through the second articulated portion;
first and second course changers of the laser beam, the first and second course changers located in the first and second articulated portions respectively; and a lens included inside the first one of the plurality of pipes, wherein the lens is disposed so that the first and second course changers are conjugated to each other.

16. The laser irradiation apparatus according to claim 15 further comprising:
a means for moving a position of each of the plurality of optical systems; and
a means for relatively scanning the laser beam which passed through each of the plurality of optical systems, with respect to an object to be irradiated with the laser beam.

17. The laser irradiation apparatus according to claim 15 further comprising:
a means for moving a position of each of the plurality of optical systems;
a means for relatively scanning the laser beam which passed through each of the plurality of optical systems, with respect to an object to be irradiated which is irradiated with the laser beam;
a camera for obtaining positional information of a marker formed over the object to be irradiated; and
a means for determining an irradiation position of the laser beam based on the marker.

18. The laser irradiation apparatus according to claim 15, wherein a joint is located in each of the first and second articulated portions,
wherein the joint is rotatable with respect to a plane by which each of the first and second articulated portions and each of the plurality of pipes are connected to each other.

19. The laser irradiation apparatus according to claim 15, wherein each of the first and second course changers is a mirror or a prism.

20. The laser irradiation apparatus according to claim 15, wherein the optical system include an imaging lens, and
wherein the imaging lens is disposed so that one of the first and second course changers by which the laser beam is finally reflected, and the irradiation surface which is irradiated with the laser beam, are conjugated to each other.

* * * * *

UNITED STATES PATENT AND TRADEMARK OFFICE
CERTIFICATE OF CORRECTION

| | | |
|---|---|---|
| PATENT NO. | : 8,525,070 B2 | Page 1 of 1 |
| APPLICATION NO. | : 11/639416 | |
| DATED | : September 3, 2013 | |
| INVENTOR(S) | : Koichiro Tanaka et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1486 days.

Signed and Sealed this
Twenty-seventh Day of January, 2015

Michelle K. Lee
*Deputy Director of the United States Patent and Trademark Office*